(12) United States Patent
Brunner et al.

(10) Patent No.: US 10,303,417 B2
(45) Date of Patent: May 28, 2019

(54) INTERACTIVE SYSTEMS FOR DEPTH-BASED INPUT

(71) Applicant: YouSpace, Inc., Mountain View, CA (US)

(72) Inventors: Ralph Brunner, Los Gatos, CA (US); Hsin-Yi Chien, Cupertino, CA (US); John Philip Stoddard, Boulder Creek, CA (US); Po-Jui Chen, San Jose, CA (US); Vivi Brunner, Los Gatos, CA (US)

(73) Assignee: YouSpace, Inc., Santa Clara, CA (US)

( * ) Notice: Subject to any disclaimer, the term of this patent is extended or adjusted under 35 U.S.C. 154(b) by 95 days.

(21) Appl. No.: 15/478,209

(22) Filed: Apr. 3, 2017

(65) Prior Publication Data

US 2018/0288894 A1 Oct. 4, 2018

(51) Int. Cl.
| | | |
|---|---|---|
| *H05K 7/18* | (2006.01) | |
| *G06F 3/14* | (2006.01) | |
| *G06F 3/01* | (2006.01) | |
| *G06F 3/03* | (2006.01) | |

(52) U.S. Cl.
CPC ............ *G06F 3/1446* (2013.01); *G06F 3/017* (2013.01); *G06F 3/0304* (2013.01); *H05K 7/18* (2013.01)

(58) Field of Classification Search
CPC .......... H05K 7/14; H05K 5/03; H05K 5/0017; H05K 5/0247; G06F 3/0325; G06F 3/017; G06F 3/1446
See application file for complete search history.

(56) References Cited

U.S. PATENT DOCUMENTS

| | | |
|---|---|---|
| 3,992,629 A | 11/1976 | Chapman |
| 4,408,678 A | 10/1983 | White, Jr. |
| 5,124,693 A | 6/1992 | Himelstein et al. |
| 5,534,917 A | 7/1996 | MacDougall |

(Continued)

FOREIGN PATENT DOCUMENTS

| | | | | |
|---|---|---|---|---|
| DE | 102013211335 | * | 12/2014 | ............ G06F 3/046 |
| KR | 20160116903 A | * | 10/2016 | ............... G01B 7/26 |

(Continued)

OTHER PUBLICATIONS

Youspace, Inc., Tech Field Trip Presentation. Jun. 13, 2017; 18 Pages.

(Continued)

*Primary Examiner* — Nicholas J Lee
*Assistant Examiner* — Gerald L Oliver

(57) ABSTRACT

Various of the disclosed embodiments present depth-based user interaction systems. By anticipating various installation constraints and factors into the interface's design, various of the disclosed embodiments facilitate benefits such as complementary depth fields of view and display orientation flexibility. Some embodiments include a frame housing for the depth sensors. Within the housing, depth sensors may be affixed to a mount, such that each sensor's field of view is at a disparate angle. These disparate angles may facilitate gesture recognitions that might otherwise be difficult or impossible to achieve. When mounted in connection with a modular unit, the housing may provide a versatile means for integrating multiple module units into a composite interface.

20 Claims, 34 Drawing Sheets

(56) References Cited

U.S. PATENT DOCUMENTS

| | | | |
|---|---|---|---|
| 5,926,230 | A | 7/1999 | Niijima et al. |
| 6,109,460 | A * | 8/2000 | Herlevi ............... A61B 50/20 |
| | | | 211/106 |
| 6,130,663 | A | 10/2000 | Null |
| 6,353,428 | B1 | 3/2002 | Maggioni et al. |
| 6,359,190 | B1 * | 3/2002 | Ter-Ovanesyan ........................ |
| | | | A61B 5/04884 |
| | | | 128/886 |
| 6,518,565 | B1 * | 2/2003 | Wu ............... G01D 11/245 |
| | | | 250/239 |
| 7,058,204 | B2 | 6/2006 | Hildreth et al. |
| 7,227,526 | B2 | 6/2007 | Hildreth et al. |
| 7,340,077 | B2 | 3/2008 | Gokturk et al. |
| 7,379,563 | B2 | 5/2008 | Shamaie |
| 7,379,566 | B2 | 5/2008 | Hildreth |
| 7,948,481 | B2 | 5/2011 | Vilcovsky |
| 8,788,973 | B2 | 7/2014 | Lavigne et al. |
| 8,830,302 | B2 | 9/2014 | Im et al. |
| 8,842,906 | B2 | 11/2014 | Watson et al. |
| D727,995 | S | 4/2015 | Vilcovsky |
| 9,075,441 | B2 | 7/2015 | St. Hilaire et al. |
| 9,081,419 | B2 | 7/2015 | Tocino Diaz et al. |
| 9,164,589 | B2 | 10/2015 | Tong et al. |
| 9,298,346 | B2 | 3/2016 | Le Clerc et al. |
| D753,754 | S | 4/2016 | Vilcovsky |
| 9,317,112 | B2 | 4/2016 | Cao et al. |
| 9,323,338 | B2 | 4/2016 | He et al. |
| 9,389,779 | B2 | 7/2016 | Anderson et al. |
| 9,429,833 | B1 | 8/2016 | Satoh et al. |
| 9,459,758 | B2 | 10/2016 | Berenson et al. |
| 2008/0151092 | A1 | 6/2008 | Vilcovsky |
| 2009/0059502 | A1 * | 3/2009 | Filson ............... G06F 1/1601 |
| | | | 361/679.27 |
| 2010/0146455 | A1 | 6/2010 | Wilson et al. |
| 2010/0199228 | A1 | 8/2010 | Latta et al. |
| 2011/0090147 | A1 | 4/2011 | Gervais et al. |
| 2011/0122048 | A1 | 5/2011 | Choi et al. |
| 2011/0199294 | A1 | 8/2011 | Vilcovsky |
| 2011/0288964 | A1 | 11/2011 | Linder et al. |
| 2013/0083252 | A1 | 4/2013 | Boyes et al. |
| 2013/0179162 | A1 | 7/2013 | Merschon et al. |
| 2013/0251192 | A1 | 9/2013 | Tu et al. |
| 2013/0278499 | A1 | 10/2013 | Anderson |
| 2014/0043232 | A1 | 3/2014 | Kurokawa et al. |
| 2014/0111620 | A1 * | 4/2014 | Park ............... G02B 27/1006 |
| | | | 348/46 |
| 2014/0210322 | A1 * | 7/2014 | Roberts ............... A47F 9/02 |
| | | | 312/10.1 |
| 2014/0225977 | A1 | 8/2014 | Vilcovsky et al. |
| 2014/0226000 | A1 | 8/2014 | Vilcovsky et al. |
| 2014/0226900 | A1 | 8/2014 | Saban et al. |
| 2014/0240359 | A1 * | 8/2014 | Elder ............... G01N 33/48785 |
| | | | 345/659 |
| 2014/0363073 | A1 | 12/2014 | Shirakyan et al. |
| 2015/0091790 | A1 | 4/2015 | Forutanpour et al. |
| 2015/0277700 | A1 | 10/2015 | He |
| 2016/0127710 | A1 | 5/2016 | Saban et al. |
| 2016/0209655 | A1 | 7/2016 | Riccomini et al. |
| 2016/0260260 | A1 | 9/2016 | Fei et al. |
| 2017/0160751 | A1 | 6/2017 | Pierce et al. |
| 2017/0161555 | A1 | 6/2017 | Kumar et al. |
| 2017/0161591 | A1 | 6/2017 | English et al. |
| 2017/0161592 | A1 | 6/2017 | Su et al. |
| 2017/0161607 | A1 | 6/2017 | English et al. |
| 2017/0161911 | A1 | 6/2017 | Kumar et al. |
| 2018/0139431 | A1 * | 5/2018 | Simek ............... H04N 5/2258 |
| 2018/0181362 | A1 * | 6/2018 | Kaneko ............... G09G 5/12 |

FOREIGN PATENT DOCUMENTS

| | | |
|---|---|---|
| WO | WO2017095948 | 6/2014 |
| WO | WO2015195652 | 12/2015 |
| WO | WO2014100250 | 6/2017 |

OTHER PUBLICATIONS

Oak Labs, Inc., The Oak Interactive Fitting Room—Vimeo, Published 2015. Available at https://vimeo.com/141758597. (Retrieved Sep. 4, 2017).

Memomi Labs Inc, Live with Channel 9 Australia—Vimeo, Published 2015. Available at https://vimeo.com/129075274. (Retrieved Sep. 4, 2017).

MemoMi Labs Inc, MemoMi @ CNBC Jun. 2015—Vimeo, Published 2015. Available at https://vimeo.com/130502071. (Retrieved Sep. 4, 2017).

MemoMi Labs Inc, MemoMi Eyewear on Channel 10 Australia—Vimeo, Published 2016. Available at https://vimeo.com/176075233. (Retrieved Sep. 4, 2017).

MemoMi Labs Inc, MemoMi @ Intel CEO Keynote—Vimeo, Published 2015. Available at https://vimeo.com/136731687. (Retrieved Sep. 4, 2017).

MemoMi Labs Inc, MemoMi NRF 2014 @ Intel Channel—Vimeo, Published 2014. Available at https://vimeo.com/85788520. (Retrieved Sep. 4, 2017).

David Rose, MemoMi—Vimeo, Published 2012. Available at https://vimeo.com/50027314. (Retrieved Sep. 4, 2017).

MemoMi Labs Inc, MemoMi @ WSJ—Vimeo, Published 2015. Available at https://vimeo.com/127500728. (Retrieved Sep. 4, 2017).

MemoMi Labs Inc, Memory Makeover™ Mirror—Vimeo, Published Dec. 2016. Available at https://vimeo.com/194615701. (Retrieved Sep. 4, 2017).

Memomi Labs Inc, Sunglass Memory Mirror®—Vimeo, Published 2016. Available at https://vimeo.com/176675288. (Retrieved Sep. 4, 2017).

MemoMi Labs Inc, Transparent Mirror—MemoMi x Corning—Vimeo, Published 2016. Available at https://vimeo.com/161959806. (Retrieved Sep. 4, 2017).

Memomi Labs Inc, Turning colors . . . —Vimeo, Published 2015. Available at https://vimeo.com/115948779. (Retrieved Sep. 4, 2017).

Memomi Labs Inc, Inventions—Vimeo, Published Nov. 2016. Available at https://vimeo.com/190673032. (Retrieved Sep. 4, 2017).

Elizabeth Segran, Fast Company—Clothes Shopping Sucks. Reformation's High-Tech Store Reimagines It From the Ground Up, Available at https://www.fastcompany.com/3067979/. Published Feb. 13, 2017. (Retrieved Sep. 4, 2017).

INFO, A Simple Game, Available at https://www.youtube.com/watch?v=C8-oqlEmMAU. Published Mar. 13, 2013. (Retrieved Sep. 8, 2017).

ADMO, Website, Available at: http://admoexperience.github.io/index.html?wvideo=3kzosozp1p; http://admoexperience.github.io/source.html; http://admoexperience.github.io/tech.html. Retrieved Sep. 8, 2017.

INFO, Apple App—Youtube, Published Feb. 3, 2014. Available at: https://www.youtube.com/watch?v=nL5GEhCpl24. (Retrieved Sep. 8, 2017).

INFO, Flight Centre App, Published Feb. 4, 2014. Available at https://www.youtube.com/watch?v=S63JblHbB0s. (Retrieved Sep. 8, 2017).

INFO, Flying around Google Earth with Admo, Published Sep. 17, 2013. Available at https://www.youtube.com/watch?v=MBZIsfZ4HU4. (Retrieved Sep. 8, 2017).

INFO, Friday Showcase—Build Your Own Deal, Published Sep. 30, 2013. Available at https://www.youtube.com/watch?v=z-tuDMKtuPg. (Retrieved Sep. 8, 2017).

INFO, HP Store—Case study, Published Sep. 20, 2013. Available at https://www.youtube.com/watch?v=r4jkc7KcyY8. (Retrieved Sep. 8, 2017).

INFO, HP Store Walkthrough, Published Sep. 13, 2013. Available at https://www.youtube.com/watch?v=h_ANfHpEXiw. (Retrieved Sep. 8, 2017).

INFO, Admo Info Youtube Channel, Published Feb. 21, 2013. Available at https://www.youtube.com/channel/UCMosVez9g2xMJP3ZB3mpErw. (Retrieved Sep. 8, 2017).

INFO, Admo in Action (Google, Flight Centre and HP Store), Published Sep. 19, 2013. Available at https://www.youtube.com/watch?v=4mTruwUjcK4&feature=youtu.be. (Retrieved Sep. 8, 2017).

(56) References Cited

OTHER PUBLICATIONS

INFO, Mobile App, Published Feb. 3, 2014. Available at https://www.youtube.com/watch?v=5juFiQTbU-A. (Retrieved Sep. 8, 2017).
INFO, Music Moods Experience (screencapture), Published May 6, 2013. Available at https://www.youtube.com/watch?v=r4AFLU_XVHo. (Retrieved Sep. 8, 2017).
INFO, Real Estate App, Published Feb. 3, 2014. Available at https://www.youtube.com/watch?v=8SvTIIWHCx0. (Retrieved Sep. 8, 2017).
INFO, Trace the shapes game, Published Sep. 17, 2013. Available at https://www.youtube.com/watch?v=aeaaCQIODYk. (Retrieved Sep. 8, 2017).
AIMIRRORBCN, aiMirror at Bloomberg, Published Jul. 26, 2012. Available at https://www.youtube.com/watch?v=VoPdNMJ3FLQ. (Retrieved Sep. 6, 2017).
AIMIRRORBCN, aiMirror: The Smart Shopping experience, Published Jul. 26, 2012. Available at https://www.youtube.com/watch?v=_pwFZEG2hj8. (Retrieved Sep. 6, 2017).
Ádám Horváth, Fitnect—Interactive Virtual Fitting . . . , Published Aug. 8, 2011. Available at https://www.youtube.com/watch?v=1jbvnk1T4vQ. (Retrieved Oct. 4, 2017).
Ádám Horváth, Fitnect—CIB, Published Nov. 25, 2015. Available at https://www.youtube.com/watch?v=k06gvSzrsdw. (Retrieved Sep. 10, 2017).
FXGear, FXMirror_3D Virtual Fitting Solution, Published Feb. 3, 2015. Available at https://www.youtube.com/watch?v=nWcGhuX6N7w. (Retrieved Sep. 10, 2017).
ARDOORMoscow, Kinect Fitting Room for Topshop, Published May 10, 2011. Available at https://www.youtube.com/watch?v=L_cYKFdP1_0. (Retrieved Sep. 10, 2017).
IMGSRCinc, Puma Store Harajuku Interactive Mirror®, Published Mar. 3, 2011. Available at https://www.youtube.com/watch?v=_X2-_t5f_IA. (Retrieved Sep. 10, 2017).
SenseMi—Sense Mirror, SenseMi Virtual Dressing Room, Published May 4, 2017. Available at https://www.youtube.com/watch?v=0Nh6eEJBal8. (Retrieved Sep. 10, 2017).
Unreal Engine 4—Augmented Reality Virtual Mirror Test, Published Mar. 17, 2016. Available https://www.youtube.com/watch?v=zT_emXRZ5iA&feature=youtu.be. Retrieved (Oct. 1, 2017).
UNREAL4MIRROR website, available at http://unreal4mirror.com/. Retrieved (Sep. 10, 2017).
End Point Liquid Galaxy, Youtube Video Webpage, Published Jul. 30, 2013. Available at https://www.youtube.com/channel/UCf6FHharf_oTy3jW8YmdbdA. (Retrieved Sep. 8, 2017).
Engadget, Skydiving across seven instances of Chrome | Google I/O 2013—YouTube, Published May 15, 2013. Available at https://www.youtube.com/watch?v=wL7JgwemvOQ. (Retrieved Sep. 8, 2017).
Talkandroid, Hands on with Map Diving at Google I/O—YouTube, Published May 15, 2013. Available at https://www.youtube.com/watch?v=uHGXP7-4wqU. (Retrieved Sep. 8, 2017).
End Point Liquid Galaxy, Leap Motion and Liquid Galaxy, Published Oct. 9, 2013. Available at https://www.youtube.com/watch?v=WAvfPkWtPV0. (Retrieved Sep. 8, 2017).
End Point Liquid Galaxy, Liquid Galaxy for Science Centers, Published Nov. 1, 2016. Available at https://www.youtube.com/watch?v=Lcgu1XIMj-8. (Retrieved Sep. 8, 2017).
End Point Liquid Galaxy, Liquid Galaxy on SciTech Now, Published Jun. 23, 2016. Available at https://www.youtube.com/watch?v=aZxWTgR8w3U. (Retrieved Sep. 8, 2017).
Eyesight, About—eye-sight—website, Available at http://www.eyesight-tech.com/about/. (Retrieved Sep. 6, 2017).
Eyesight, Automotive—eye-sight—website, Available at http://www.eyesight-tech.com/product/automotive/. (Retrieved Sep. 6, 2017).
Eyesight, eye-sight—website, Available at http://www.eyesight-tech.com/. (Retrieved Sep. 6, 2017).
Eyesight, IOT & Smart Home—eye-sight—website, Available at http://www.eyesight-tech.com/product/iot-smart-home/. (Retrieved Sep. 6, 2017).
Eyesight, VR & AR—eye-sight—website, Available at http://www.eyesight-tech.com/product/vr-ar/. (Retrieved Sep. 6, 2017).
Flutter, Taps, drags, and other gestures in Flutter—Flutter—website, Available at https://flutter.io/gestures/. (Retrieved Sep. 8, 2017).
Gestigon GMBH, Carnival SDK for Android—YouTube, Published Jul. 12, 2016. Available at https://www.youtube.com/watch?v=6McyTb8QQII. (Retrieved Sep. 7, 2017).
Gestigon GMBH, Carnival—YouTube, Published Nov. 18, 2015. Available at https://www.youtube.com/watch?v=BgjFYR4xl7g&feature=youtu.be. (Retrieved Sep. 6, 2017).
Gestigon GMBH, CES 2017 Driver Monitoring Demo—YouTube, Published Jan. 31, 2017. Available at https://www.youtube.com/watch?v=gx8y1LftdAU. (Retrieved Sep. 7, 2017).
Gestigon GMBH, Flamenco—gestigon's gesture control service for win7 and win8—YouTube, Published Jul. 21, 2014. Available at https://www.youtube.com/watch?v=stCWbKtT4Vo&feature=youtu.be. (Retrieved Sep. 6, 2017).
Gestigon GMBH, gestigonGoesCES2015—Invitation Video—YouTube, Published Dec. 8, 2014. Available at https://www.youtube.com/watch?v=VhHrWYyGzos. (Retrieved Sep. 7, 2017).
Gestigon GMBH, gestigon Carnival AR/VR Interaction Suite with Melexis 175°—YouTube, Published Oct. 13, 2015. Available at https://www.youtube.com/watch?v=vBSJfhZTFF0. (Retrieved Sep. 7, 2017).
Gestigon GMBH, Oyster Advanced Body Skeleton Tracking—YouTube, Published Jun. 6, 2016. Available at https://www.youtube.com/watch?v=UiEg64H07Gk&feature=youtu.be. (Retrieved Sep. 6, 2017).
GestureTek Health, Cancer Smash on Vimeo, Published Dec. 20, 2016. Available at https://vimeo.com/196479220. (Retrieved Sep. 8, 2017).
GestureTek Health, Cube at Shriners Children's Hospital on Vimeoo, Published Jun. 7, 2016. https://vimeo.com/169762973. (Retrieved Sep. 8, 2017).
GestureTek Health, GestureTek Health Creates Interactive Road Safety Learning Experience for VTS Medical on Vimeo, Published Jun. 3, 2016. https://vimeo.com/169300431. (Retrieved Sep. 8, 2017).
GestureTek Health, GestureTek Health Demo on Vimeo, Published Feb. 1, 2017. https://vimeo.com/202066360. (Retrieved Sep. 8, 2017).
GestureTek Health, GestureTek Health Sensory CUBE on Vimeo. Published Feb. 16, 2017. Available at https://vimeo.com/204390914. (Retrieved Sep. 8, 2017).
GestureTek Health, Immersive Therapy Suite—Demo on Vimeo. Published Jun. 7, 2016. Available at https://vimeo.com/169760032. (Acquired Sep. 8, 2017).
GestureTek Health, IREX—Clinician Edition on Vimeo. Published Jun. 7, 2016. Available at https://vimeo.com/169750941. (Acquired Sep. 8, 2017).
GestureTek Health, IREX—Soccer with Tracking Overlay on Vimeo. Published Jun. 8, 2016. Available at https://vimeo.com/169857821. (Acquired Sep. 8, 2017).
GestureTek Health, IREX Teaser on Vimeo. Published May 15, 2017. Available at https://vimeo.com/217517124. (Acquired Sep. 8, 2017).
GestureTek Health, Multitouch Wall—Kaiser Permanente on Vimeo. Published Jun. 7, 2016. Available at https://vimeo.com/169763297. (Acquired Sep. 8, 2017).
GestureTek Health, St. Joseph's Health Centre—Just for Kids Clinic on Vimeo. Published Jun. 10, 2016. Available at https://vimeo.com/170179285. (Acquired Sep. 8, 2017).
GestureTek Health, Virtual Healing on the Doctors on Vimeo. Published Jun. 7, 2016. Available at https://vimeo.com/169727480. (Acquired Sep. 8, 2017).
GestureTek Health, Virtual Therapy—CBC News on Vimeo. Published Jun. 9, 2016. Available at https://vimeo.com/170041354. (Acquired Sep. 8, 2017).
Heptasense, Hand tracking + gesture recognition using a webcam [old demo]—YouTube. Published Nov. 15, 2016. Available at https://www.youtube.com/watch?time_continue=26&v=fW-WTinfMVgw. (Acquired Sep. 8, 2017).

(56) References Cited

OTHER PUBLICATIONS

Heptasense, Universal motion and gesture controller for VR (smartphone)—YouTube. Published Nov. 12, 2016. Available at https://www.youtube.com/watch?time_continue=5&v=1C5OQV4G-us. (Acquired Sep. 8, 2017).
Liater, liateR at China Hi Tech Fair—YouTube. Published Dec. 20, 2016. Available at https://www.youtube.com/watch?v=et68tGIPj7k. (Acquired Sep. 6, 2017).
Liater, liateR | Interactive Retail shopping. Available at http://liater.co/. (Retrieved Sep. 6, 2017).
Liater, The future of shopping—liateR—YouTube. Published Nov. 7, 2014. Available at https://www.youtube.com/watch?v=6ZCdsTs0uNs. (Acquired Sep. 6, 2017).
LM3LABS, 3DFeel iPortrait on Vimeo. Published Jul. 22, 2014. Available at https://vimeo.com/101382464. (Acquired Sep. 6, 2017).
LM3LABS, AirStrike, the iron man experience on Vimeo. Published Oct. 18, 2010. Available at https://vimeo.com/15946888. (Acquired Sep. 6, 2017).
LM3LABS, Catchyoo Sunameri on Vimeo. Published Sep. 20, 2014. Available at https://vimeo.com/106663669. (Acquired Sep. 6, 2017).
LM3LABS, Interactive wood on Vimeo. Published Jan. 13, 2012. Available at https://vimeo.com/34996253. (Retrieved Sep. 6, 2017).
LM3LABS, iTable32 picture selection on Vimeo. Published Apr. 26, 2012. Available at https://vimeo.com/41122756. (Retrieved Sep. 6, 2017).
LM3LABS, Moovaction multitouch finger tracking software | LM3LABS—website. Available at https://www.lm3labs.com/technologies-2/moovaction/. (Retrieved Sep. 6, 2017).
LM3LABS, multitouch interactive table | LM3LABS—website. Available at https://www.lm3labs.com/technologies-2/itable-32/. (Retrieved Sep. 6, 2017).
LM3LABS, The Samurai Avatar on Vimeo. Published Jul. 22, 2011. Available at https://vimeo.com/26754982. (Acquired Sep. 6, 2017).
LM3LABS, touchless overlay for large surface display I | LM3LABS—website. Available at https://www.lm3labs.com/technologies-2/ubiqwindow/. (Retrieved Sep. 6, 2017).
Xloudia—website. Available at https://www.xloudia.com/. (Retrieved Sep. 6, 2017).
Macron, Gesture Call Tutorial—YouTube. Published Oct. 7, 2014. Available at https://www.youtube.com/watch?v=BN3HH9F-gs8&feature=youtu.be. (Acquired Sep. 8, 2017).
Macron, Macron's Gesture-Based Solution—Solutions Smart Display—website. Available at http://www.macrongesture.com/solution_02.html. (Retrieved Sep. 8, 2017).
Macron, Macron's Gesture-Based Solution—Solutions Digital Signage—website. Available at http://www.macrongesture.com/solution_03.html. (Retrieved Sep. 8, 2017).
Macron, Macron's Gesture-Based Solution—Macron's Gesture Recognition—website. Available at http://www.macrongesture.com/news.php?board_name=news. (Retrieved Sep. 8, 2017).
Macron, Virtual Mouse for PC—YouTube. Published Dec. 18, 2013. Available at https://www.youtube.com/watch?v=ep9ulrD8DYE&feature=youtu.be. (Acquired Sep. 8, 2017).
Macron, Virtual Mouse for Smart TV. Published Dec. 18, 2013. Available at https://www.youtube.com/watch?v=7J7u6l8JbK8&feature=youtu.be. (Acquired Sep. 8, 2017).
Geektime, Pebbles Interfaces—YouTube. Published May 11, 2015. Available at https://www.youtube.com/watch?v=96orf5sgBXc. (Acquired Sep. 7, 2017).
Poikos, Poikos Body Imaging and Measurement—YouTube. Published Jun. 22, 2012. Available at https://www.youtube.com/watch?v=AM8RYryOdTE. (Retrieved Sep. 8, 2017).
Swinguru, Chloé Leurquin—Swinguru Pro Presentation—YouTube. Published Nov. 25, 2014. Available at https://www.youtube.com/watch?v=M3tbobua-_E. (Retrieved Sep. 8, 2017).
Usens, Inc, Fingo demo: Grab and throw—YouTube. Published Aug. 1, 2016. Available at https://www.youtube.com/watch?v=ul97NtJYHRc. (Acquired Sep. 8, 2017).
Usens, Inc, Fingo Demo: Stick—YouTube. Published Aug. 1, 2016. Available at https://www.youtube.com/watch?v=vFZ_sm-lcno. (Acquired Sep. 8, 2017).
Stone, A et al, Teaching Compositionality to CNNs, (Submitted on Jun. 14, 2017), acquired Sep. 8, 2017 from https://arxiv.org/abs/1706.04313.
Kansky, K et al, Schema Networks: Zero-shot Transfer with a Generative Causal Model of Intuitive Physics, (Submitted on Jun. 14, 2017), acquired Sep. 8, 2017 from https://arxiv.org/abs/1706.04317.
Vicarious, Vicarious | Blog—website. Available at https://www.vicarious.com/general-game-playing-with-schema-networks.html. (Retrieved Sep. 6, 2017).
Vicarious, Vicarious | Home | AI for the robot age—website. Available at https://www.vicarious.com/. (Retrieved Sep. 6, 2017).
XYZ Interactive, Home—sensors by xyz interactive—website. Available at http://www.xyzinteractive.com/. (Retrieved Sep. 11, 2017).
U.S. Appl. No. 15/018,048, filed Feb. 8, 2016.
U.S. Appl. No. 15/018,303, filed Feb. 8, 2016.
U.S. Appl. No. 15/369,799, filed Dec. 5, 2016.
U.S. Appl. No. 15/486,218, filed Apr. 12, 2017.
U.S. Appl. No. 15/478,201, filed Apr. 3, 2017.
PCT/US17/27371, Apr. 13, 2017.
PCT/US17/27449, Apr. 13, 2017.
Jamie Shotton, et al., Real-Time Human Pose Recognition in Parts from Single Depth Images, Proceedings of CVPR, Jun. 2011, IEEE, United States.
Jamie Shotton, et al., Efficient Human Pose Estimation from Single Depth Images, Trans. PAMI, 2012, IEEE, United States.
LIBSVM Tools, Available at https://www.csie.ntu.edu.tw/~cjlin/libsvmtools/. (Retrieved Feb. 6, 2017).
LIBLINEAR—A Library for Large Linear Classification. Available at https://www.csie.ntu.edu.tw/~cjlin/liblinear/. (Retrieved Feb. 6, 2017).
Ren, Shaoqing, et al. "Global refinement of random forest." 2015. Available at http://www.cv-foundation.org/openaccess/content_cvpr_2015/papers/Ren_Global_Refinement_of_2015_CVPR_paper.pdf. (Retrieved on Feb. 8, 2017).
Leo Breiman, Random Forests. 2001. Available at https://www.stat.berkeley.edu/~breiman/randomforest2001.pdf. (Retrieved Feb. 8, 2017).
Chih-Chung Chang, et al., LIBSVM: A Library for Support Vector Machines. 2011. Available at http://www.csie.ntu.edu.tw/~cjlin/papers/libsvm.pdf. (Retrieved Feb. 8, 2017).
Dong Chen, et al., Blessing of Dimensionality: High-dimensional Feature and Its Efficient Compression for Face Verification. 2013. Available at http://jiansun.org/papers/CVPR13_HighDim.pdf. (Retrieved Feb. 8, 2017).
Simon Bernard, et al., Dynamic Random Forests. 2012. Available at https://hal.archives-ouvertes.fr/hal-00710083/document. (Retrieved Feb. 8, 2017).
Simon Bernard, et al., Forest-RK: A New Random Forest Induction Method. 2009. Available at https://hal.archives-ouvertes.fr/hal-00436367/document. (Retrieved Feb. 8, 2017).
Juergen Gall, et al., Class-Specific Hough Forests for Object Detection. 2009. Available at http://projectsweb.cs.washington.edu/research/insects/CVPR2009/objdetrec/hughforest_objdetect.pdf. (Retrieved Feb. 8, 2017).
Manish Mehta, et al., MDL-based Decision Tree Pruning. 1995. Available at https://www.aaai.org/Papers/KDD/1995/KDD95-025.pdf. (Retrieved Feb. 8, 2017).
Rong-En Fan, et al., LIBLINEAR: A Library for Large Linear Classification. 2008. Available at http://www.csie.ntu.edu.tw/~cjlin/papers/liblinear.pdf. (Retrieved Feb. 8, 2017).
Y. Amit and D. Geman, Shape quantization and recognition with randomized trees. 1996. Available at http://www.wisdom.weizmann.ac.il/~vision/courses/2003_2/shape.pdf. (Retrieved Feb. 23, 2017).
J. R. Quinlan, Induction of decision trees. 1986. Available at http://hunch.net/~coms-4771/quinlan.pdf. (Retrieved Feb. 23, 2017).
B. A. Shepherd, An appraisal of a decision tree approach to image classification. 1983. Available at https://pdfs.semanticscholar.org/98e4/5102842acb101d66dc53dc898877d34a54b8.pdf. (Retrieved Feb. 23, 2017).

(56) References Cited

OTHER PUBLICATIONS

K. K. Biswas et al., "Gesture Recognition Using Microsoft Kinect®". 2011. Available at http://ai2-s2-pdfs.s3.amazonaws.com/92b4/c8655484b603e33aea87e90ba598989ce069.pdf (Retrieved Jul. 5, 2017).

International Search Report & Written Opinion, PCT/US2017/027449; dated Jun. 27, 2017; 24 Pages.

International Search Report & Written Opinion, PCT/US2017/027371; dated Jul. 7, 2017; 24 Pages.

* cited by examiner

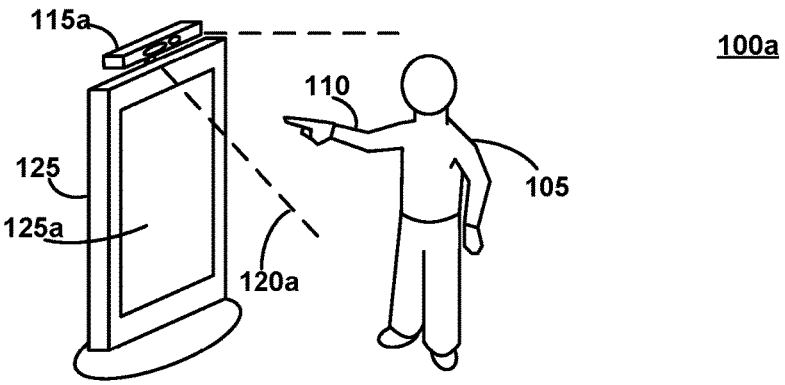
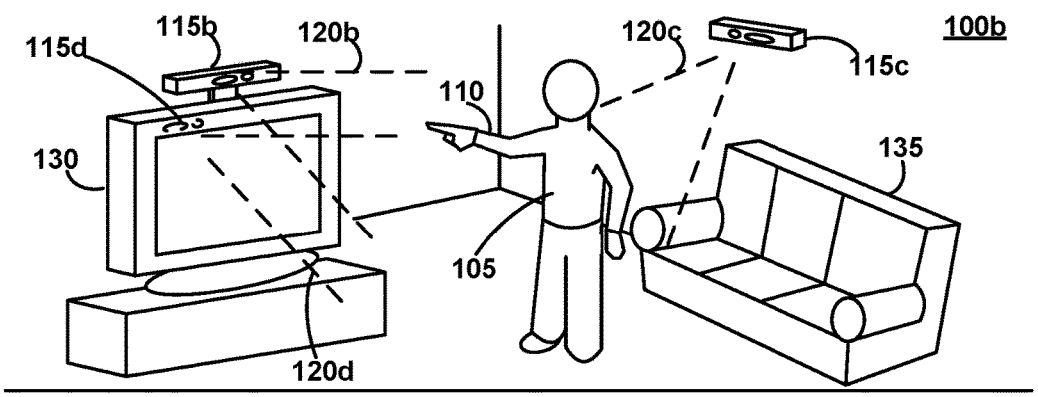
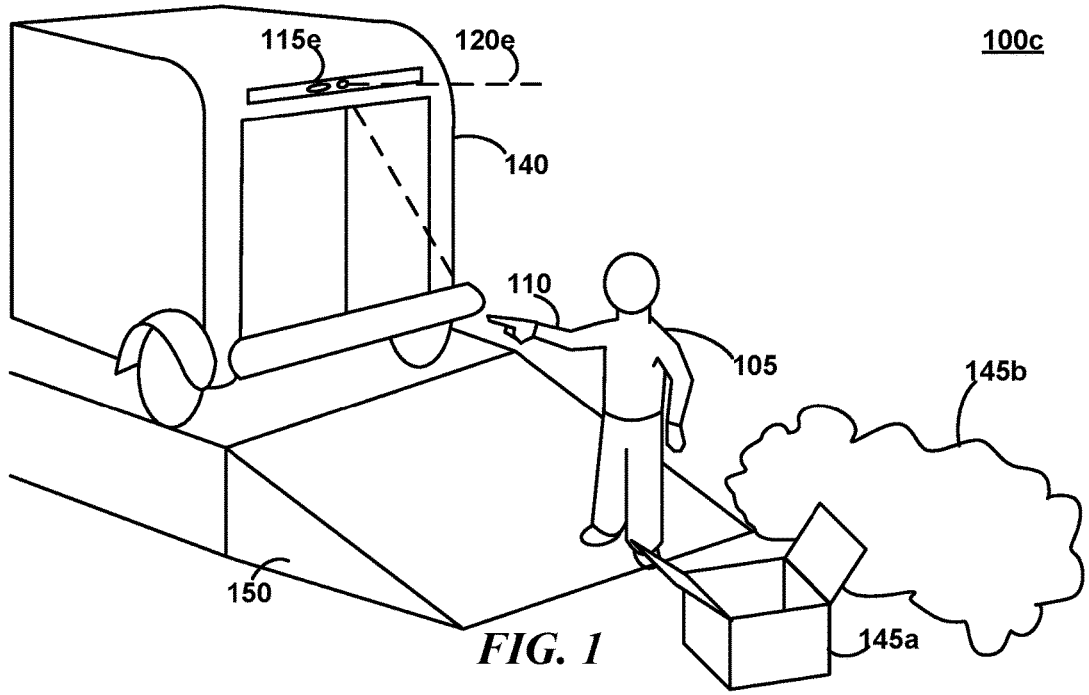
*FIG. 1*

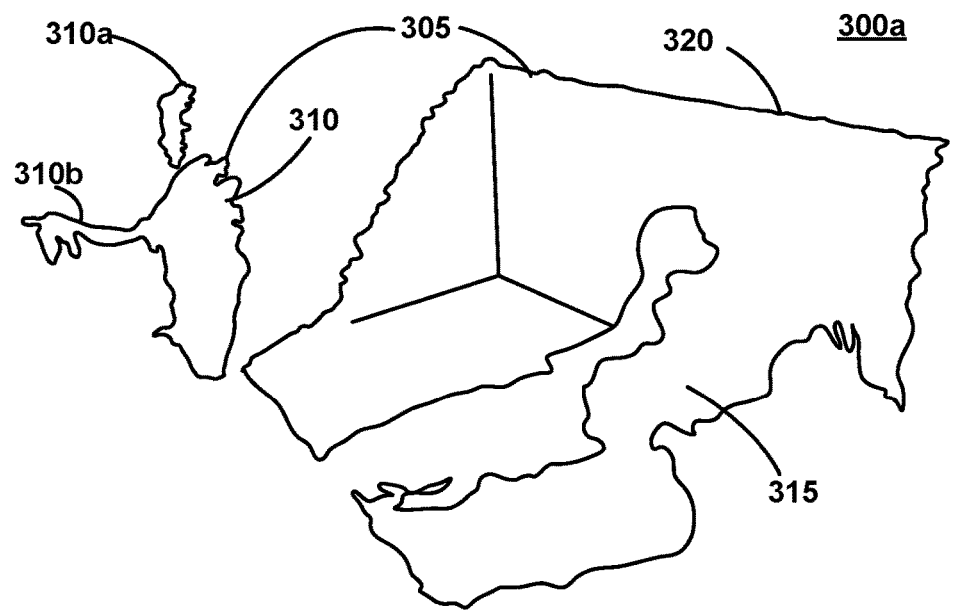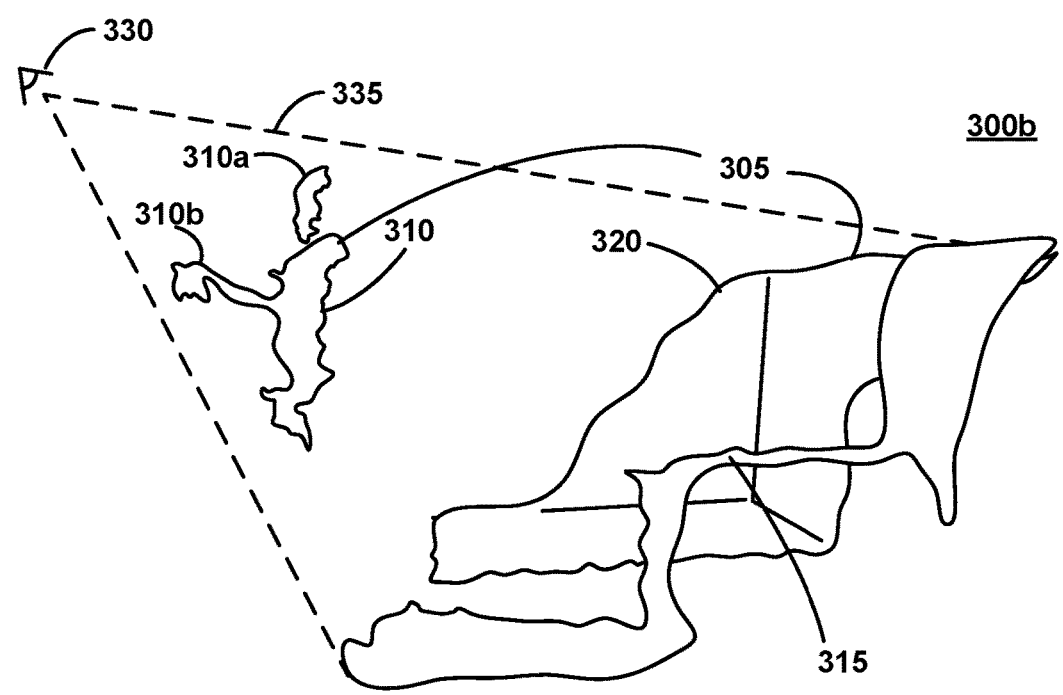
FIG. 3

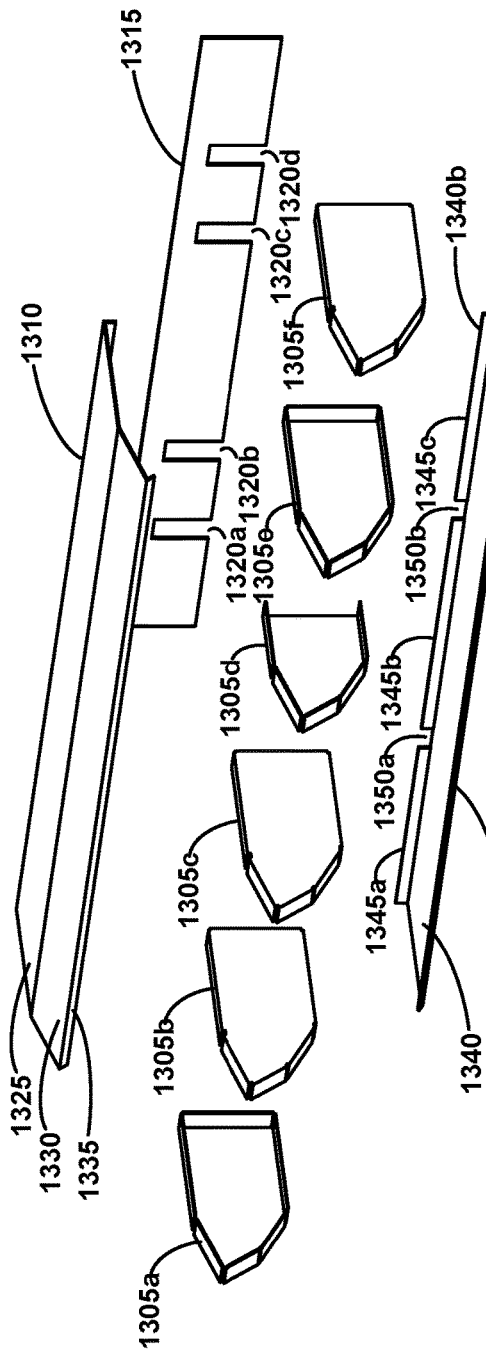
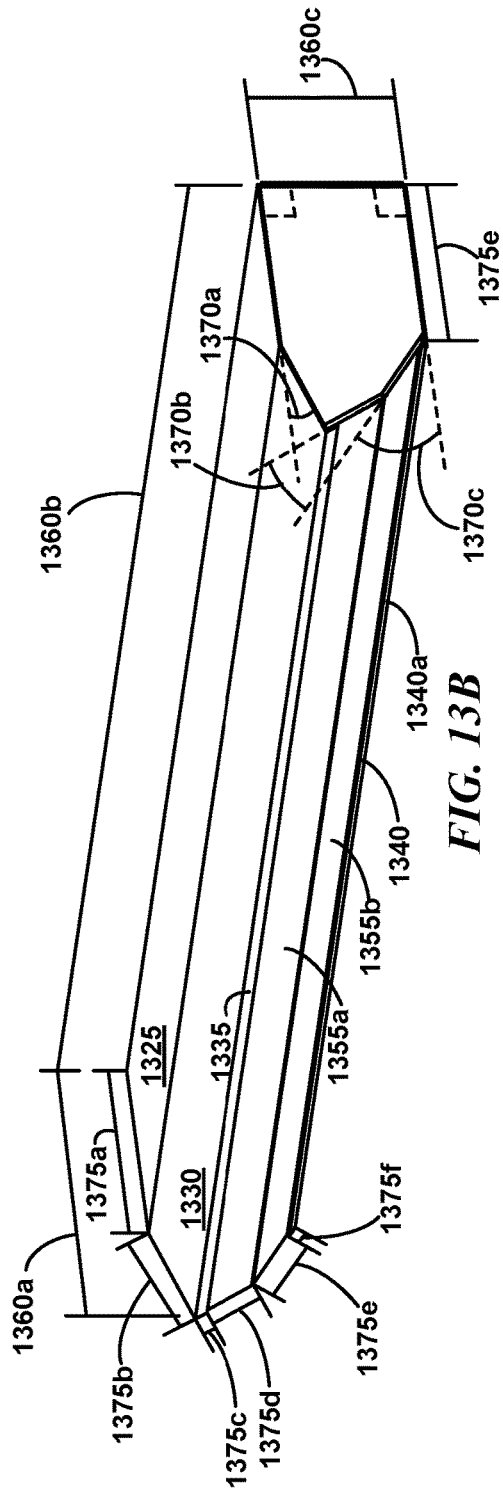

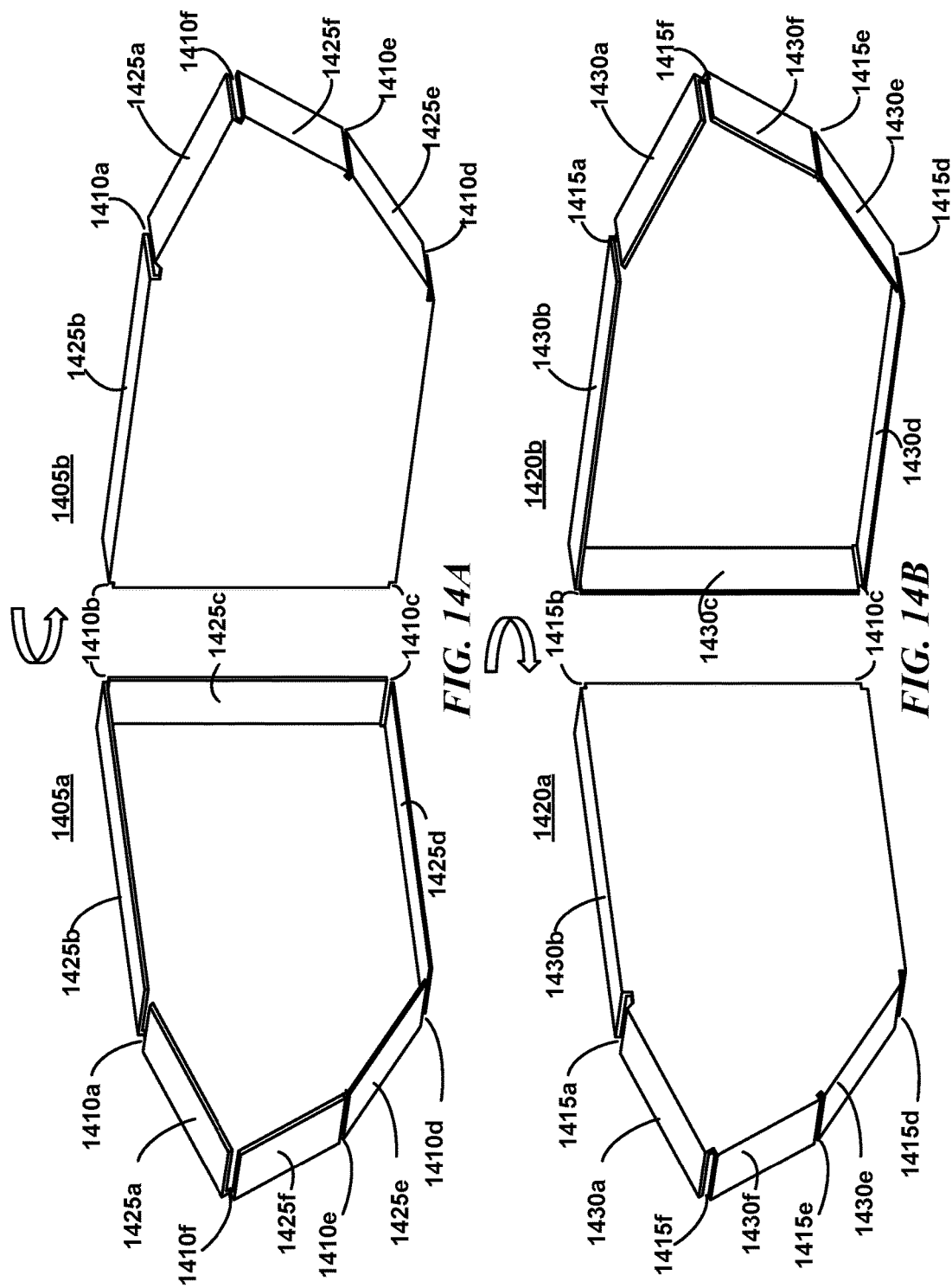

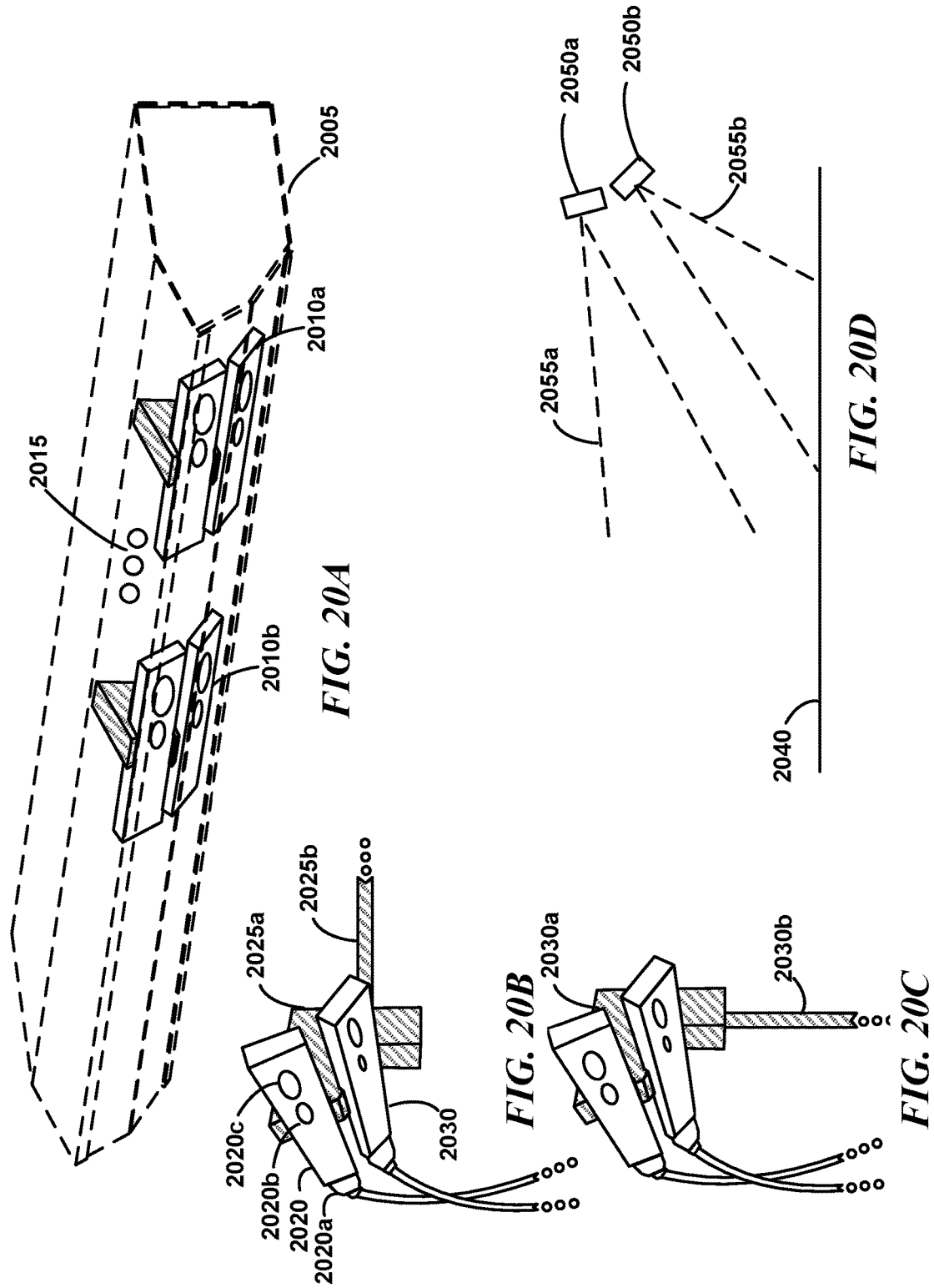

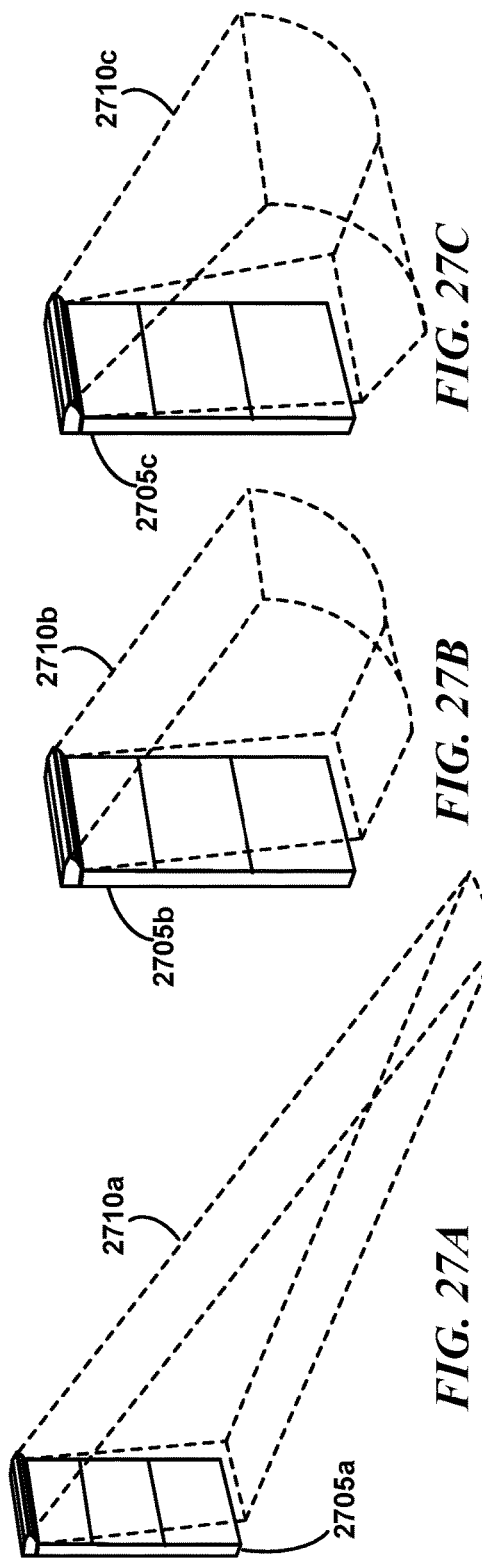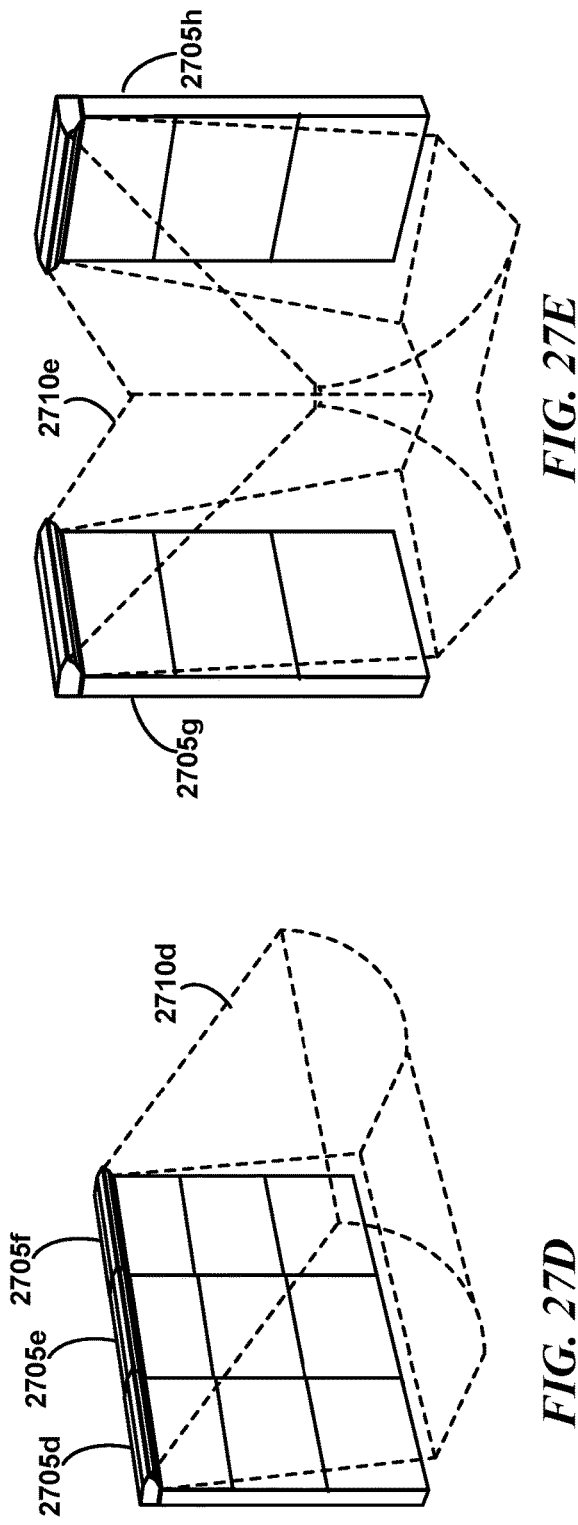

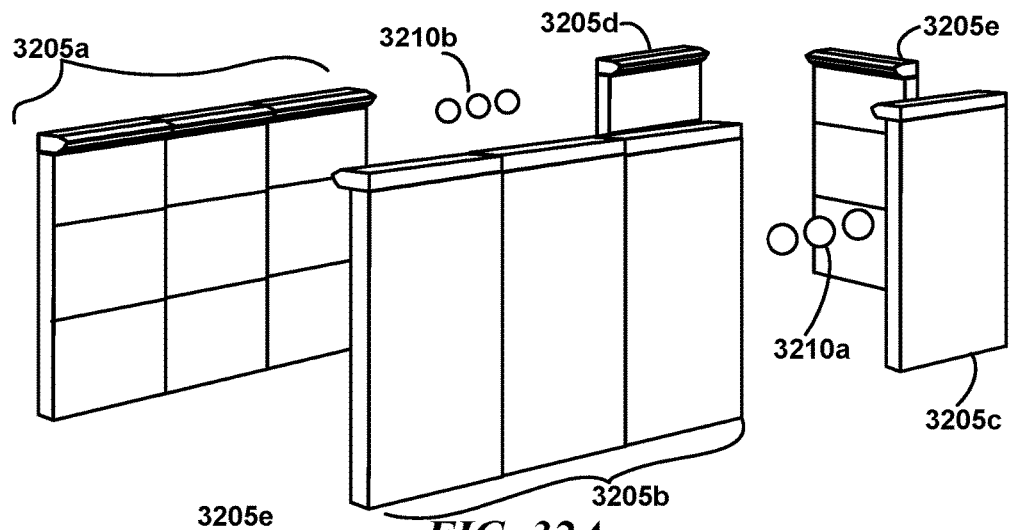
FIG. 32A
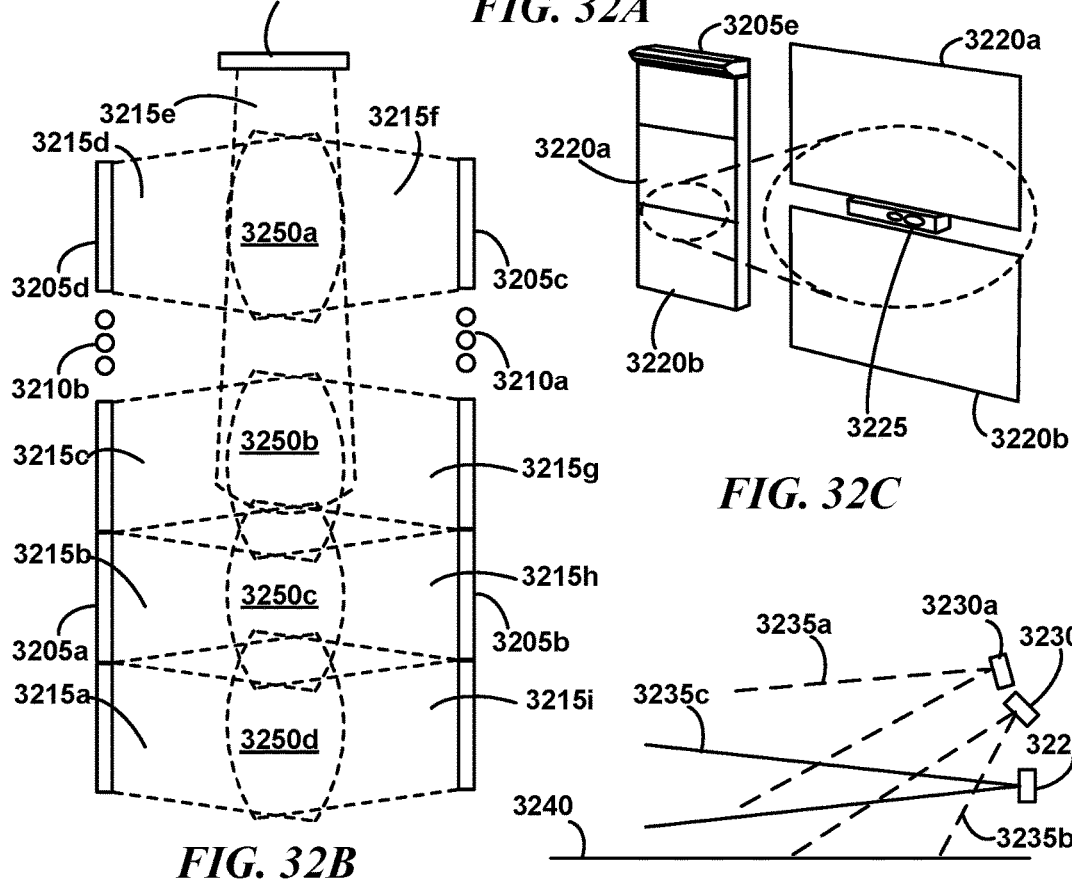
FIG. 32B
FIG. 32C
FIG. 32D

US 10,303,417 B2

INTERACTIVE SYSTEMS FOR DEPTH-BASED INPUT

TECHNICAL FIELD

Various of the disclosed embodiments relate to optimizations and improvements for depth-based human-computer interactions.

BACKGROUND

Human-computer interaction (HCI) systems are becoming increasingly prevalent in our society. With this increasing prevalence has come an evolution in the nature of such interactions. Punch cards have been surpassed by keyboards, which were themselves complemented by mice, which are themselves now complemented by touch screen displays, etc. Various machine vision approaches may even now facilitate visual, rather than the mechanical, user feedback. Machine vision allows computers to interpret images from their environment to, e.g., recognize users' faces and gestures. Some machine vision systems rely upon grayscale or RGB images of their surroundings to infer user behavior. Some machine vision systems may also use depth-based sensors, or rely exclusively upon depth based sensors, to recognize user behavior (e.g., the Microsoft Kinect™, Intel RealSense™, Apple PrimeSense™, Structure Sensor™ Velodyne HDL-32E LiDAR™, Orbbec Astra™, etc.).

Depth-based user interface systems can be exceptionally challenging to install in a consistently effective manner. This challenge is due at least in part to the variety of limitations and benefits associated with various depth sensors, displays, and computer systems, in conjunction with the environments in which the system will be installed and the gesture interactions which will be recognized. To be successful, systems must often comply with a variety of constraints, such as complementary depth fields of view, display orientation flexibility, diverse installation orientations, etc. In some instances, the depth sensors may be sensitive to physical damage and require a suitable protective housing, while still permitting adequate depth fields of view. While some of these challenges may be addressed by an installation technician on-site, systems that can accommodate these constraints ex ante, or at least assist the technician with the installation, may provide for easier and more consistent installations. Accordingly, there exists a need for systems and structures that facilitate flexible but effective interface installation.

BRIEF DESCRIPTION OF THE DRAWINGS

Various of the embodiments introduced herein may be better understood by referring to the following Detailed Description in conjunction with the accompanying drawings, in which like reference numerals indicate identical or functionally similar elements:

FIG. 1 is a series of use case diagrams illustrating various situations in which various of the disclosed embodiments may be implemented;

FIG. 3 is a series of perspective and side views of example depth data as may be used in some embodiments;

FIG. 13A is an exploded, schematic view of components in the frame of a multi-angled depth sensor housing, as may be implemented in some embodiments; FIG. 13B is an assembled schematic view of components in the frame of a multi-angled depth sensor housing, as may be implemented in some embodiments;

FIG. 14A is a view of the spacer component of FIG. 13A as may be implemented in some embodiments, from two perspectives; FIG. 14B is a view of the mirrored spacer component of FIG. 13A as may be implemented in some embodiments, from two perspectives;

FIG. 20A is a "see-through" view of a housing frame of a multi-angled depth sensor housing comprising depth sensors attached via "standalone mounts", rather than brackets, as may be implemented in some embodiments; FIG. 20B is a schematic view of a horizontal sensor mount as may be implemented in some embodiments; FIG. 20C is a schematic view of a vertical sensor mount as may be implemented in some embodiments; FIG. 20D is a schematic view of a the varied depth region fields of view achieved using a sensor mount of FIG. 20B or FIG. 20C as may occur in some embodiments;

FIG. 27A is a schematic view of a modular system unit's depth field of view, where the depth sensors have no range limitation, as may occur in some embodiments; FIG. 27B is a schematic view of a modular system unit's depth field of view, where the depth sensors have a range limitation, as may occur in some embodiments; FIG. 27C is a schematic view of a modular system unit's depth field of view, where the depth sensors have a range limitation, as well as a composite spread beyond the width of the modular system unit, as may occur in some embodiments; FIG. 27D is a schematic view of a composite modular system composed of three units such as are depicted in FIG. 27B and the corresponding composite depth field of view, as may occur in some embodiments; FIG. 27E is a schematic view of a composite modular system composed of two units such as are depicted in FIG. 27C and the corresponding composite depth field of view, as may occur in some embodiments;

FIG. 32A is a schematic view of a "corridor" composite modular system, as may be implemented in some embodiments; FIG. 32B is a schematic top-down view of the composite modular system of FIG. 32A; FIG. 32C is a schematic view of an end unit from the composite modular system of FIG. 32A, the end unit having a longitudinal depth sensor as may be implemented in some embodiments; FIG. 32D is a schematic view of a the varied depth region fields of view achieved using the sensor mount of FIG. 32C as may occur in some embodiments;

Figure 2:
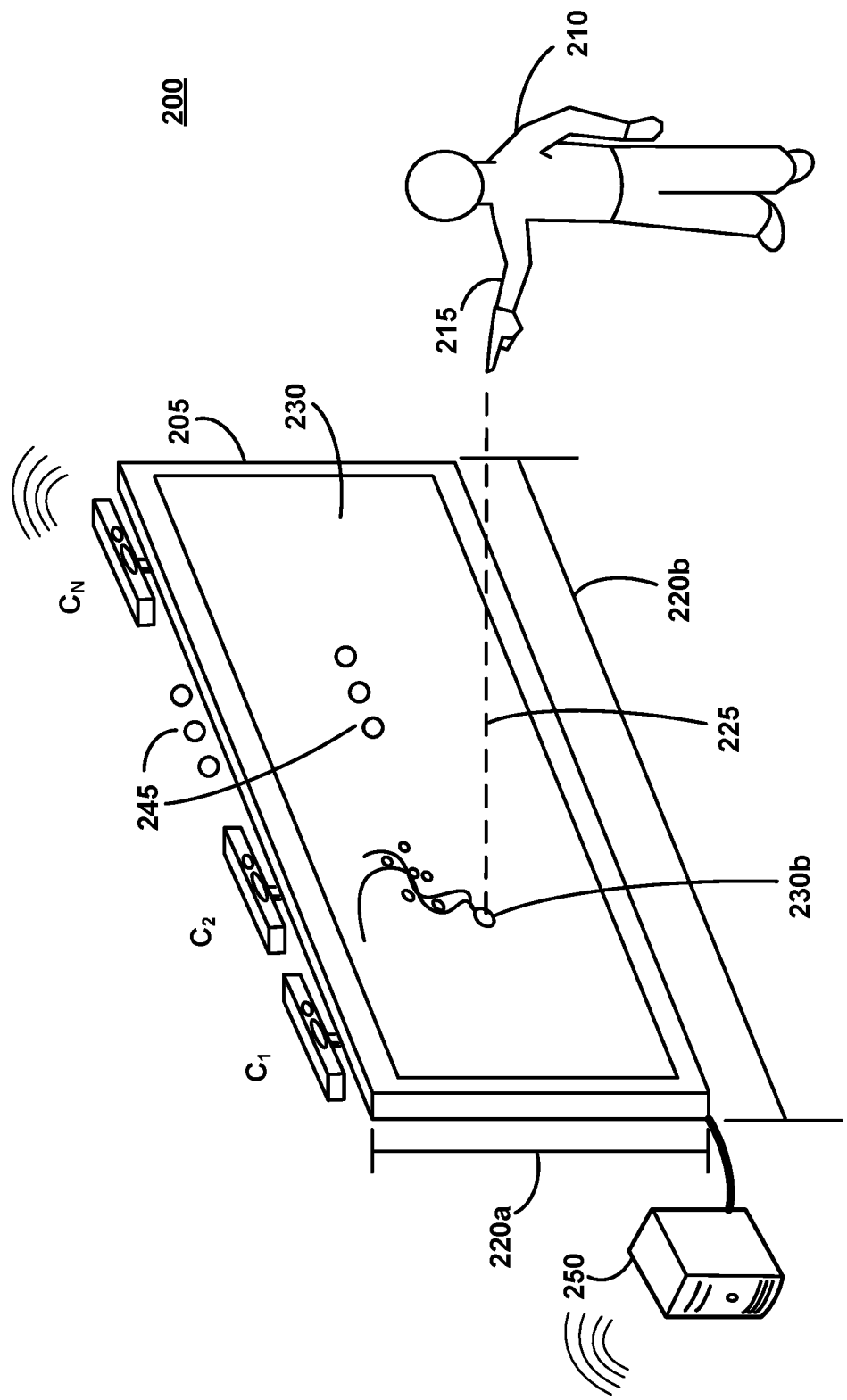
FIG. 2 is a perspective use case diagram illustrating an example user interaction with an example display structure as may occur in some embodiments.

The specific examples depicted in the drawings have been selected to facilitate understanding. Consequently, the disclosed embodiments should not be restricted to the specific details in the drawings or the corresponding disclosure. For example, the drawings may not be drawn to scale, the dimensions of some elements in the figures may have been adjusted to facilitate understanding, and the operations of the embodiments associated with the flow diagrams may encompass additional, alternative, or fewer operations than those depicted here. Thus, some components and/or operations may be separated into different blocks or combined into a single block in a manner other than as depicted. The intention is not to limit the embodiments to the particular examples described or depicted. On the contrary, the embodiments are intended to cover all modifications, equivalents, and alternatives falling within the scope of the disclosed examples.

DETAILED DESCRIPTION

Example Use Case Overview

Various of the disclosed embodiments may be used in conjunction with a mounted or fixed depth camera system to detect, e.g. user gestures. FIG. 1 is a series of use case diagrams illustrating various situations 100a-c in which various of the disclosed embodiments may be implemented. In situation 100a, a user 105 is standing before a kiosk 125 which may include a graphical display 125a. Rather than requiring the user to physically touch items of interest on the display 125a the system may allow the user to "point" or "gesture" at the items and to thereby interact with the kiosk 125.

A depth sensor 115a may be mounted upon or connected to or near the kiosk 125 so that the depth sensor's 115a field of depth capture 120a (also referred to as a "field of view" herein) encompasses gestures 110 made by the user 105. Thus, when the user points at, e.g., an icon on the display 125a by making a gesture within the field of depth data capture 120a the depth sensor 115a may provide the depth values to a processing system, which may infer the selected icon or operation to be performed. The processing system may be configured to perform various of the operations disclosed herein and may be specifically configured, or designed, for interfacing with a depth sensor (indeed, it may be embedded in the depth sensor). Accordingly, the processing system may include hardware, firmware, software, or a combination of these components. The processing system may be located within the depth sensor 115a, within the kiosk 125, at a remote location, etc. or distributed across locations. The applications running on the kiosk 125 may simply receive an indication of the selected icon and may not be specifically designed to consider whether the selection was made via physical touch vs. depth based determinations of the selection. Thus, the depth sensor 115a and the processing system may be an independent product or device from the kiosk 125 in some embodiments.

In situation 100b, a user 105 is standing in a domestic environment which may include one or more depth sensors 115b, 115c, and 115d each with their own corresponding fields of depth capture 120b, 120c, and 120d respectively. Depth sensor 115b may be located on or near a television or other display 130. The depth sensor 115b may be used to capture gesture input from the user 105 and forward the depth data to an application running on or in conjunction with the display 130. For example, a gaming system, computer conferencing system, etc. may be run using display 130 and may be responsive to the user's 105 gesture inputs. In contrast, the depth sensor 115c may passively observe the user 105 as part of a separate gesture or behavior detection application. For example, a home automation system may respond to gestures made by the user 105 alone or in conjunction with various voice commands. In some embodiments, the depth sensors 115b and 115c may share their depth data with a single application to facilitate observation of the user 105 from multiple perspectives. Obstacles and non-user dynamic and static objects, e.g. couch 135, may be present in the environment and may or may not be included in the fields of depth capture 120b, 120c.

Note that while the depth sensor may be placed at a location visible to the user 105 (e.g., attached on top or mounted upon the side of televisions, kiosks, etc. as depicted, e.g., with sensors 115a-c) some depth sensors may be integrated within another object. Such an integrated sensor may be able to collect depth data without being readily visible to user 105. For example, depth sensor 115d may be integrated into television 130 behind a one-way mirror and used in lieu of sensor 115b to collect data. The one-way mirror may allow depth sensor 115d to collect data without the user 105 realizing that the data is being collected. This may allow the user to be less self-conscious in their movements and to behave more naturally during the interaction.

While the depth sensors 115a-d may be positioned parallel to a wall, or with depth fields at a direction orthogonal to a normal vector from the floor, this may not always be the case. Indeed, the depth sensors 115a-d may be positioned at a wide variety of angles, some of which place the fields of depth data capture 120a-d at angles oblique to the floor and/or wall. For example, depth sensor 115c may be positioned near the ceiling and be directed to look down at the user 105 on the floor.

This relation between the depth sensor and the floor may be extreme and dynamic in some situations. For example, in situation 100c a depth sensor 115e is located upon the back of a van 140. The van may be parked before an inclined platform 150 to facilitate loading and unloading. The depth sensor 115e may be used to infer user gestures to direct the operation of the van (e.g., move forward, backward) or to perform other operations (e.g., initiate a phone call). Because the van 140 regularly enters new environments, new obstacles and objects 145a,b may regularly enter the depth sensor's 115e field of depth capture 120e. Additionally, the inclined platform 150 and irregularly elevated terrain may often place the depth sensor 115e, and corresponding field of depth capture 120e, at oblique angles relative to the "floor" on which the user 105 stands. Such variation can complicate assumptions made regarding the depth data in a static and/or controlled environment (e.g., assumptions made regarding the location of the floor).

Various of the disclosed embodiments contemplate user interactions with a feedback system comprising two or more depth sensors. The depth sensor devices may also include visual image sensors, e.g., RGB sensors, in some embodiments. For example, FIG. 2 is a perspective use case diagram illustrating an example user interaction 200 with an example display structure 205 as may occur in some embodiments. The display structure 205 may be placed in a mall, shopping center, grocery, check-in line, etc. In some embodiments, the height 220a is at least as large as a user 210 or slightly larger, e.g., 7-10 feet. The length 220b may be several times the user's 210 width, e.g., to facilitate an interaction as the user 210 walks the length of the display structure 205.

The example display structure 205 includes a screen 230. The screen 230 may comprise a single large screen, multiple smaller screens placed adjacent to one another, a projection, etc. In one example interaction, the user may gesture 215 at a portion of the screen and the system may present a visual feedback, such as a cursor 230b at a location corresponding to the gesture's projection 225 upon the screen. The display structure 205 may monitor the user's 210 movement and gestures using one or more of one or more depth sensors $C_1$, $C_2$, ..., $C_N$. In the example depicted in FIG. 2, at least three cameras are present. The ellipses 245 indicate that more than three cameras may be present in some embodiments, and the length 220b of the display structure 205 may be adjusted accordingly. In this example, the sensors are evenly spaced across the top of the display structure 205, though in some embodiments they may be unevenly spaced.

Though the terms "camera" and "sensor" may be used interchangeably in this application, one will recognize that the depth sensor need not be or facilitate the "camera capture" of optical images, e.g., RGB or grayscale images, though the depth sensor may additionally include that functionality. In some embodiments, the computer system 250 may take a variety of forms, e.g., a preprogrammed chip, circuit, Field Programmable Gate Array (FPGA), minicomputer, etc. One will recognize that "computer system", "processing system", and the like may be used interchangeably herein. Similarly, one will readily appreciate that the training system employed to create a system for recognizing gestures may, but need not be, the same system as the testing system that performs the on-site recognition. Accordingly, in some embodiments, the "system" may be a computer distinct from the interfaces of FIGS. 1 and 2, residing, e.g., off-site from where the in-situ classification occurs.

Example Depth Data

Analogous to common optical image cameras, depth sensors 115a-e, $C_1$, $C_2$, ..., $C_N$ may capture individual "frames" of depth data over time. Each "frame" may comprise a collection of three-dimensional values for depths measured in the field of view (though one will readily recognize multiple ways to represent, e.g., a time of flight analysis for depth determination). These three-dimensional values may be represented, e.g., as points in three-dimensional space, as distances for rays emitted at various angles from the depth sensor, etc. FIG. 3 is a series of perspective 300a and side 300b views of example depth data 305 as may be used in some embodiments. In this example, a user is pointing at the depth sensor with his right hand while standing in front of a wall. A table to his left has also been captured in the field of view. Thus, depth values associated with the user 310 include a portion associated with the user's head 310a and a portion associated with the user's extended right arm 310b. Similarly, the background behind the user is reflected in the depth values 320, including those values 315 associated with the table.

To facilitate understanding, the side view 300b also includes a depiction of the depth sensor's field of view 335 at the time of the frame capture. The depth sensor's angle 330 at the origin is such that the user's upper torso, but not the user's legs have been captured in the frame. Again, this example is merely provided to accommodate the reader's understanding, and the reader will appreciate that some embodiments may capture the entire field of view without omitting any portion of the user. For example, the embodiments depicted in FIGS. 1A-C may capture less than all of the interacting user, while the embodiments of FIG. 2 may capture the entirety of the interacting user (in some embodiments, everything that is more than 8 cm off the floor appears in the depth field of view). Of course, the reverse may be true depending upon the orientation of the system, depth camera, terrain, etc. Thus, one will appreciate that variations upon the disclosed examples are explicitly contemplated (e.g., classes referencing torso components are discussed below, but some embodiments will also consider classifications of legs, feet, clothing, user pairings, user poses, etc.).

Similarly, though FIG. 3 depicts the depth data as a "point cloud", one will readily recognize that the data received from a depth sensor may appear in many different forms. For example, a depth sensor, such as depth sensor 115a or 115d, may include a grid-like array of detectors. These detectors may acquire an image of the scene from the perspective of fields of depth captures 120a and 120d respectively. For example, some depth detectors include an "emitter" producing electromagnetic radiation. The travel time from the emitter to an object in the scene, to one of the grid cell detectors may correspond to the depth value associated with that grid cell. The depth determinations at each of these detectors may be output as a two-dimensional grid of depth values. A "depth frame" as used herein may refer to such a two-dimensional grid, but can also refer to other representations of the three-dimensional depth data acquired from the depth sensor (e.g., a point cloud, a sonographic image, etc.).

Example Depth Data Clipping Methodology

Figure 4:
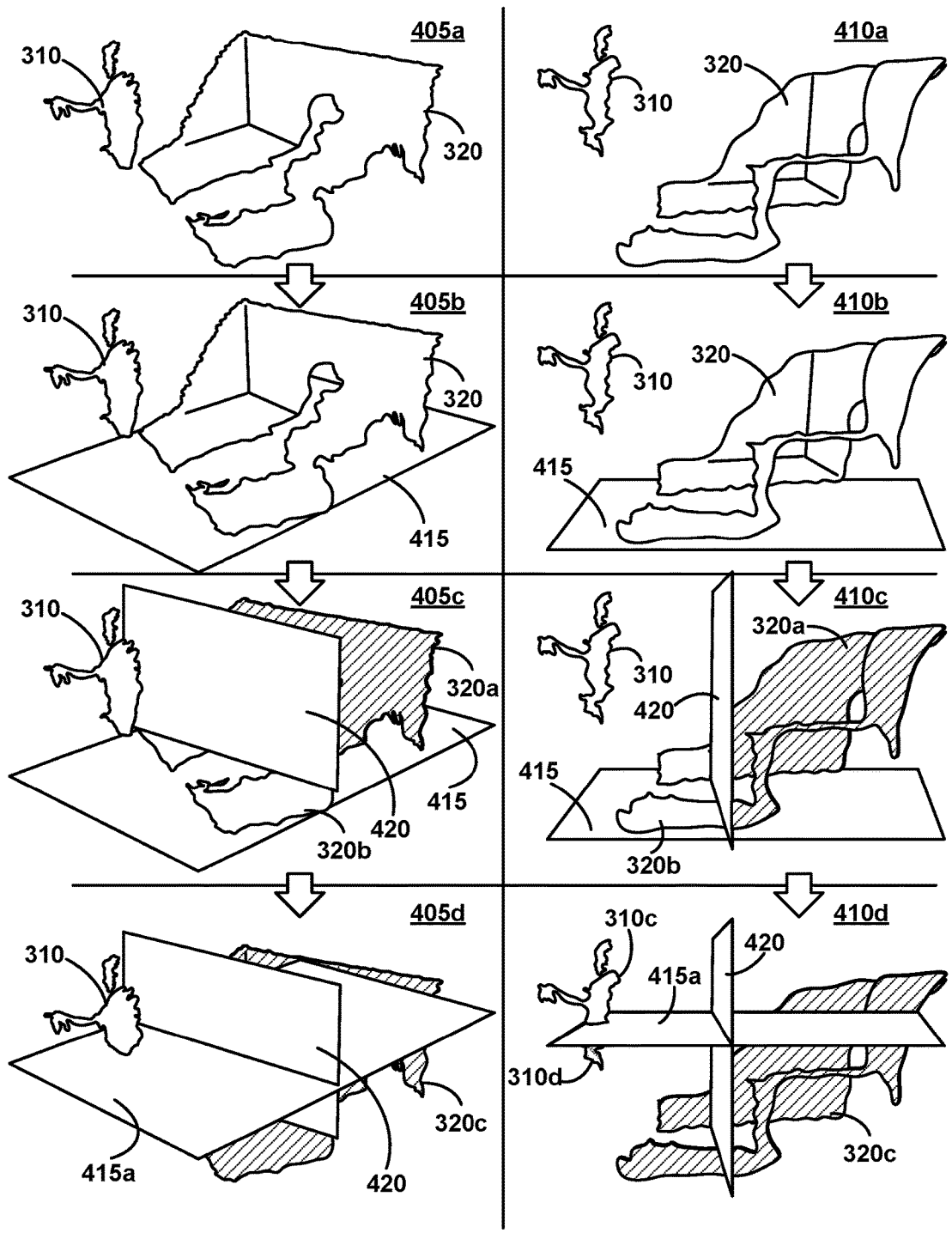
FIG. 4 is a series of views illustrating data isolation via plane clipping as may be applied to the depth data of FIG. 3 in some embodiments.

Many applications would like to infer the user's gestures from the depth data 305. Accomplishing this from the raw depth data could be quite challenging and so some embodiments apply preprocessing procedures to isolate the depth values of interest. For example, FIG. 4 is a series of views illustrating data isolation via plane clipping as may be applied to the depth data 305 of FIG. 3 in some embodiments. Particularly, perspective view 405a and side view 410a illustrate the depth data 305 (including portions associated with the user 310 and portions associated with the background 320). Perspective view 405b and side view 410b show the depth data 305 relative to a floor plane 415. The floor plane 415 is not part of the depth frame data 305. Rather, the floor plane 415 may be assumed based upon context or estimated by the processing system.

Perspective view 405c and side view 410c introduce a wall plane 420, which may also be assumed or estimated by the processing system. The floor and wall plane may be used as "clipping planes" to exclude depth data from subsequent processing. For example, based upon the assumed context in which the depth sensor is used, a processing system may place the wall plane 420 halfway to the maximum range of the depth sensor's field of view. Depth data values behind this plane may be excluded from subsequent processing. For example, the portion 320a of the background depth data may be excluded, but the portion 320b may be retained as shown in perspective view 405c and side view 410c.

Ideally, the portion 320b of the background would also be excluded from subsequent processing, since it does not encompass data related to the user. Some embodiments further exclude depth data by "raising" the floor plane 415 based upon context to a position 415a as shown in perspective view 405d and side view 410d. This may result in the exclusion of the portion 320b from future processing. These clipping operations may also remove portions of the user data 310d which will not contain gestures (e.g., the lower torso). As mentioned previously, the reader will appreciate that this example is provided merely to facilitate understanding and that in some embodiments (e.g., those of systems as appear in FIG. 2) clipping may be omitted entirely, or may occur only very close to the floor, so that leg and even foot data are both still captured. Thus, only the portion 310c remains for further processing. One will recognize that FIG. 4 simply depicts one possible clipping process for a given context. Different contexts, for example, situations where gestures include the user's lower torso, may be addressed in a similar fashion. Many such operations may still require an accurate assessment of the floor 415 and wall 420 planes to perform accurate clipping.

Example Depth Data Classification Methodology

Figure 5:
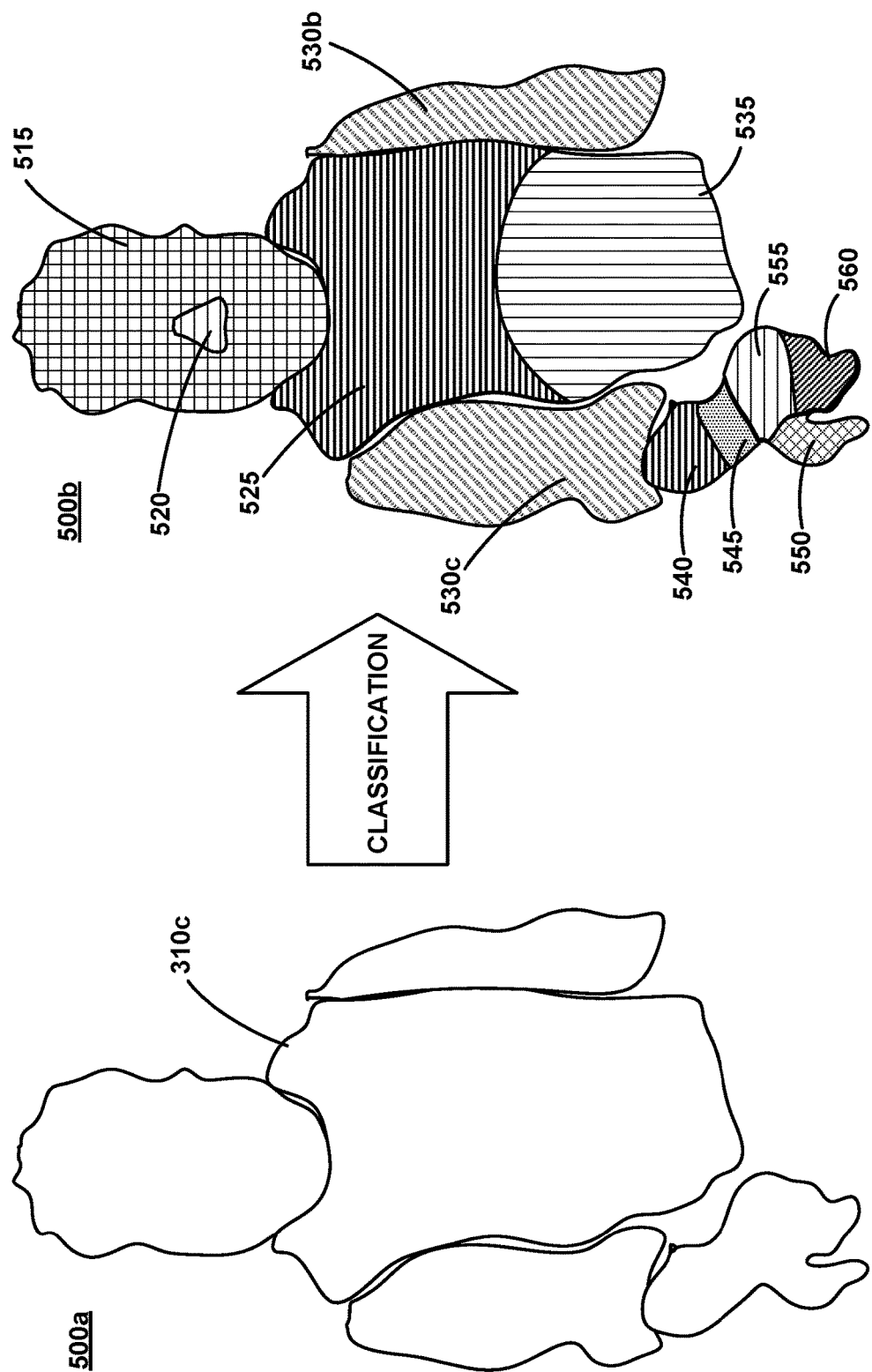
FIG. 5 is an example component classification as may be applied to the isolated data of FIG. 4 in some embodiments.

Following the isolation of the depth values (which may not occur in some embodiments), which may contain gesture data of interest, the processing system may classify the depth values into various user portions. These portions, or "classes", may reflect particular parts of the user's body and can be used to infer gestures. FIG. 5 is an example component classification as may be applied to the isolated data of FIG. 4 in some embodiments. Initially 500a, the extracted data 310c may be unclassified. Following classification 500b, each of the depth values may be associated with a given classification. The granularity of the classification may reflect the character of the gestures of interest. For example, some applications may be interested in the direction the user is looking, and so may break the head into a "head" class 515 and a "nose" class 520. Based upon the relative orientation of the "head" class 515 and the "nose" class 520 the system can infer the direction in which the user's head is turned. Since the chest and torso are not generally relevant to the gestures of interest in this example, only broad classifications "upper torso" 525 and "lower torso" 535 are used. Similarly, the details of the upper arm are not as relevant as other portions and so a single class "right arm" 530c and a single class "left arm" 530b may be used.

In contrast, the lower arm and hand may be very relevant to gesture determination and more granular classifications may be used. For example, a "right lower arm" class 540, a "right wrist" class 545, a "right hand" class 555, a "right thumb" class 550, and a "right fingers" class 560 may be used. Though not shown, complementary classes for the left lower arm may also be used. With these granular classifications, the system may able to infer, e.g., a direction the user is pointing, by comparing the relative orientation of the classified depth points.

Example Depth Data Processing Pipeline

Figure 6:
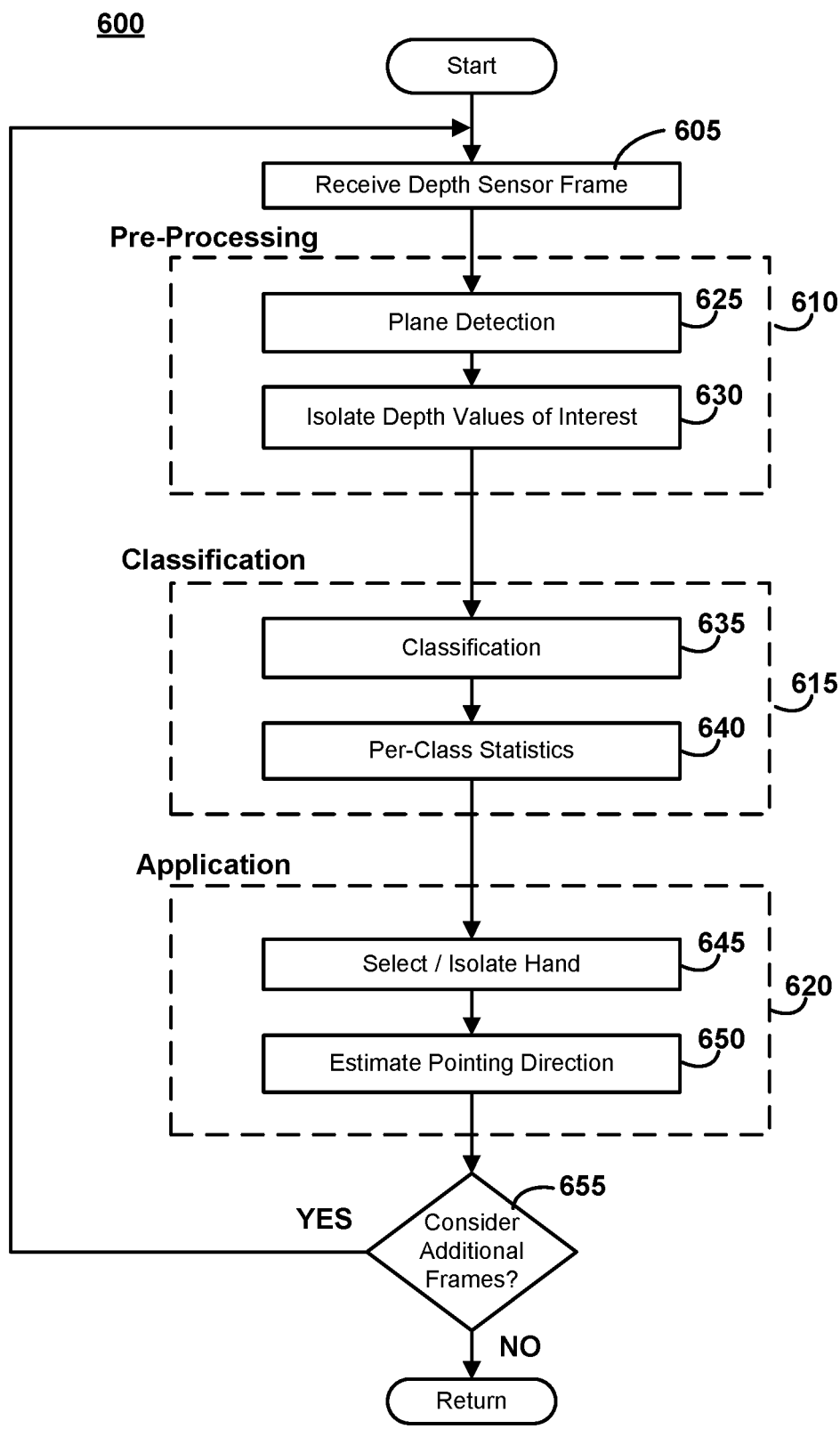
FIG. 6 is a flow diagram illustrating some example depth data processing operations as may be performed in some embodiments.

FIG. 6 is a flow diagram illustrating some example depth data processing operations 600 as may be performed in some embodiments. At block 605, the processing system may receive a frame of depth sensor data (e.g., a frame such as frame 305). Generally speaking, the data may then pass through "Pre-Processing" 610, "Classification" 615, and "Application" 620 stages. During "Pre-Processing" 610, the processing system may perform "plane detection" at block 625 using the frame data or based upon assumptions or depth camera configuration details (though again, in many embodiments preprocessing and plane detection may not be applied). This may include, e.g., the clipping planes discussed with respect to FIG. 4, such as the floor 415 plane and wall plane 420. These planes may be used, e.g., to isolate the depth values of interest at block 630, e.g., as described above with respect to FIG. 4.

During Classification 615, the system may associate groups of depth values with one class (or in some embodiments, multiple classes) at block 635. For example, the system may determine a classification using classes as discussed with respect to FIG. 5. At block 640, the system may determine per-class statistics (e.g., the number of depth values associated with each class, the effect upon ongoing system training and calibration, etc.). Example classes may include: Nose, Left Index Finger, Left Other Fingers, Left Palm, Left Wrist, Right Index Finger, Right Other Fingers, Right Palm, Right Wrist, and Other.

During the Application 620 operations, the system may use the class determinations to infer user-behavior relevant to a particular application objective. For example, an HCI interface may seek to determine where the user is presently pointing their hand. In this example, at block 645, the system will select/isolate the depth values classified as being associated with the "hand" and/or "fingers". From these depth values (and possibly depth values associated with the user's arm) the system may estimate the direction in which the user is pointing in this particular frame at block 650 (one will recognize that other gestures than this pointing example may also be performed). This data may then be published to an application program, e.g., a kiosk operating system, a game console operating system, etc. At block 655, the operations may be performed again for additional frames received. One will recognize that the process may be used to infer gestures across frames by comparing, e.g., the displacement of classes between frames (as, e.g., when the user moves their hand from left to right).

Figure 7:
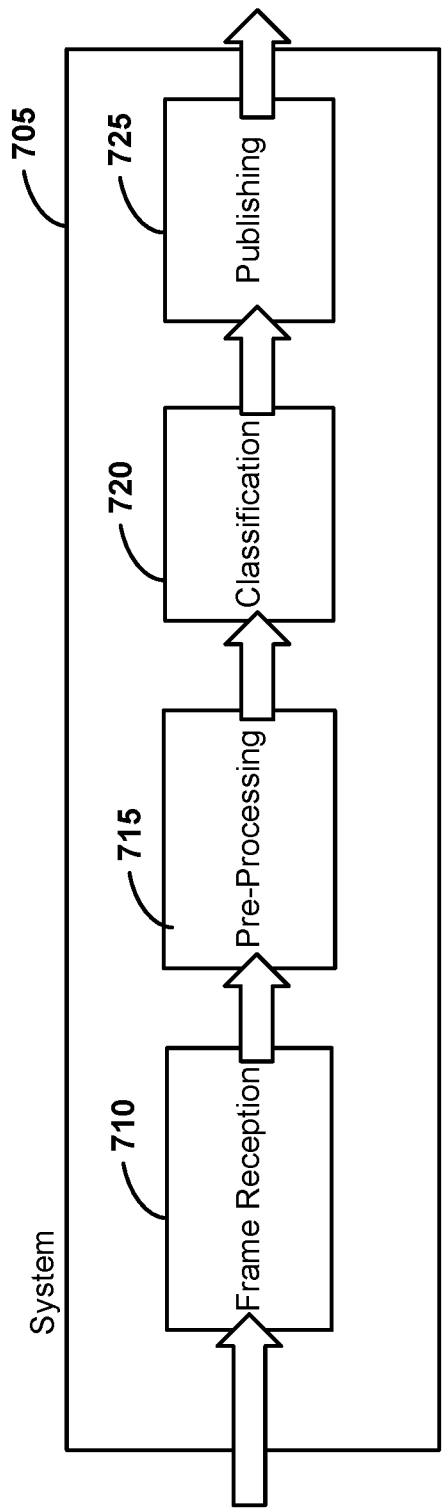
FIG. 7 is a hardware block diagram illustrating an example hardware implementation which may be used to perform depth data processing operations in some embodiments.

FIG. 7 is a hardware block diagram illustrating an example hardware implementation 705 which may be used to perform depth data processing operations in some embodiments. A frame reception system 710 may receive a depth frame from a depth sensor. The frame reception system 710 may be firmware, software, or hardware (e.g., an FPGA implementation, system-on-a-chip, etc.). The frame may be directly passed, or cached and subsequently passed, to a pre-processing module 715. Pre-processing module 715 may also be firmware, software, or hardware (e.g., an FPGA implementation, system-on-a-chip, etc.). The pre-processing module may perform the Preprocessing operations 610 discussed in FIG. 6. The pre-processing results (e.g., the isolated depth values 310c) may then be provided to the Classification module 720. The Classification module 720 may be firmware, software, or hardware (e.g., an FPGA implementation, system-on-a-chip, etc.). The Classification module 720 may perform the Classification operations 615 discussed in FIG. 6. The classified depth values may then be provided to a Publishing module 725. The Publishing module 725 may be configured to package the classification results into a form suitable for a variety of different applications (e.g., as specified at 620). For example, an interface specification may be provided for kiosk operating systems, gaming operating systems, etc. to receive the classified depth values and to infer various gestures therefrom.

Example Interactive System Form Factors

Figure 8:
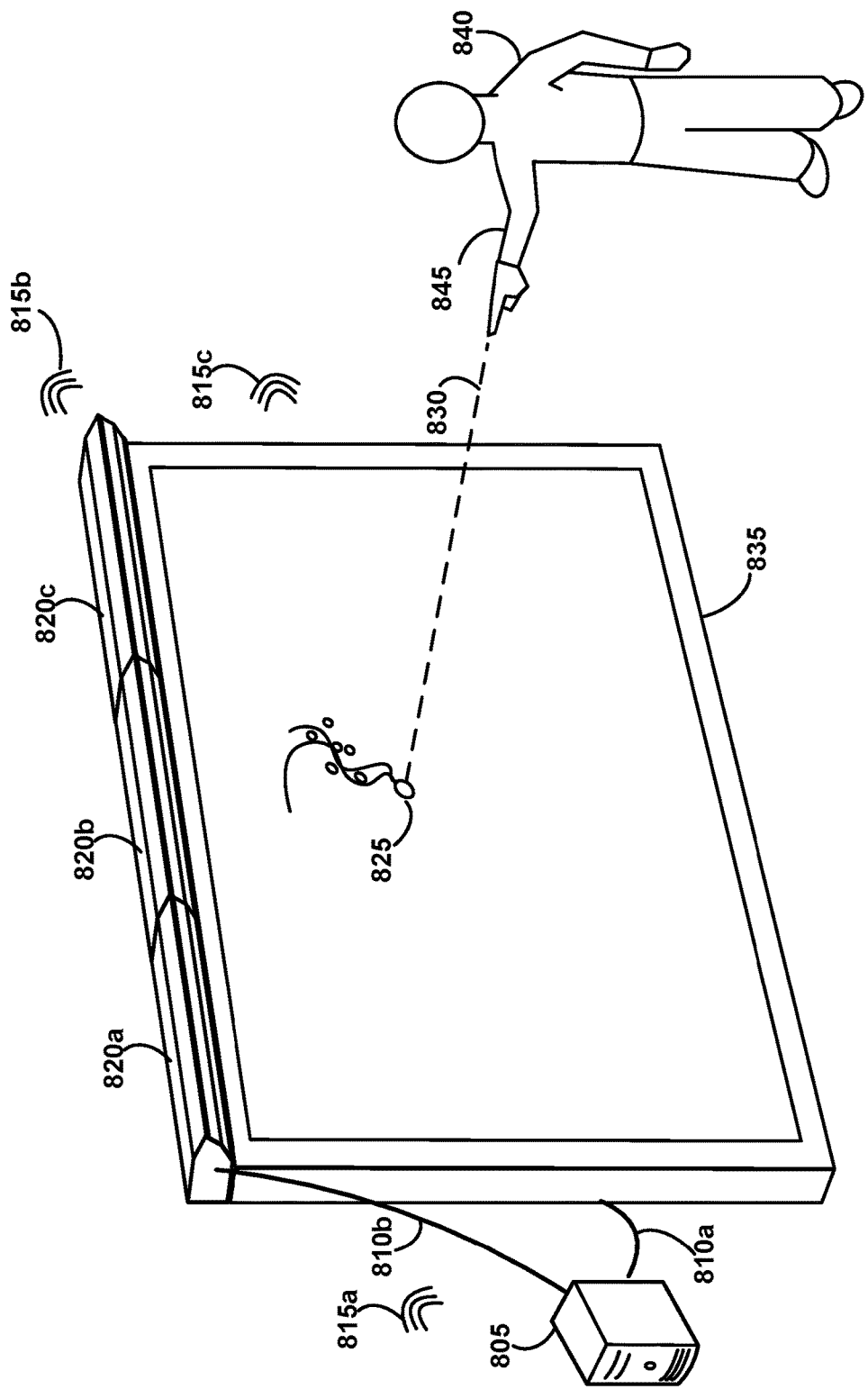
FIG. 8 is a schematic diagram of an example wide-screen display with a multi-angled depth sensor housing as may be implemented in some embodiments.

Various embodiments may include a housing frame for one or more of the depth sensors. The housing frame may be specifically designed to anticipate the inputs and behaviors of the users. In some embodiments, the display system may be integrated with the housing frame to form modular units. FIG. 8 is a schematic diagram of an example widescreen display with a multi-angled depth sensor housing as may be implemented in some embodiments. For example, the system may include a large, single display 835 with which a user 840 may interact via various spatial, temporal, and spatial-temporal gestures 830 using, e.g., their hands 845, arms or entire body. For example, by pointing with the finger of their hand 845, the user may direct the motion of a cursor 825. The display 835 may be in communication with a computer system 805 via, e.g., a direct line connection 810a, wireless connections 815c and 815a, or any other suitable means for communicating the desired display output. Similarly, the computer system 805 may be in communication with one or more depth sensors contained in housing frames 820a-c via a direct line connection 810b, wireless connections 815b and 815a, or any other suitable means for communicating the desired display output. Though shown separately in this example, in some embodiments, the computer system 805 may be integrated with either the housing frames 820a-c or display 835, or be contained off-site.

Each of housing frames 820a-c may contain one or more depth sensors as described elsewhere herein. The computer system 805 may have transforms available to relate depth data acquired at each sensor to a global system of coordinates relative to display 835. These transforms may be achieved using a calibration process, or may, e.g., be preset with a factory default. Though shown here as separate frames, in some embodiments the frames 820a-c may be a single frame. The frames 820a-c may be affixed to the display 835, to a nearby wall, to a separate mounting platform, etc.

Figure 9:
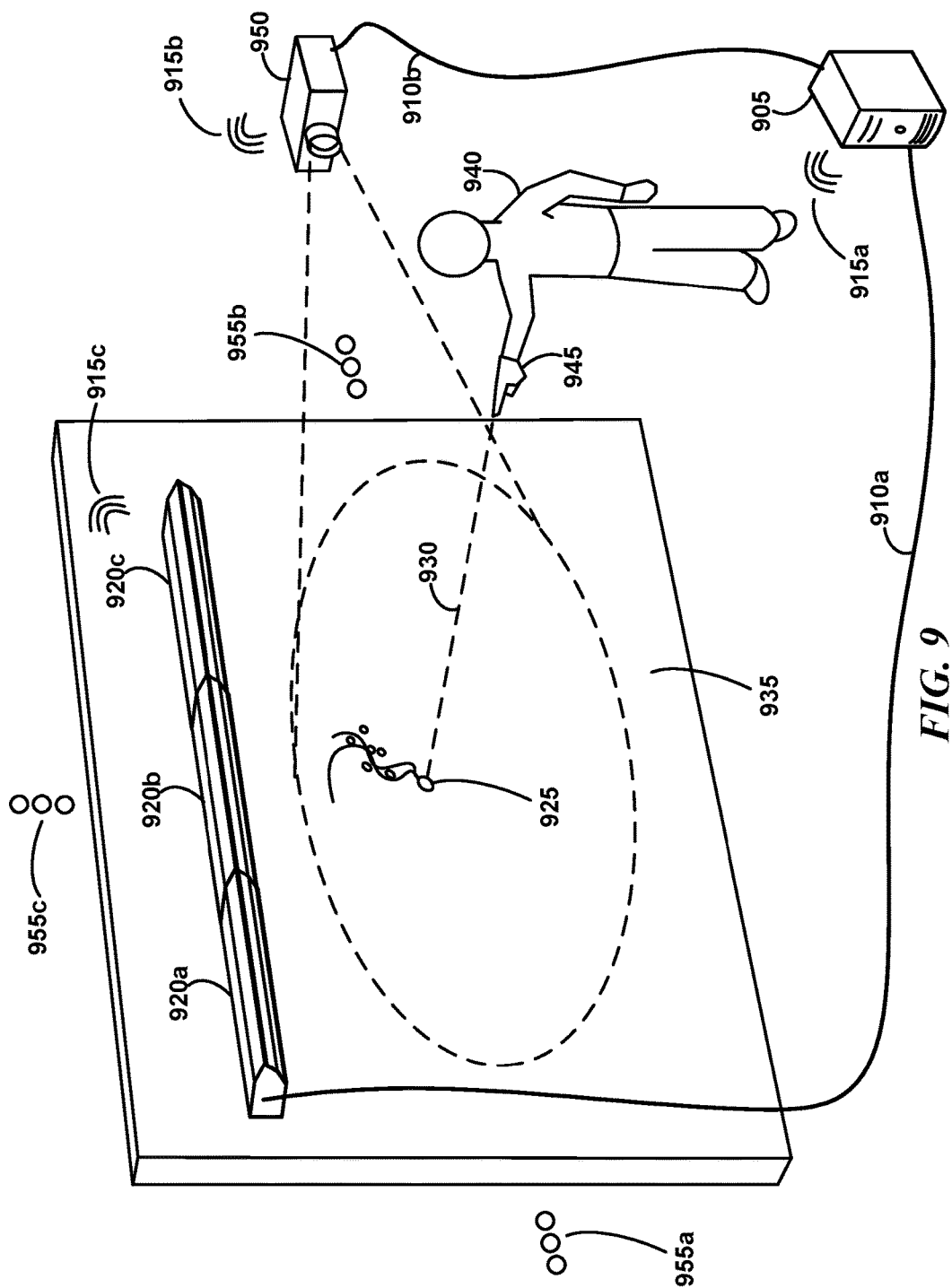
FIG. 9 is a schematic diagram of an example projected display with a multi-angled depth sensor housing as may be implemented in some embodiments.

While some embodiments specifically contemplate providing a display system connected with the housing frames, one will readily appreciate that systems may be constructed in alternative fashions to achieve substantially the same function. For example, FIG. 9 is a schematic diagram of an example projected display with a multi-angled depth sensor housing frames 920a-c as may be implemented in some embodiments. Here, the frames 920a-c have been affixed to a wall 935, e.g., a wall in the user's 940 office, home, or shopping environment. A projector 950 (one will appreciate that rear projection from behind the wall 935 may also be used in some embodiments if the wall's 935 material is suitable). As indicated by ellipses 955*a-c*, the wall 935 may extend well beyond the interaction area in many directions. The projector 950 may be positioned so as to project the desired images upon the wall 935. In this manner, the user may again use their hand 945 to gesture 930 and thereby direct the motion of a cursor 925. Similarly, the projector 950 may be in communication with a computer system 905 and the depth sensors in frames 920*a-c* via direct line connections 910*a*, 910*b*, wireless connections 915*a-c*, or any other suitable communication mechanism.

Figure 10:
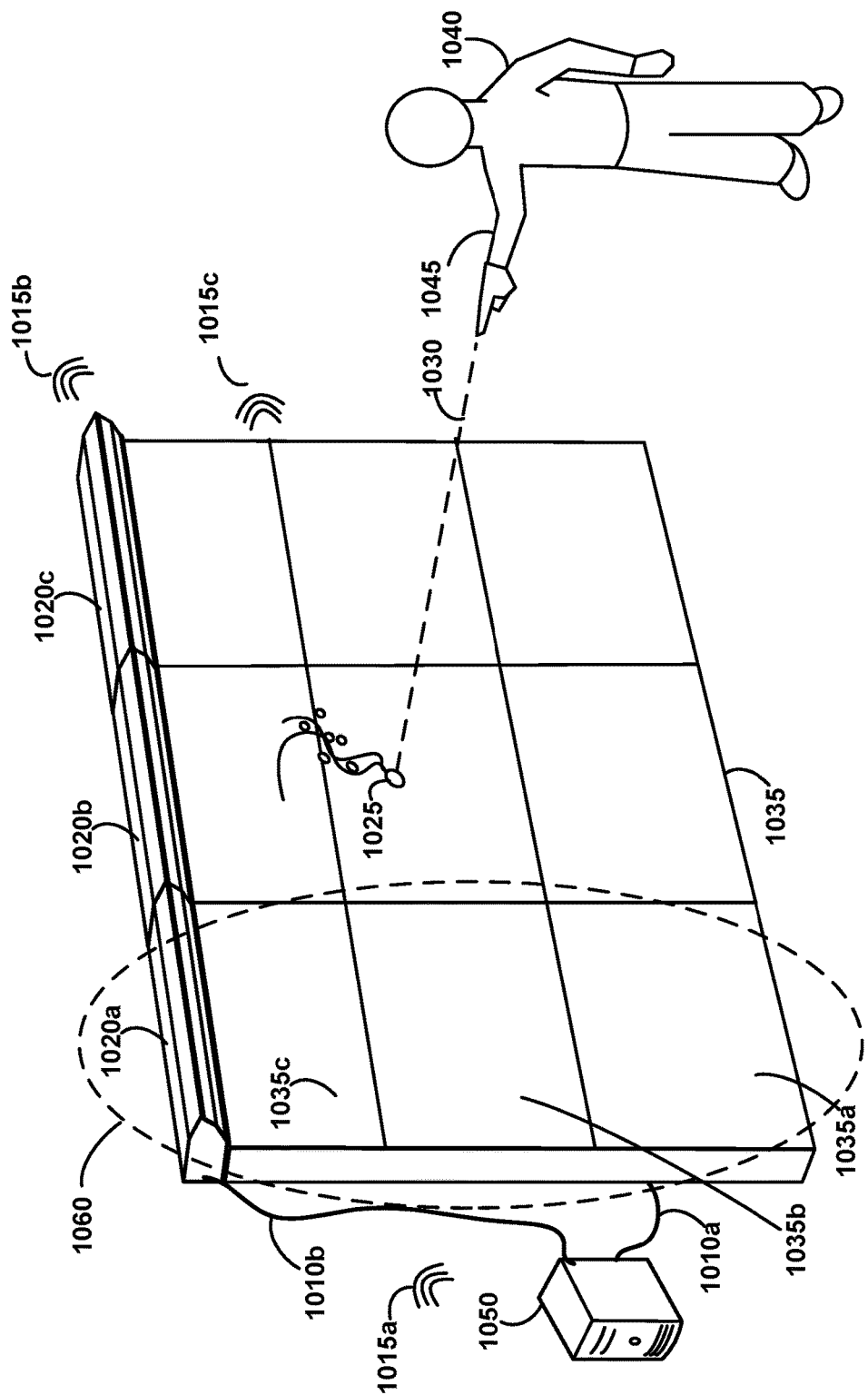
FIG. 10 is a schematic diagram of an example composite display with a multi-angled depth sensor housing as may be implemented in some embodiments.

While FIGS. 8 and 9 describe example embodiments with "monolithic" displays, in some embodiments, the displays and frame housing may be designed so to form "modular" units that may be integrated into a whole. For example, FIG. 10 is a schematic diagram of an example composite display 1035 with a collection of multi-angled depth sensor housing frames as may be implemented in some embodiments. Again, the user 1040 may use hand 1045 gestures 1030 to interact with displayed items, e.g., cursor 1025. A computer system 1050 (here shown on-site and separate from the other components) may be in communication with the depth sensors and display via direct line connections 1010*a*, 1010*b*, wireless communications 1015*a*, 1015*b*, 1015*c*, or any other suitable communications method.

However, in this example embodiment, each vertical segment of the composite system 1035 may include a separate module. For example, one module 1060 may comprise the depth sensor housing frame 1020*a* and three displays 1035*a-c*. The computer system 1050 may employ the individual displays of each vertical module to generate a collective, composite image spanning one or more of them. The remaining depth sensor housing frames 1020*b,c* may similarly be associated with their own displays. One will appreciate that in some embodiments each module will have its own computer system, while, as shown here, in some embodiments there may be a single computer system associated with several or all of the modules. The computer system(s) may process depth data and provide images to the displays on their respective module(s).

Example Modular Interactive System Dimensions

Figure 11:
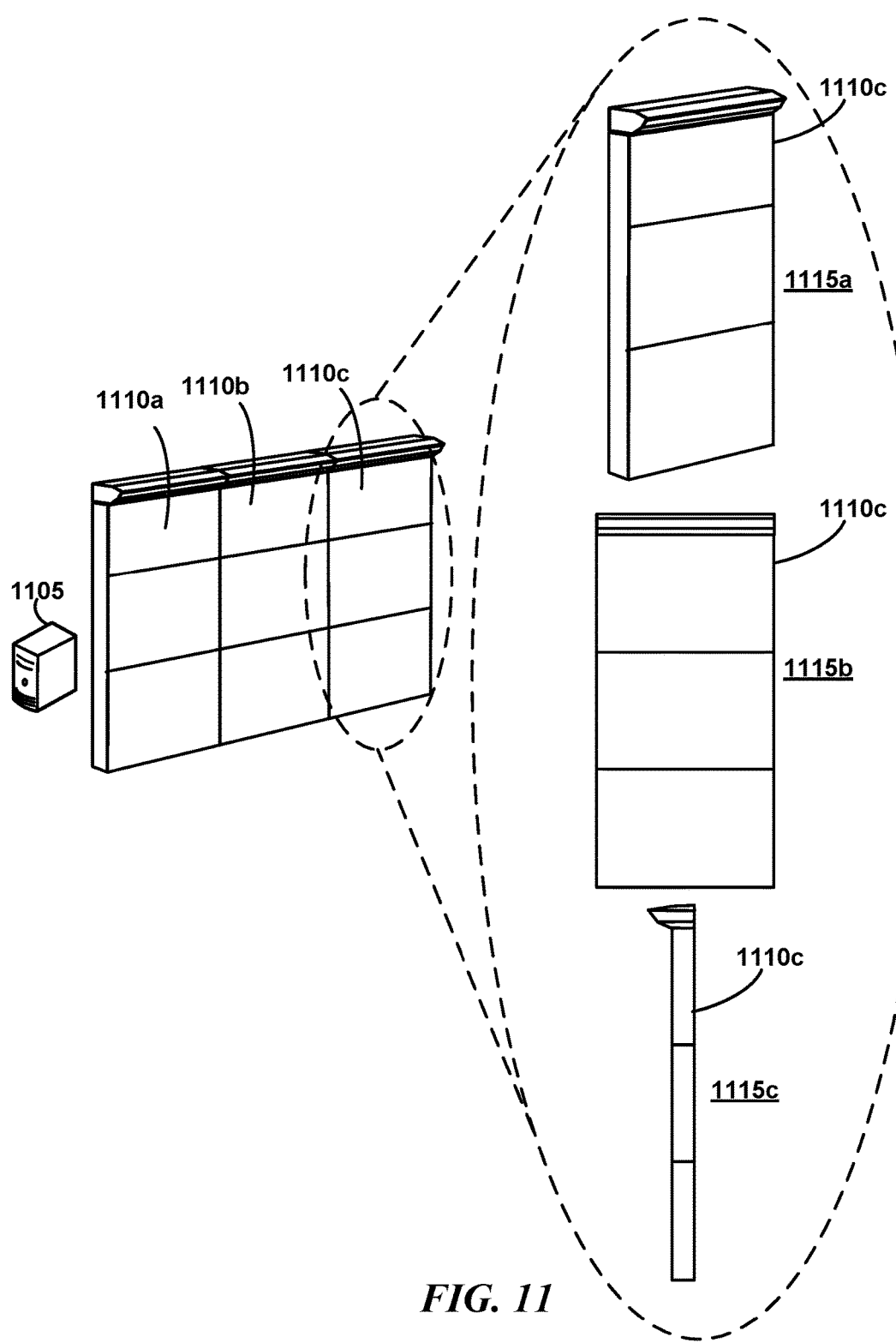
FIG. 11 is a schematic diagram of the composite display with a multi-angled depth sensor housing of FIG. 10, including a turnaround of a modular component in the system as may be implemented in some embodiments.

FIG. 11 is a schematic diagram of the composite display with a multi-angled depth sensor housing of FIG. 10, including a turnaround of a modular component 1110*c* in the system as may be implemented in some embodiments. Particularly, the modular component 1110*c* is shown from perspective 1115*a*, front-on 1115*b*, and side 1115*c* views. A computer system 1105 may be used to control the displays and process data for all the components 1110*a-c* or only a single component, e.g., component 1110*c*.

Figure 12A:
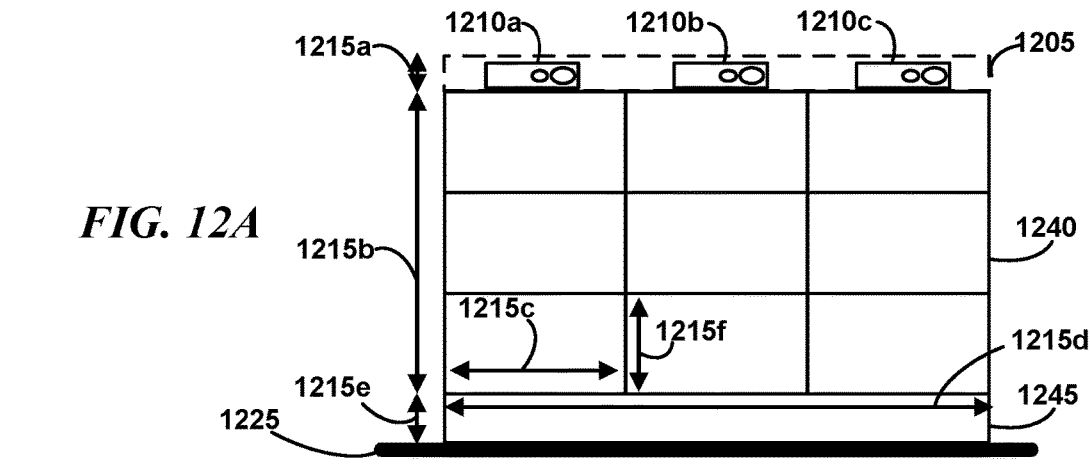
FIG. 12A is a head-on schematic view of the composite display with a multi-angled depth sensor housing of FIG. 10 as may be implemented in some embodiments.
Figure 12B:
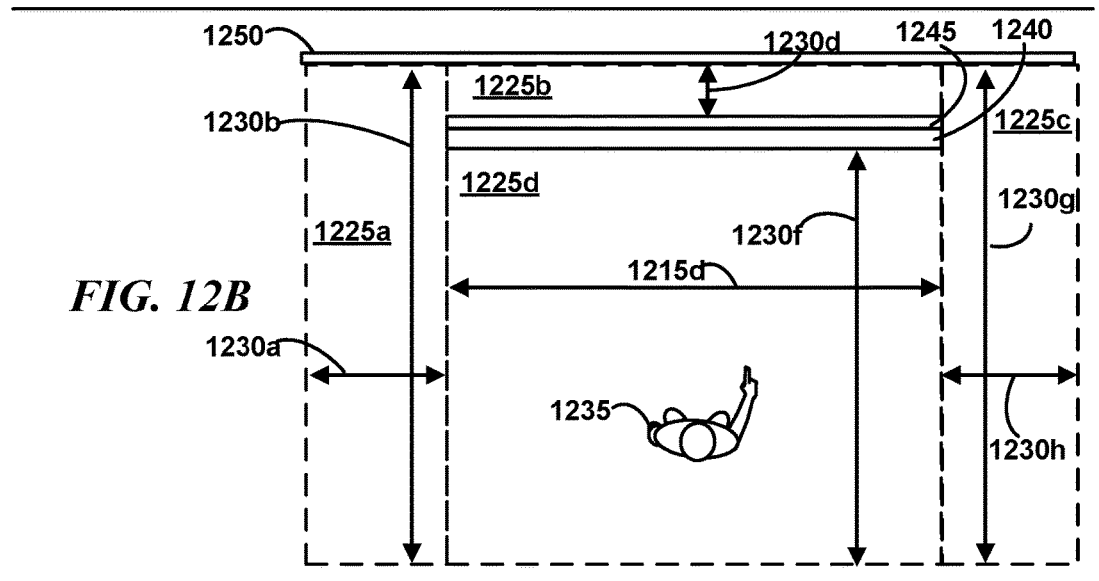
FIG. 12B is a top-down schematic view of the composite display with a multi-angled depth sensor housing of FIG. 10 as may be implemented in some embodiments.
Figure 12C:
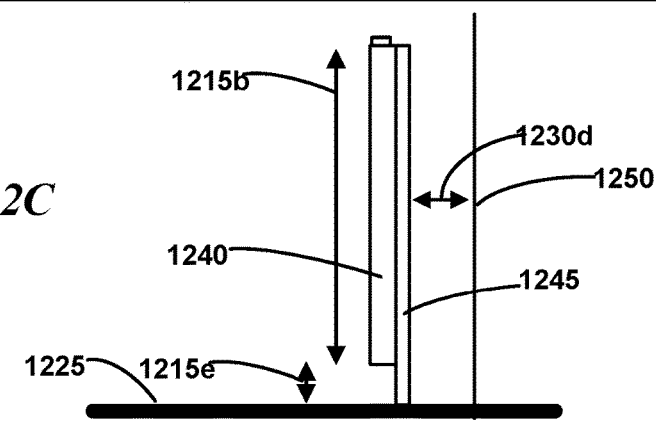
FIG. 12C is a side schematic view of the composite display with a multi-angled depth sensor housing of FIG. 10 as may be implemented in some embodiments.

FIGS. 12A-C provide greater detail regarding the specific dimensions of a particular example composite display. Particularly, FIG. 12A is a head-on schematic view of the composite display with a multi-angled depth sensor housing of FIG. 10 as may be implemented in some embodiments. In this example the modules are arranged to create a grid of displays 1240 together having a composite width 1215*d* of approximately 365 centimeters in some embodiments and height 1215*b* of approximately 205 centimeters in some embodiments. In some embodiments, the depth sensor housing height 1215*a* may be approximately 127 mm. The individual displays may have a width 1215*c* of approximately 122 centimeters in some embodiments and a height 1215*f* of approximately 69 centimeters in some embodiments. In some embodiments, the displays may be HDMI displays with resolutions of 1920×1080 pixels. The displays 1240 may be elevated off the ground 1225 a distance 1215*e* of approximately 10 centimeters in some embodiments via a support structure 1245. Atop the displays 1240 may be a depth sensor housing frame or frames 1205, here shown transparently to reveal one or more of depth sensors 1210*a-c*.

FIG. 12B is a top-down schematic view of the composite display with a multi-angled depth sensor housing of FIG. 10 as may be implemented in some embodiments. Note that the depth sensors and housing are no longer shown to facilitate understanding. Within the region 1225*d* the depth sensors may be able to collect depth data. Accordingly, a user 1235 would stand within this region when interacting with the system. The region may have a distance 1230*f* of approximately 300 centimeters in some embodiments in front of the display 1240 and be approximately the width 1215*d* of the display. In this embodiment, side regions 1225*a* and 1225*c* may be excluded from the interaction. For example, the user may be informed to avoid attempting to interact within these regions, as they comprise less optimal relative angles to depth sensors distributed across the system (in some embodiments, these regions may simply originate too much noise to be reliable). The installing technician may mark or cordon off the areas accordingly. These regions 1225*a* and 1225*c* may include a length 1230*b*, 1230*g* from a wall 1250 of approximately 350 centimeters in some embodiments and a distance 1230*a*, 1230*h* from the active region 1225*d* of approximately 100 centimeters in some embodiments. A region 1225*b* may be provided between the support structure 1245 and a wall support structure 1250 or other barrier, to facilitate room for one or more computing systems. Here, a distance 1230*d* of approximately 40 centimeters in some embodiments may be used and a length 1215*d* reserved for this computing system space. In some embodiments, the support structure 1245 may extend throughout the region 1225*b* and the computer system may rest on or within it.

FIG. 12C is a side schematic view of the composite display with a multi-angled depth sensor housing of FIG. 10 as may be implemented in some embodiments.

One will appreciate that the example dimensions provided above are merely used in connection with this specific example to help the user appreciate a specific embodiment. Accordingly, the dimensions may readily be varied to achieve substantially the same purpose.

Example Depth Sensor Frame for Modular Systems— Bracket-Mounted

The housing frame used to protect the depth sensors may take a variety of forms in different embodiments. FIG. 13A is an exploded, schematic view of components in the frame of a multi-angled depth sensor housing frame, as may be implemented in some embodiments. FIG. 13B is an assembled schematic view of components in the frame of a multi-angled depth sensor housing, as may be implemented in some embodiments.

The frame may comprise an upper cover 1310, a back cover 1315, a bottom panel 1340, and two sensor view panels 1355*a* and 1355*b* (illustrated in FIG. 13B, but not FIG. 13A, for visual economy). View panels 1355*a* and 1355*b* may be screwed into place (e.g., screwed into one or more of bracket spacers 1305*a-f* with, e.g., a washer securing the screw on the opposing side), clamped, or otherwise mechanically coupled to the housing, and may also be held in place by angled portions 1335 and 1340*a*. The upper cover 1310 may have a length 1360*b* of approximately 1214 mm in some embodiments, and a width 1360*a* of approximately 178 mm in some embodiments. In some embodiments, the height 1360*c* may be approximately 127 mm.

End panels 1305a and 1305f may be constructed in anticipation of the desired angles for upper cover 1310, a back cover 1315, and two sensor view panels 1355a and 1355b. Particularly, the angle 1370a may be approximately 25° in some embodiments, the angle 1370b may be approximately 35° in some embodiments, and the angle 1370c may be approximately 30° in some embodiments. To clarify, the upper cover 1310 and bottom panel 1340 are substantially parallel in the depicted embodiment. Accordingly, in this example, the angles between the top panel 1310 and back panel 1315 may be approximately 90°. Similarly, the angles between bottom panel 1340 and back panel 1315 may be approximately 90°. Not only may these angles present a more aesthetically pleasing design, but by conforming to the spacer dimensions, they may facilitate improved structural integrity of the housing as a whole.

The length 1375a may be approximately 97 mm in some embodiments, the length 1375b may be approximately 89 mm in some embodiments, the length 1375c of the cover ridge 1335 may be approximately 6 mm in some embodiments, the length 1375d of sensor view panel 1355a may be approximately 56 mm in some embodiments, and the length 1375e of sensor view panel 1355b may be approximately 54 mm in some embodiments, and the length 1375f may be approximately 10 mm in some embodiments.

Upper cover 1310, may include a portion 1325 substantially parallel with the bottom panel portion 1340, an angled portion 1330, and an angled retaining portion angled portion 1335 for retaining upper sensor view panel 1355a.

Back panel 1315 may include four cut-out grooves or insets 1320a, 1320b, 1320c, and 1320d. As discussed herein, these grooves may be present in some embodiments to receive the spacers 1305b-e, thereby ensuring their being fixed in a desired location within the housing. One will appreciate that the number of grooves may or may not be the same as the number of spacers, as it may be desirable to fix only some of the spacers.

Bottom panel 1345 may include an angled front 1340a (tab or fold) and angled rear portion 1340b for retaining, at least in part, the adjacent panels. Bottom panel 1345 may include two cut-out insets 1350a and 1350b on its angled rear portion 1340b. This may result in "raised" portions 1345a, 1345b, and 1345c of the angled rear portion 1340b.

Within the frame may be one or more of spacer brackets 1305a-f (also referred to simply as "spacers" or "brackets"). While spacers 1305a and 1305f may serve as end panels, spacers 1305b-e may be entirely or substantially within the housing frame. Spacer brackets 1305a-f need not be of the same dimensions. For example, brace bracket 1305d may have a shorter length than spacer brackets 1305b, c, e. As discussed below, spacer brackets 1305a-c, e, and f may be used to ensure the structural integrity of the housing even when, e.g., a load is placed on top of portion 1325. Brace bracket 1305d, being shorter, provides space for mounting a sensor pair, but may also contribute to the housing's structural integrity. In some embodiments, the brace bracket 1305d may be secured by screws to the bottom panel 1340 and upper cover 1310.

FIG. 14A is a view of a spacer component of FIG. 13A, e.g., component 1305a or 1305e, as may be implemented in some embodiments, from two perspectives 1405a and 1405b. The perspective 1405a is rotated substantially 90° relative to the perspective 1405b, thereby presenting a concave portion formed by the extensions 1425a-f. The extensions 1425a-f may themselves be separated by spaces 1410a-f. FIG. 14B is a view of the mirrored spacer component of FIG. 13A, e.g., component 1305b or 1305f, as may be implemented in some embodiments, from two perspectives 1420a and 1420b. The perspective 1420b is rotated substantially 90° relative to the perspective 1420a, thereby presenting a concave portion formed by the extensions 1430a-f. The extensions 1430a-f may themselves be separated by spaces 1415a-f.

Figure 15:
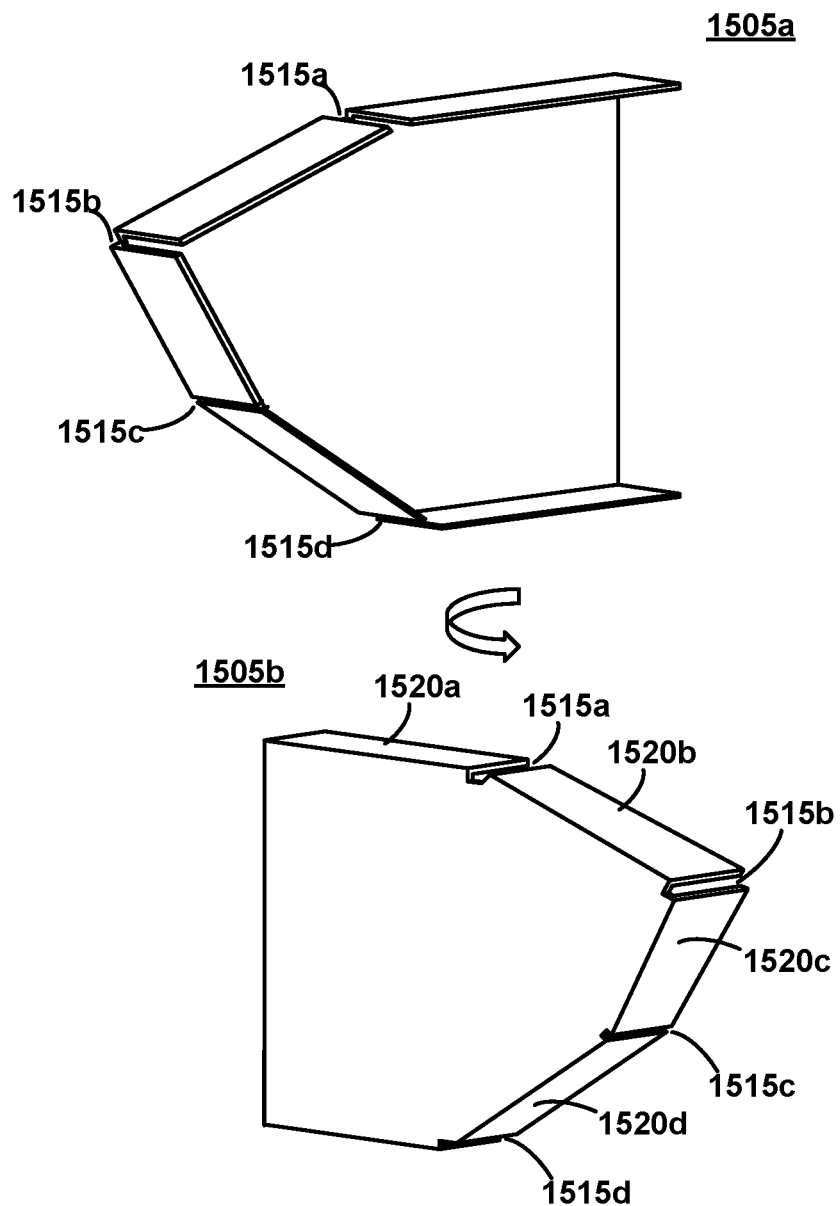
FIG. 15 is a view of the brace bracket component of FIG. 13A as may be implemented in some embodiments, from two perspectives.

FIG. 15 is a view of the brace bracket component of FIG. 13A, e.g., component 1305d, as may be implemented in some embodiments, from two perspectives 1505a and 1505b. The perspective 1505a is rotated substantially 90° relative to the perspective 1505b, thereby presenting a concave portion formed by the extensions 1520a-e. The extensions 1520a-e may themselves be separated by spaces 1515a-d.

Figure 16:
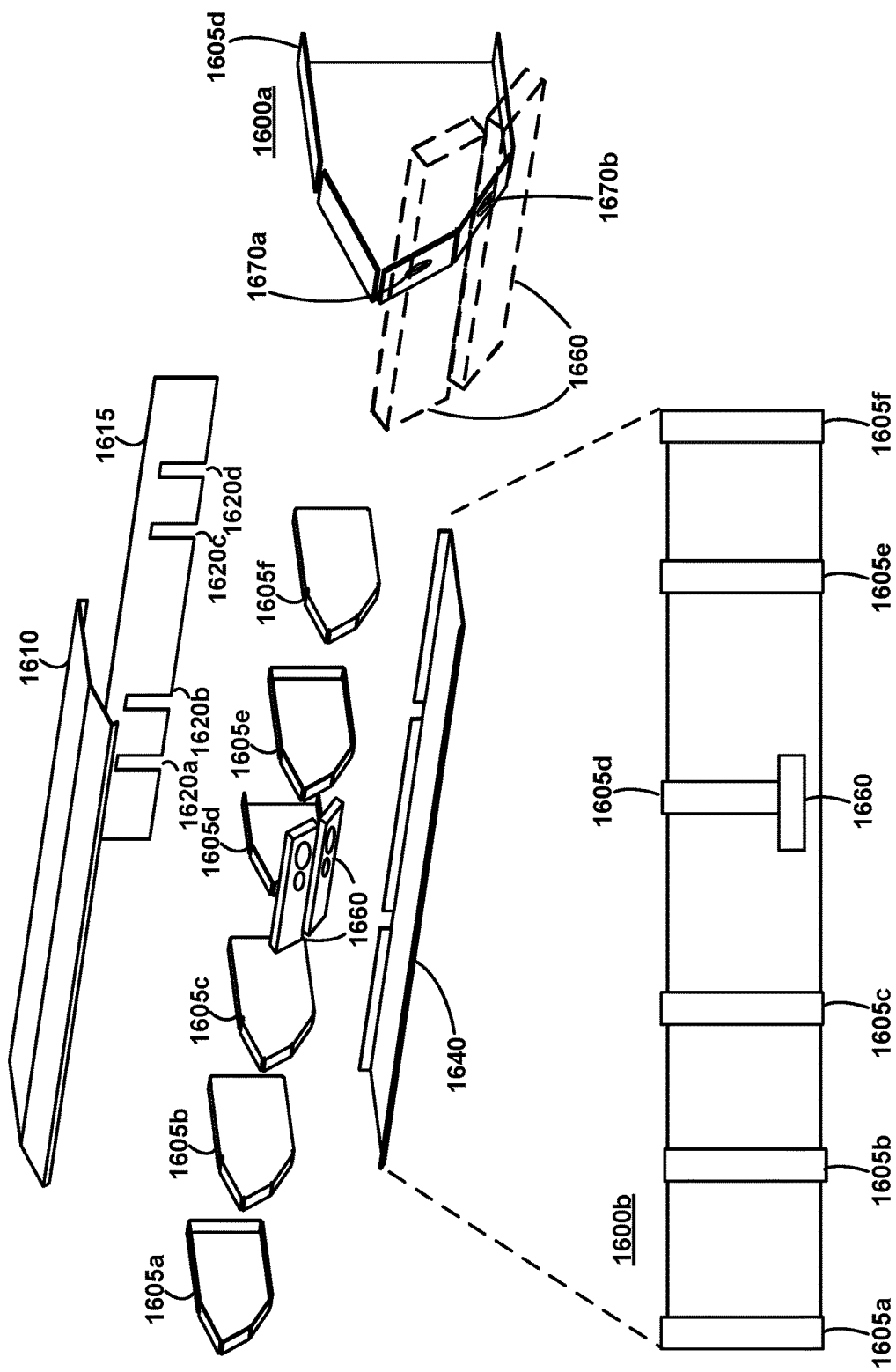
FIG. 16 is an exploded, schematic view of components in the frame of a multi-angled depth sensor housing, including a sensor-pair-receiving brace bracket spacer, as may be implemented in some embodiments.

FIG. 16 is an exploded, schematic view of components in the frame of a multi-angled depth sensor housing, including a sensor-pair-receiving brace bracket spacer, as may be implemented in some embodiments. Again, though a specific number of spacers are shown in the image to facilitate understanding, one will appreciate that in different embodiments there may be more or fewer spacers present than those depicted here. As discussed above, the housing may comprise an upper panel 1610, back panel 1615, and bottom panel 1640 (the sensor view panels are not shown for visual economy). While spacers 1605a,b,c,e and f provide structural support to the housing, the brace spacer bracket 1605d may be shorter and recessed relative to the other spacers 1605a,b,c,e and f so as to accommodate a coupling to a pair of depth sensors 1660. In this example, the brace spacer bracket 1605d, shown in isolated view 1600a has two holes 1670a,b for receiving a screw, nail, bolt, or other device for affixing the depth sensors 1660 to the brace spacer bracket 1605d. For example, the depth sensors 1660 may themselves include mounting holes through which a screw may be passed to fix the sensor in place (e.g., as is the case for some versions of the RealSense™ depth sensor system).

In some embodiments, while spacers 1605a and 1605f are affixed to each end of the housing, the spacers 1605b-e may move freely within the housing. In this manner, it may be possible for an installation technician to configure the system to the particular circumstances of the system's environment and planned usage. In some embodiments, however, the grooves 1620a-d may receive each of spacer brackets 1605b-e, thereby ensuring their placement in a specific location within the housing. This predetermined positioning may be useful, e.g., when the housing is shipped as one housing in a collection of housings to be installed as part of a composite installation. In some embodiments, the grooves may accommodate only a specific spacer, thereby forcing the technician to install a specific configuration. In some embodiments, however, e.g., as shown here, each groove may be able to receive any one of the four spacers. In these embodiments, the technician may thereby have the freedom to select at which of the four positions the depth sensors are best situated so as to achieve their task. Thus, in the schematic top down view 1600b shown here, the spacer 1605d and affixed sensor pair 1660 may be located at a position offset from the center of the housing.

Figure 17:
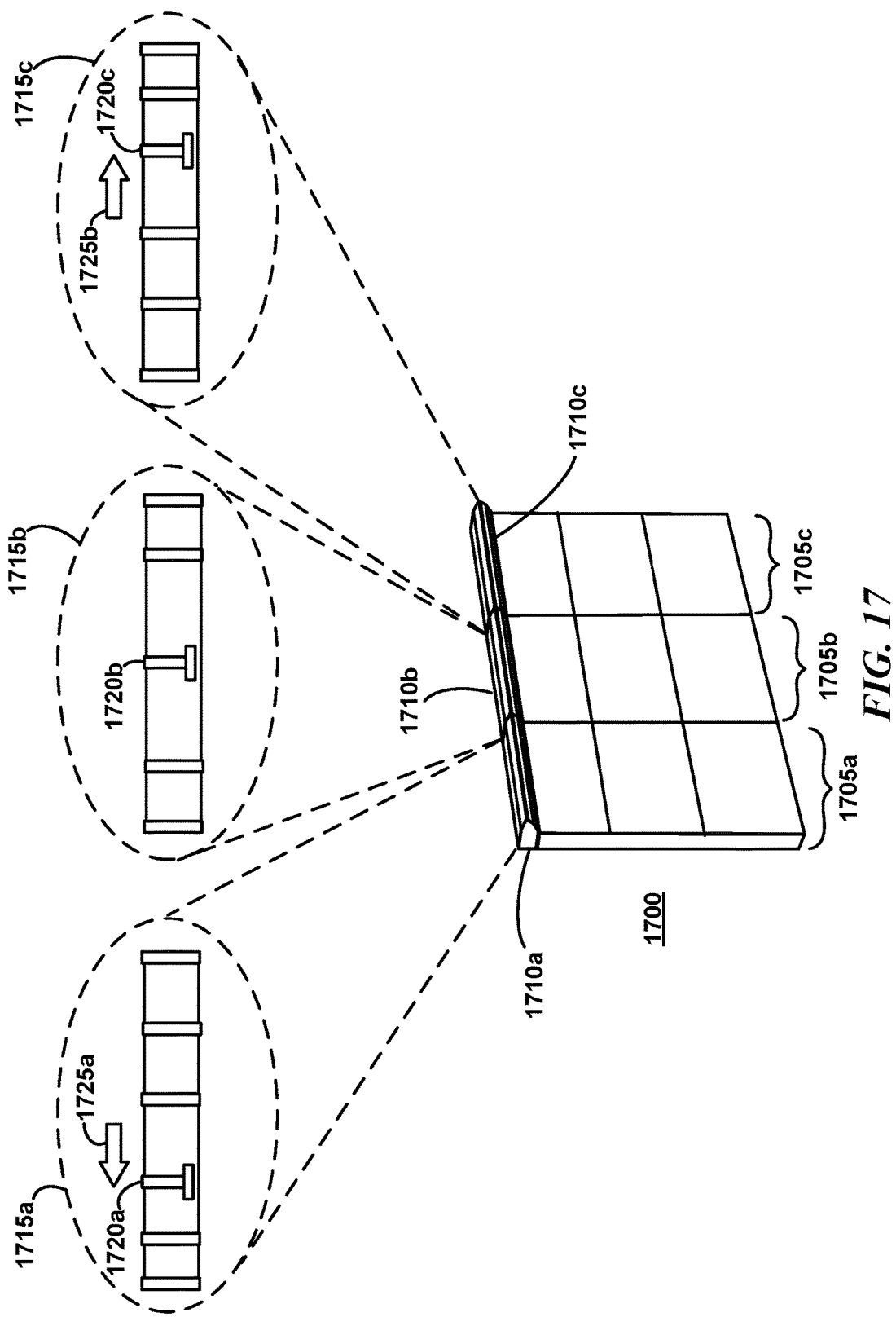
FIG. 17 is a schematic view of a possible sensor-placement configuration in the multi-angled depth sensor housings of an example user interface, as may be implemented in some embodiments.

To further clarify the possible motivations for the spacer placement discussed with reference to FIG. 16, FIG. 17 is a schematic view of a possible sensor-placement configuration in the multi-angled depth sensor housings of an example user interface, as may be implemented in some embodiments. Particularly, the user interface 1700 includes three units 1705a-c in series. Each unit may include three vertically adjacent displays and a corresponding sensor housing 1710a-c. Within each sensor housing 1710a-c, the spacer positions may be configured in anticipation of the housing's depth sensors' roles in the user interface as a whole. For example, the position of the sensor pairs may vary slightly between each module as the optical spacing of the depth sensors is different from the spacing each of the display screens.

Thus, as shown in the schematic, top-down, cut-away view 1715b for the center sensor housing 1710b, the shortened brace bracket 1720b and corresponding depth sensor pair may be positioned in the center of the housing 1710b. In contrast, as shown in the schematic, top-down, cut-away view 1715c for the right sensor housing 1710c, the shortened brace bracket 1720c and corresponding depth sensor pair may be positioned at an offset 1725b relative to the center of the housing 1710c. Similarly, as shown in the schematic, top-down, cut-away view 1715a for the left sensor housing 1710a, the shortened brace bracket 1720a and corresponding depth sensor pair may be positioned at an offset 1725a relative to the center of the housing 1710a.

Example Depth Sensor Frame for Modular Systems—Alternative Bracket Mount

Figure 18:
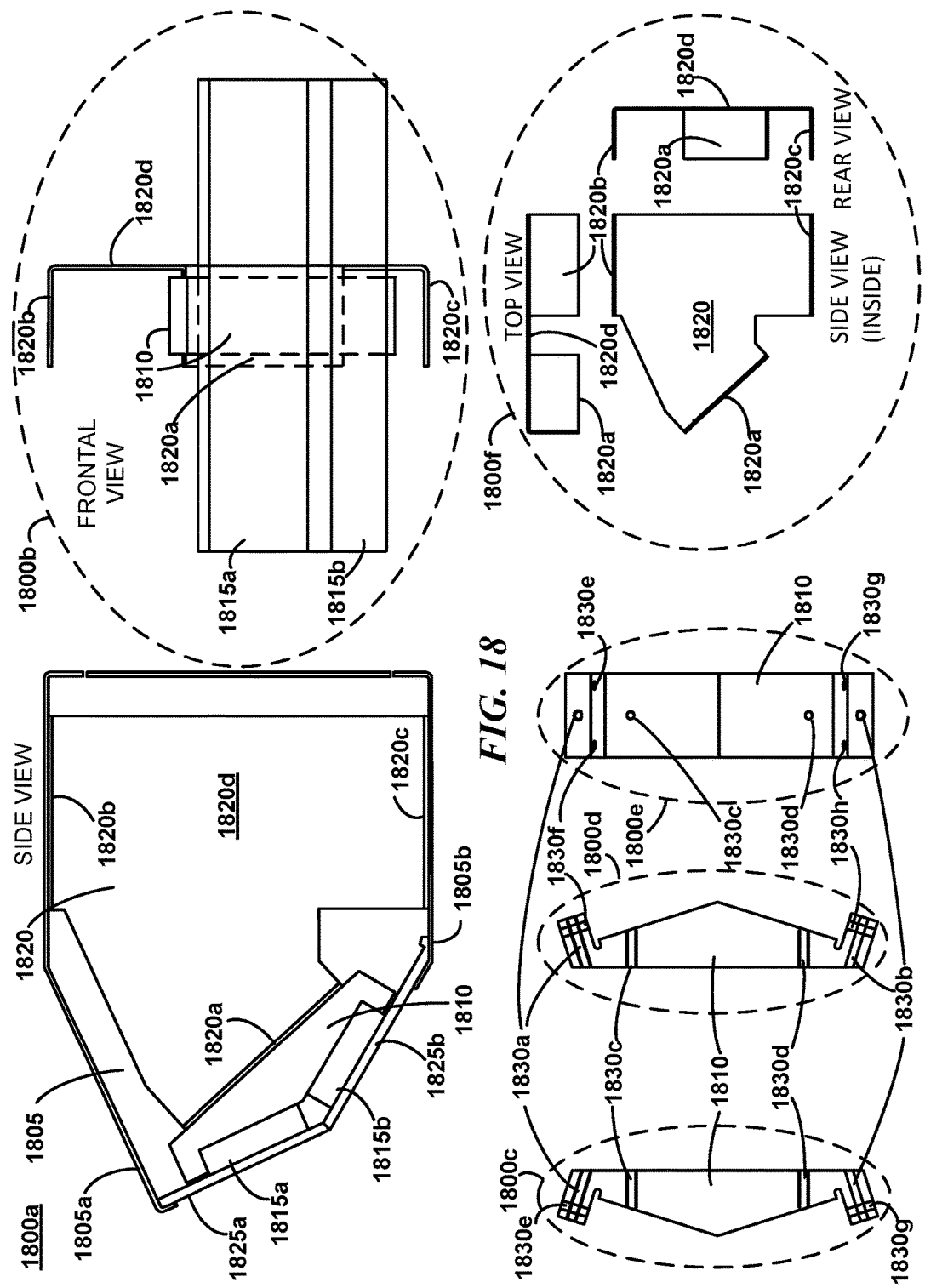
FIG. 18 is a plurality of schematic views of an alternative bracket mounting component as may be used in some embodiments.

FIG. 18 is a plurality of schematic views of an alternative bracket mounting component as may be used in some embodiments. Some sensor systems, e.g., the RealSense™ 300 may have mounting points better accommodated by certain form factors. The bracket mounting component of FIG. 18 may better facilitate the mounting of such systems.

Particularly, as shown in side view 1800a, a spacer bracket 1805 may include a plurality of extensions. These extensions may include the extension 1805a having a lip for retaining, at least in part, the upper viewing panel 1825a and the extension 1805b including a lip for retaining, at least in part, the lower viewing panel 1825b. As discussed, these extensions may form an enclosure. Within this enclosure may be placed a bracing support 1820. The bracing support may include a flat, planar side 1820d adjacent to, or forming a portion of, the surface of the spacer bracket 1805. A top planar portion 1820b and a lower planar portion 1820c extending from the planar side 1820d may be used to secure the bracing support 1820 within the bracket spacer 1805. Frontal view 1800b (i.e., the perspective of one standing in front of the depth sensors 1815a and 1815b) removes the spacer bracket 1805 and viewing panels 1825a,b shown in side view 1800a and shows the bracing support 1820 from a "frontal view". Accordingly, it may be easier for the reader to discern the top planar portion 1820b and the lower planar portion 1820c extended from the planar side 1820d of bracing support 1820 in the view 1800b.

The top planar portion 1820b and a lower planar portion 1820c may be used to secure the bracing support 1820 in a variety of manners. For example, a screw may pass through the extension 1805a and top planar portion 1820b, though friction alone may suffice in some embodiments.

The bracing support 1820 may also include an extended planar surface 1820a. The extended planar surface 1820a may be used to couple bracing support 1820 with a sensor mount 1810. The views 1800f of the bracing support 1820 remove the other components (spacer bracket 1805, sensor mount 1810, viewing panels 1825a,b). Accordingly surface 1820a may be more readily discernible in this view (the dashed lines in the of 1800b indicate that, from the front, portions of the surface 1820a and sensor mount 1810 may be occluded by the sensors 1815a,b).

The sensor mount 1810 may provide a stable fixture for receiving the depth sensor systems s 1815a and 1815b. View 1800c provides a view from the right side of the sensor mount 1810 ("right" when looking at the portion of the sensor mount 1810 receiving the depth sensor systems 1815a and 1815b). View 1800d provides a view from the left side of the sensor mount 1810. View 1800e provides a view from the front of the sensor mount 1810. The sensor mount 1810 may include a plurality of holes for receiving screws or other fixation devices, to join the viewing panels 1825a,b, depth sensor systems 1815a and 1815b, sensor mount 1810, and bracing support 1820 into a composite structure.

Particularly, the depicted example has eight holes for securing the composite structure. Bracket holes 1830c and 1830d may be used to secure the sensor mount 1810 to the bracing support 1820 via surface 1820a. Viewing panel hole 1830a may be used to secure the upper viewing panel 1825a to the sensor mount 1810, and viewing panel hole 1830b may be used to secure the lower viewing panel 1825b to the sensor mount 1810. Sensor holes 1830f and 1830e may be used to secure the upper depth sensor system 1815a to the sensor mount 1810. Similarly, sensor holes 1830h and 1830g may be used to secure the lower depth sensor system 1815b to the sensor mount 1810.

Figure 19A:
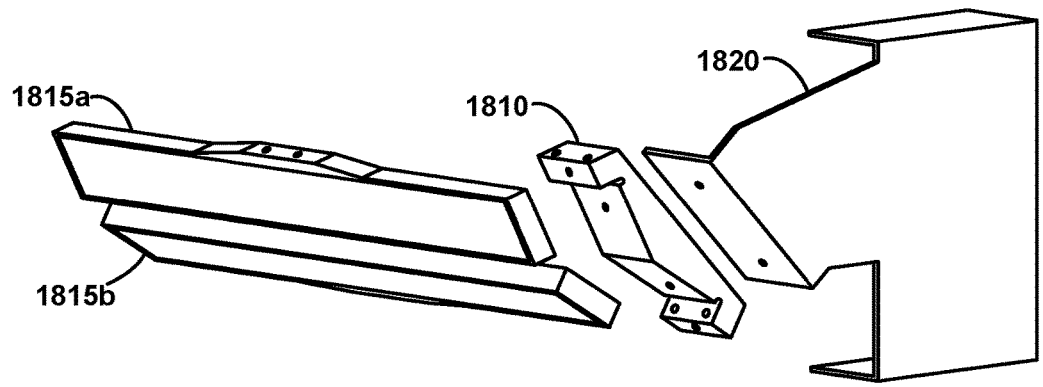
FIG. 19A is a perspective schematic view of portions of the alternative bracket mounting component of FIG. 18 in an exploded, unassembled state, as may be implemented in some embodiments.
Figure 19B:
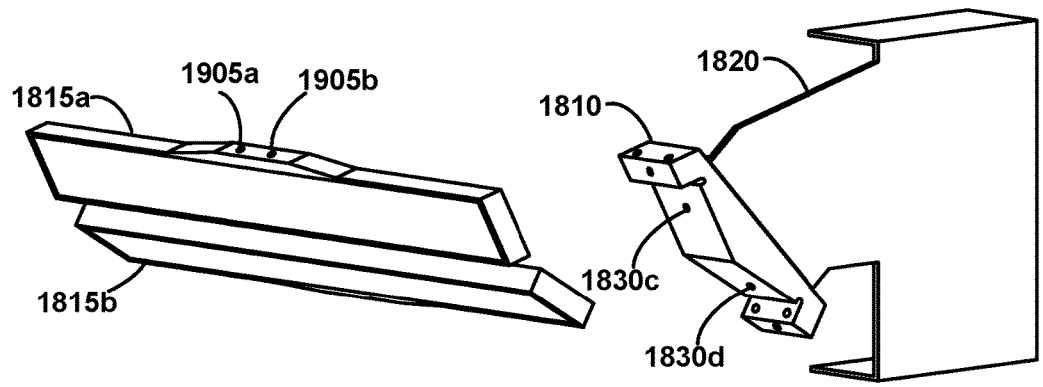
FIG. 19B is a perspective schematic view of portions of the alternative bracket mounting component of FIG. 18 wherein the bracing support is coupled with the sensor mount, as may be implemented in some embodiments.
Figure 19C:
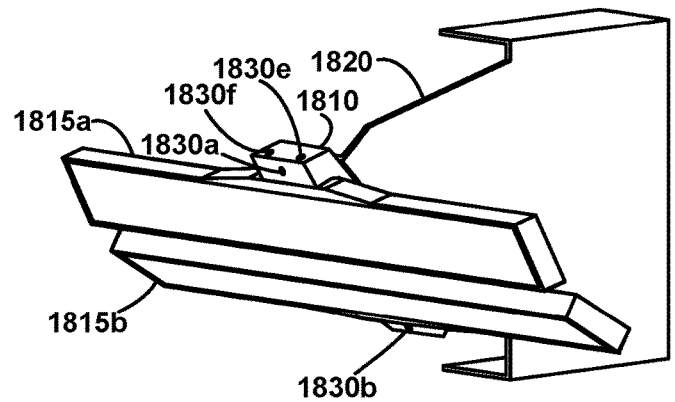
FIG. 19C is a perspective schematic view of portions of the alternative bracket mounting component of FIG. 18 wherein the bracing support and sensor mount are coupled with example depth sensors, as may be implemented in some embodiments.

FIG. 19A is a perspective schematic view of portions of the alternative bracket mounting component of FIG. 18 in an exploded, unassembled state, as may be implemented in some embodiments. In the unassembled state, the sensor mount 1810, the bracing support 1820, and depth sensor systems 1815a and 1815b may be unconnected. FIG. 19B illustrates how the sensor mount 1810 and the bracing support 1820 may be coupled by inserting screws, pins, or other coupling mechanisms via holes 1830c and 1830d. FIG. 19C is a perspective schematic view of the sensor mount 1810, the bracing support 1820, and depth sensor systems 1815a and 1815b all coupled together. As indicated, screws, pins, or other coupling mechanisms may be inserted through holes 1830f and 1830e to enter the securing mechanisms 1905a and 1905b respectively of the depth sensor system 1815a (though not visible in the diagram one will appreciate that screws, pins, or other coupling mechanisms may similarly be inserted through holes 1830h and 1830g visible in FIG. 18, though not identified in FIG. 19C) into the securing mechanisms of the sensor system 1815b). The upper viewing panel 1825a may then be secured by passing a screw, pin, or other coupling mechanism through upper viewing panel 1825a and into hole 1830a. Similarly, the lower viewing panel 1825b may then be secured by passing a screw, pin, or other coupling mechanism through viewing panel 1825b and into hole 1830b. Friction or grooves may be used, e.g., to ensure a secure fit in each of holes 1830a-h for the respective screw, pin, or other coupling mechanism.

Example Depth Sensor Frame for Modular Systems—"Standalone" Mounting

Rather than affix one or more depth sensor pairs to one or more brace brackets as described above, various of the embodiments may affix depth sensor pairs to the housing directly, or to fixed mounting structures within the housing. For example, FIG. 20A is a "see-through" view of a housing frame 2005 of a multi-angled depth sensor housing comprising depth sensors attached via "standalone mounts", rather than brackets, as may be implemented in some embodiments. Particularly, within the frame 2005 may be placed one or more paired sensor arrangements 2010a and 2010b. In this example, the depth sensors again resemble the form factor of the RealSense™ depth sensor system, though one will readily appreciate variations employing other depth sensors. As indicated by ellipses 2015, more than the two illustrated sensor mounts may be present and the mounts may be arranged in a substantially linear arrangement.

The mounts themselves may generally comprise two sensors at different angles and a mounting bracket. For example, FIG. 20B is a schematic view of a horizontal sensor mount as may be implemented in some embodiments. A top depth sensor system 2020 may be mounted above and at an angle relative to depth sensor system 2030. Each sensor may (as in the example of the RealSense™ depth sensor system) include, e.g., an infrared emitter 2020c, an infrared receiver 2020b (e.g., some embodiments may operate in approximately the 850 nm range), and a connection 2020a (e.g., an USB connection, FireWire™ connection, wireless BlueTooth™ connection, etc.) to a computer system managing a modular unit or the display system as a whole. Some depth sensors additional include an RGB sensor, as discussed in greater detail below, though, as illustrated here, that need not be the case in all embodiments. For a horizontal mount, an extension 2025b may attach the mount 2025a to the frame housing or to the scaffold supporting the display system. FIG. 20C is a schematic view of a vertical sensor mount as may be implemented in some embodiments. For a horizontal mount, an extension 2030b may attach the mount 2030a to the frame housing or to the scaffold supporting the display system. Screw holes for receiving either the extension 2025b or the extension 2030b may be provided in the same mount in some embodiments to permit the installation technician flexibility in their construction.

Figure 25A:
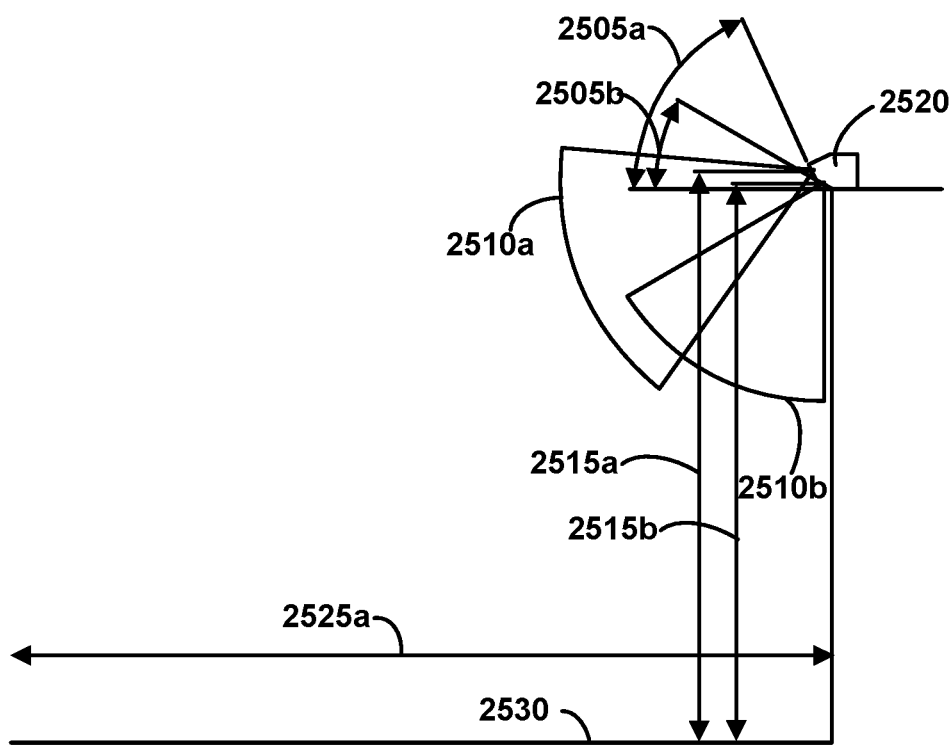
FIG. 25A is a side view of various dimensions for an example interaction system with a multi-angled depth sensor housing, as may be implemented in some embodiments.
Figure 25B:
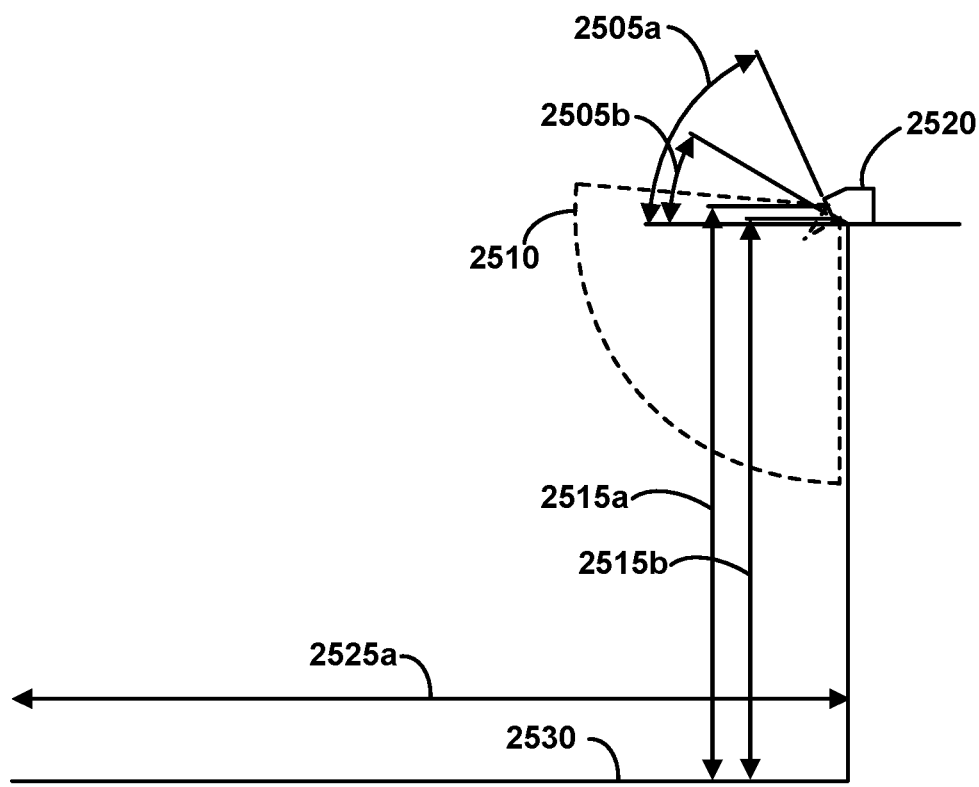
FIG. 25B is a schematic side view of the combined viewing angles for the system of FIG. 25A.

FIG. 20D is a schematic view of a the varied depth region fields of view achieved using a sensor mount of FIG. 20B or FIG. 20C as may occur in some embodiments. Though shown here as non-overlapping to facilitate understanding, one will appreciate that in some embodiments, e.g., as shown in FIGS. 25A and 25B, the fields of view for each sensor in a sensor pair may overlap substantially (this may be true for any of the disclosed mount types, including, e.g., bracket mounts, stand-alone mounts, etc.). Particularly, given depth sensors 2050a and 2050b, the angles precipitated by installation using the mounts of FIGS. 20B or 20C may result in corresponding fields of view 2055a and 2055b relative to floor 2040.

Figure 21A:
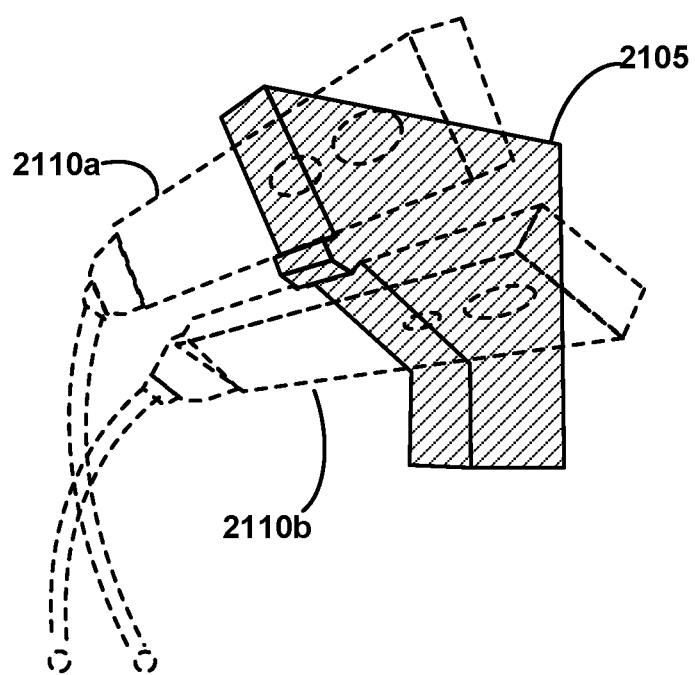
FIG. 21A is a schematic view of an example multi-angled standalone depth sensor mount with transparent depth sensor representations in their relative positions, as may be implemented in some embodiments.
Figure 21B:
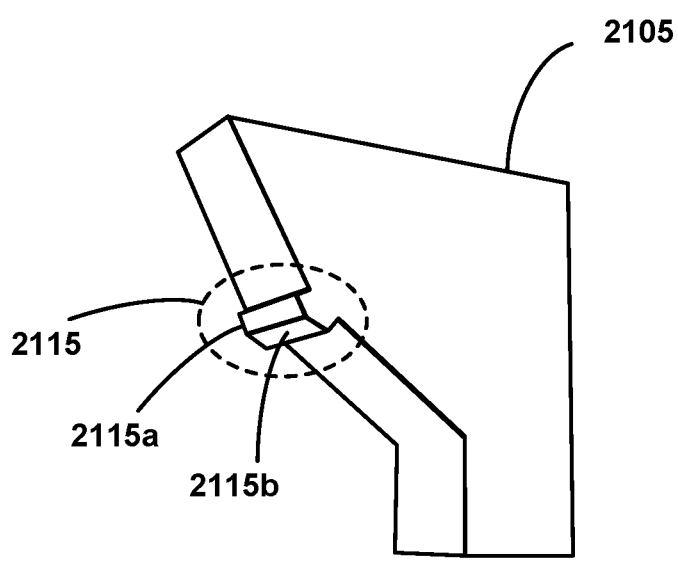
FIG. 21B is a schematic view of a multi-angled depth sensor mount without depth sensors, as may be implemented in some embodiments.

FIG. 21A is a schematic view of an example multi-angled standalone depth sensor mount 2105 with transparent depth sensor representations 2110a, 2110b in their relative positions, as may be implemented in some embodiments. FIG. 21B is a schematic view of a multi-angled depth sensor mount 2105 of FIG. 21A without depth sensors, as may be implemented in some embodiments. As illustrated, the mount 2105 may include a retaining extension 2115 including angled portions 2115a and 2115b configured to receive and retain the depth sensors 2110a, 2110b. However, as discussed herein, various embodiments may use screws, clamps, or other fixation devices to couple the sensors with the mount, in lieu of, or in addition to, a retaining extension 2115.

Figure 22:
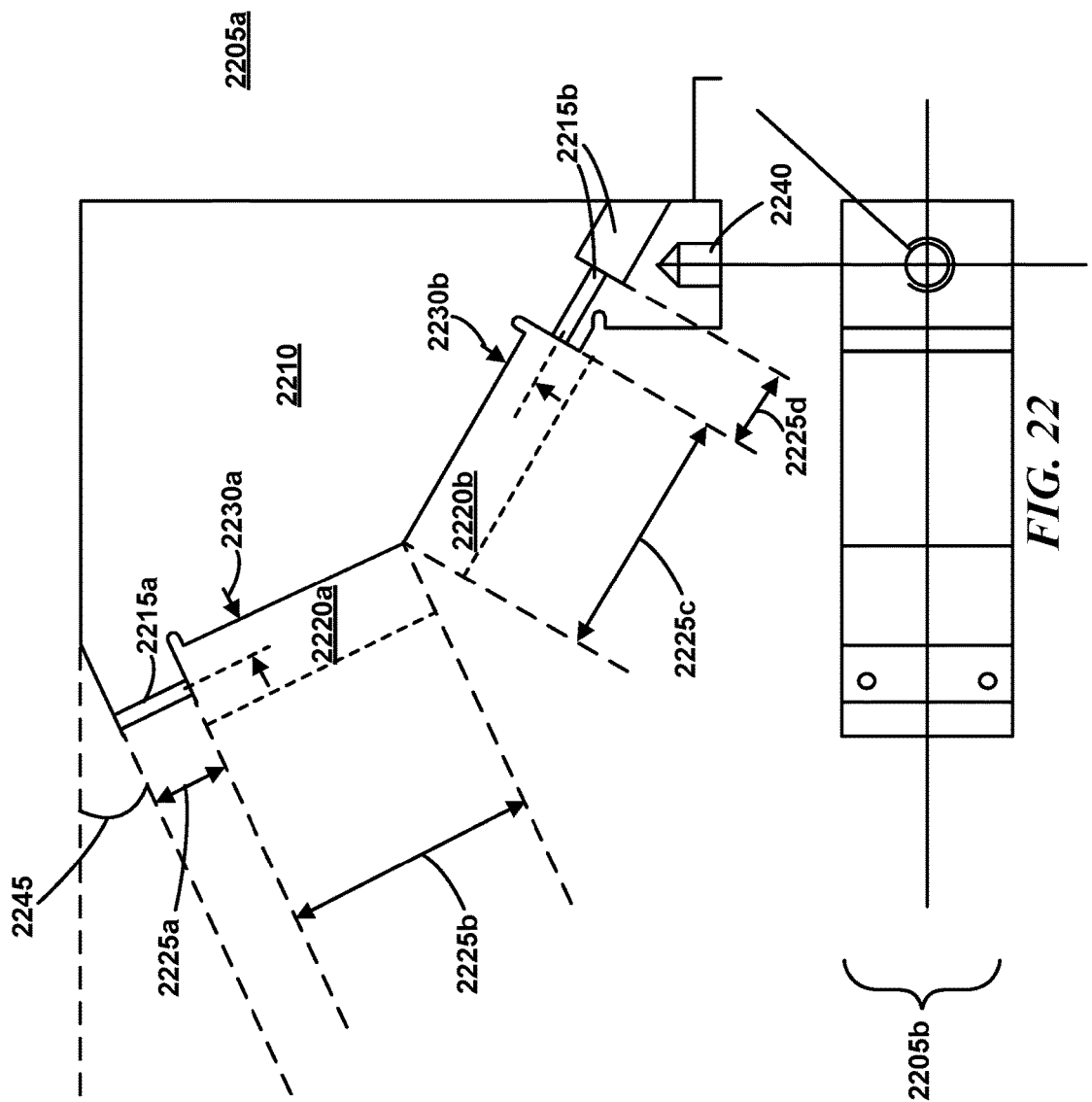
FIG. 22 is a schematic side view of various dimensions of an example multi-angled standalone depth sensor mount, as may be implemented in some embodiments.

For example, FIG. 22 is a schematic side view of various dimensions of an example multi-angled standalone depth sensor mount, as may be implemented in some embodiments. Complementing side view 2205a of the mount 2210 is a projected view 2205b upon a plane beneath the mount. As indicated, this mount 2210 may be mounted to the housing via a vertical screw entering receiver 2240 (e.g., passing through the bottom of the housing). The regions 2220a and 2220b indicate where each of the first and second depth sensor systems may reside on the mount (though, as discussed herein, both positions need not be filled in every embodiment). Each sensor system may have a receiver to accept a mounting screw, pinion, or other fixation mechanism. Access pathways 2215a and 2215b permit such fixation mechanisms to enter the receivers and thereby couple the depth sensor systems to the mount 2210. These may enter at positions from the mount corresponding to distance 2230a and 2230b (approximately half the width of the depth sensor system in this embodiment). The distances 2230a and 2230b may be substantially 5 mm in some embodiments. The angle 2245 may be substantially 25° in some embodiments. The lengths 2225a and 2225d may be substantially 12 mm in some embodiments. The lengths 2225b and 2225c may be substantially 38 mm in some embodiments.

Thus, in some embodiment the depth sensor system pairing may be mounted to a standalone mount or coupled with a brace bracket. In some embodiments, the pair may be bolted directly to the housing panels (e.g., without a holder). One will appreciate that various embodiments may use a particular sensor placement mechanism exclusively, or may use combinations of mechanisms within the housing.

Figure 23:
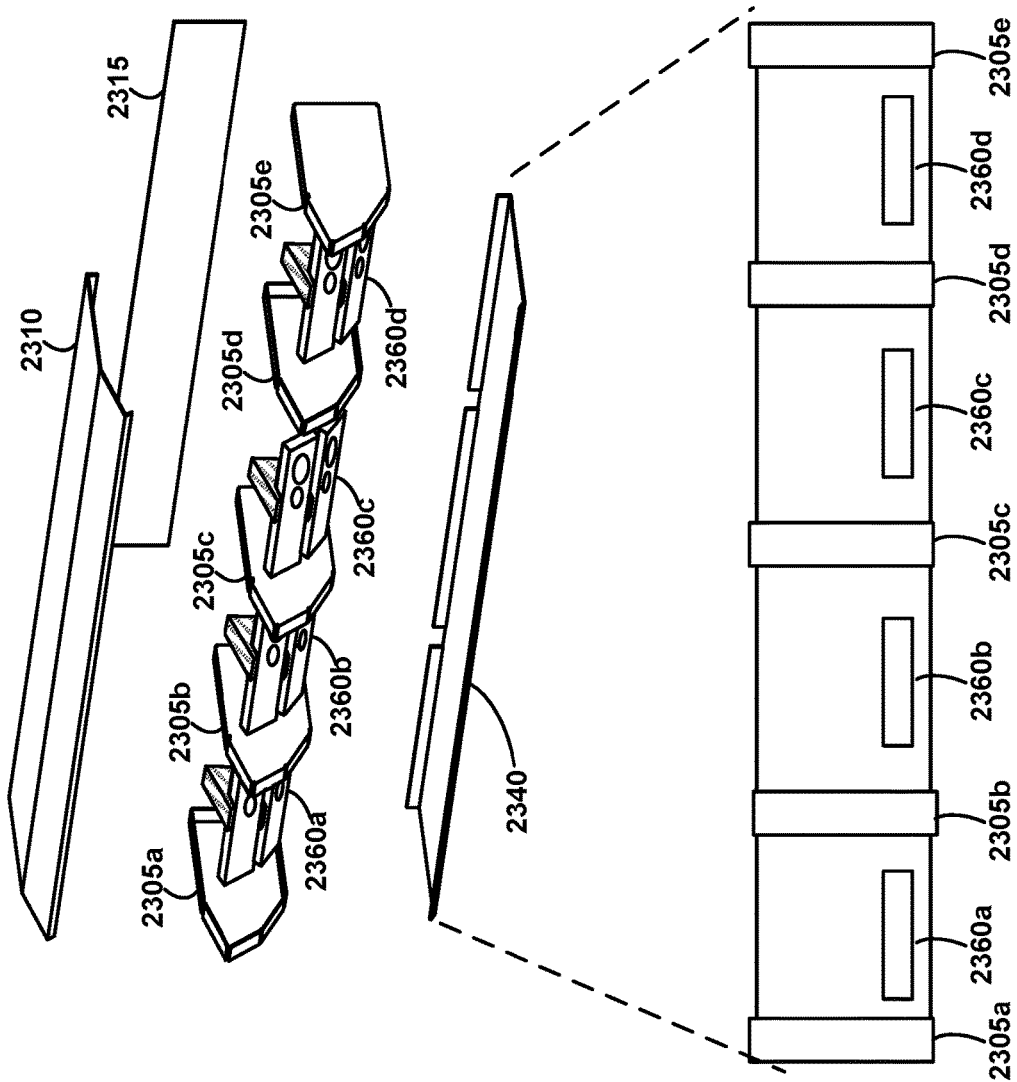
FIG. 23 is an exploded, schematic view of components in the frame of a multi-angled depth sensor housing, including exclusively standalone mounted sensor pairs, as well as schematic top-down cutaway view of the assembled structure, as may be implemented in some embodiments.

For example, FIG. 23 is an exploded, schematic view of components in the frame of a multi-angled depth sensor housing, including exclusively standalone mounted sensor pairs, as well as schematic top-down cutaway view of the assembled structure, as may be implemented in some embodiments. Within the housing formed by upper cover 2310, back panel 2315, bottom panel 2340 and the viewing panels (not shown), may be one or more standalone mounted depth sensor pairs 2360a-e (when standalone brackets are used, grooves 1620a-d may be omitted from the back panel 2315 in some embodiments). The pairs may be separated by zero or more spacers 2305a-e. The number of intervening spacers 2305b-d may be determined based, e.g., upon the materials used for the housing and the desired structural integrity of the housing for the anticipated deployment environment.

Figure 24:
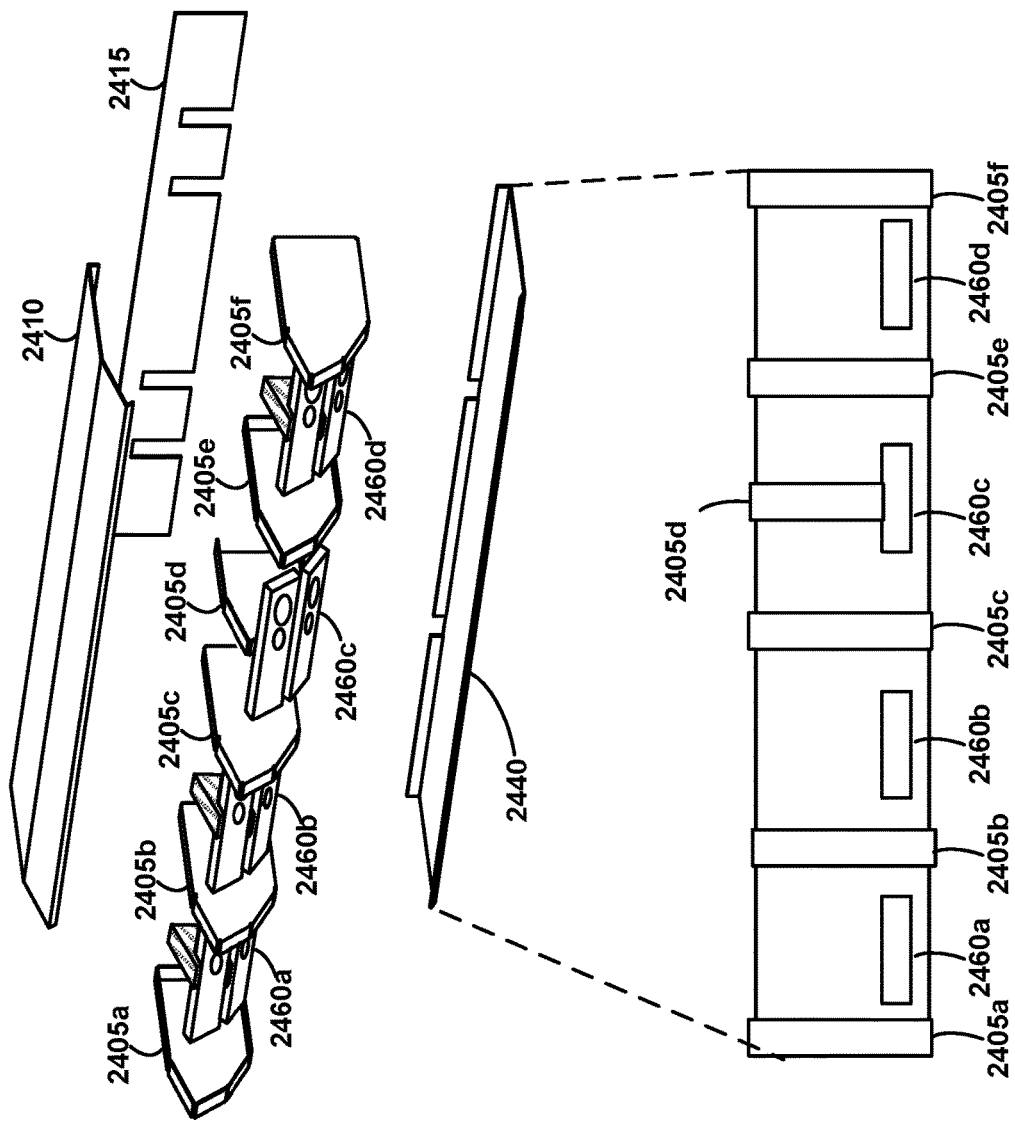
FIG. 24 is an exploded, schematic view of components in the frame of a multi-angled depth sensor housing, including both standalone mounted and bracket-mounted sensor pairs, as well as schematic top-down cutaway view of the assembled structure, as may be implemented in some embodiments.

In contrast to the exclusively standalone mounts of FIG. 23, FIG. 24 is an exploded, schematic view of components in the frame of a multi-angled depth sensor housing, including both standalone mounted and bracket-mounted sensor pairs, as well as schematic top-down cutaway view of the assembled structure, as may be implemented in some embodiments. Again, the housing may comprise back 2415, top 2410, and bottom 2440 panels. Between spacers 2405a-c,e,f may be placed both standalone mounted depth sensor pairs 2460a,b,d and bracket mounted depth sensor pairs 2460c (mounted, e.g., to brace bracket 2405d). In this example, the mounts have all their possible attachment points filled with sensors, however, less than all points may be used in some embodiments. Additionally, there is one mount per interval between spacers. One will appreciate that in some embodiments, more than one mount may be placed in an interval and some intervals may have no mounts. Additionally, though not shown here, one will appreciate that some or all of the depth sensor pairs may be mounted directly to the sensor view panels 1355a and 1355b or to the remainder of the housing.

FIG. 25A is a side view of various dimensions for an example interaction system with a multi-angled depth sensor housing 2520, as may be implemented in some embodiments. FIG. 25B is a schematic side view of the combined viewing angles for the system of FIG. 25A. Note that the depth field results depicted in FIGS. 25A and 25B may be achieved using depth sensor pairings mounted to the housing, standalone mounts, brace brackets, etc. Angle 2505a reflects the angle of the sensor view panel 1355a relative to the floor plane and may be approximately 65° in some embodiments. Angle 2505b reflects the angle of the sensor view panel 1355b relative to the floor plane and may be approximately 30° in some embodiments. The upper sensor within the housing 2520 may have a field of view 2510*a* of approximately 60° in some embodiments. The lower sensor within the housing 2520 may also have a field of view 2510*b* of approximately 60° in some embodiments. The upper depth sensor may be a height 2515*a* from the floor 2530 (in some embodiments, approximately 2.065 meters) and the lower depth sensor may be a height 2515*b* from the floor 2530 (in some embodiments, approximately 2.019 meters). In this example, the active area for interaction with the interface system may extend a distance 2525*a* from the display (in some embodiments, approximately 3 meters).

Together, the fields of view 2510*a* and 2510*b* may precipitate a composite field of view 2510, which may be approximately 95° in some embodiments.

Example Depth Sensor Frame for Modular Systems—RGB Camera Variation

Figure 26:
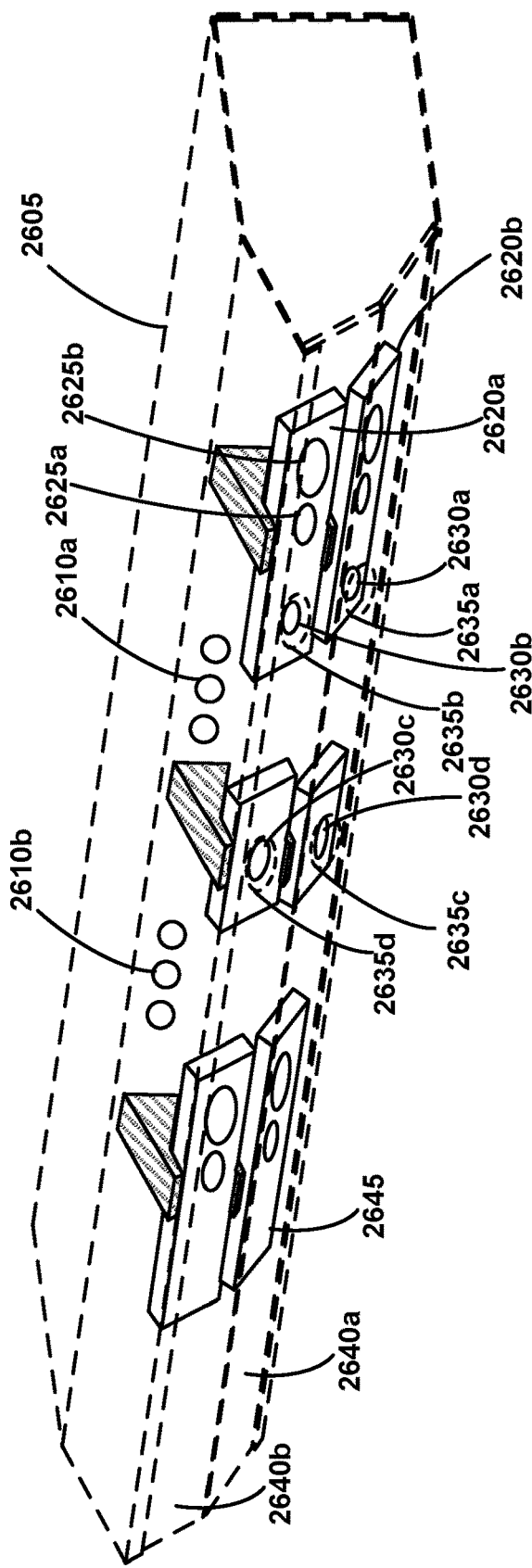
FIG. 26 is a "see-through" view of a frame for a multi-angled depth sensor housing, wherein both depth sensors and visual image sensors are installed, as may be implemented in some embodiments.

FIG. 26 is a "see-through" view of a housing frame for a multi-angled depth sensor housing 2605, wherein both depth sensors and visual image sensors are installed, as may be implemented in some embodiments. For example, depth sensor system 2620*a* may have a depth sensor emitter 2625*b* and depth sensor receiver 2625*a* (depth sensor system 2620*b* may likewise have corresponding emitters and receivers). While the depth sensor view panels 2640*b* and 2640*a* may permit, e.g., infrared frequencies to pass-through, both when emitted from the depth sensor emitter 2625*b* and when received at the depth sensor receiver 2625*a*, the view panels 2640*b* and 2640*a* may be opaque to visual frequencies (e.g., as an aesthetic or functional desire to prevent users from seeing the depth sensors). Accordingly, some embodiments contemplate incorporating holes, or alternative materials, into depth sensor view panels 2640*b* and 2640*a* at the locations 2635*a-d* to facilitate the capture of images in the visual range of wavelengths. For example, as in the case of the RealSense™ depth sensor, an RGB camera 2630*a*, 2630*b* may already be integrated into the depth sensor system. In some embodiments, independent RGB cameras 2630*c* and 2630*d*, dedicated exclusively for visual image capture may be used. The mounts may be adapted and reused for these RGB exclusive sensors to help ensure that they achieve the same or similar field of view as various of the depth sensors. In some embodiments, sensors exclusively dedicated to depth capture information, such as sensor 2645 may also be present within the housing frame. Consequently, as indicated by ellipses 2610*a* and 2610*b*, more mounts and sensors may be present within the housing than are shown here.

Example Depth Sensor Frame for Modular Systems—Fields of View

FIG. 27A is a schematic view of a modular system unit's 2705*a* depth field of view 2710*a*, where the depth sensors have no range limitation, as may occur in some embodiments. For example, the facilitate understanding, were there no limitations on the depth sensors' fields of view for a modular unit 2705*a*, then it would be possible for the field of view active area 2710*a* to extend to the furthest occluding object, e.g., the floor.

Often, however, the depth sensors will not have such an extensive range. FIG. 27B is a schematic view of a modular system unit's 2705*b* depth field of view 2710*b*, where the depth sensors have a range limitation, as may occur in some embodiments. In these embodiments, the depth sensors may be limited to a particular range. Beyond this limit, the acquired data may be insufficiently accurate for desirable or effective gesture determination.

While FIGS. 27A and 27B show fields of view that emit within the width of the modular unit, in some embodiments, the depth sensors' fields of view expand beyond this width. Consequently, FIG. 27C is a schematic view of a modular system unit's 2705*c* depth field of view 2710*c*, where the depth sensors have a range limitation, as well as a composite spread beyond the width of the modular system unit, as may occur in some embodiments. Data from this region may introduce noise and so in some embodiments the user may be forbidden from entering the regions 1225*a* and 1225*c*. In some embodiments, the system may instead filter edge data to exclude these potentially noisy regions.

FIG. 27D is a schematic view of a composite modular system composed of three units 2705*d*, 2705*e*, 2705*f* such as are depicted in FIG. 27B (e.g., unit 2705*b*) and the corresponding composite depth field of view 2710*d*, as may occur in some embodiments. When units such as 2705*c* are instead used, each sensor's field of view may overlap with its neighbor.

FIG. 27E is a schematic view of a composite modular system composed of two units 2705*g* and 2705*h* such as are depicted in FIG. 27C (e.g., unit 2705*c*) and the corresponding composite depth field of view 2710*e*, as may occur in some embodiments.

Example Depth Sensor Frame for Modular Systems—Example Configurations and Variations Composite depth fields of view may be used in a variety of applications. For example, composite fields may facilitate gesture identifications that would not be possible with a single unit in isolation. For example, some two-handed gestures may not be visible from a single unit.

Figure 28A:
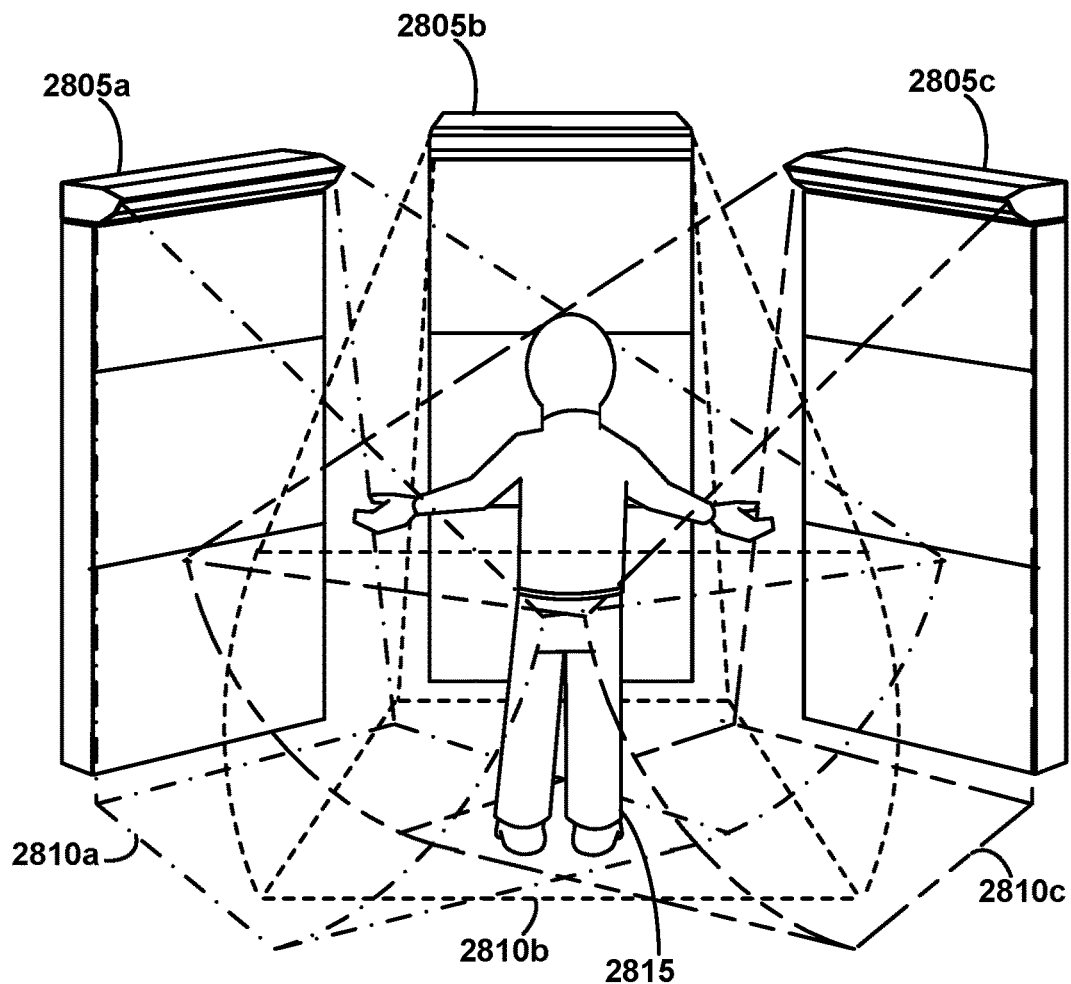
FIG. 28A is a schematic view of a user interacting with a composite modular system composed of three units arranged in a "tri-fold" orientation, as may be implemented in some embodiments.
Figure 28B:
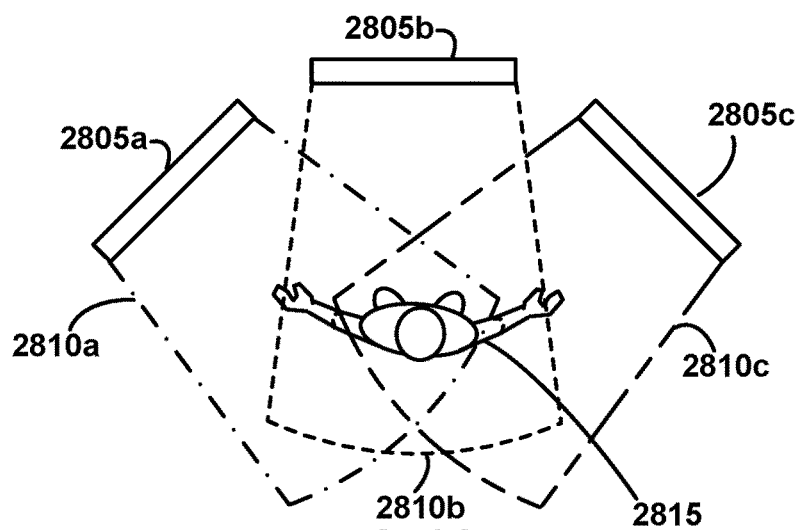
FIG. 28B is a schematic top-down view of the user interacting with the composite modular system of FIG. 28A.

FIG. 28A depicts one example application availing itself of a composite field of view. Particularly, FIG. 28A is a schematic view of a user 2815 interacting with a composite modular system composed of three units 2805*a*, 2805*b*, and 2805*c* arranged in a "tri-fold" orientation, as may be implemented in some embodiments. FIG. 28B is a schematic top-down view of the user interacting with the composite modular system of FIG. 28A. In this orientation, the user may be able to stand in locations facilitating viewing by one, two, or all three of the units' fields of view 2810*a*, 2810*b*, and 2810*c*. In the depicted example, the user 2815 is standing at a location wherein their feet are visible to all three fields of view 2810*a*, 2810*b*, and 2810*c*. The user's right and left hands are both visible in field of view 2810*b*, but only the left hand is visible within field of view 2810*a* and only the right hand is visible in field of view 2810*c*.

Figure 29A:
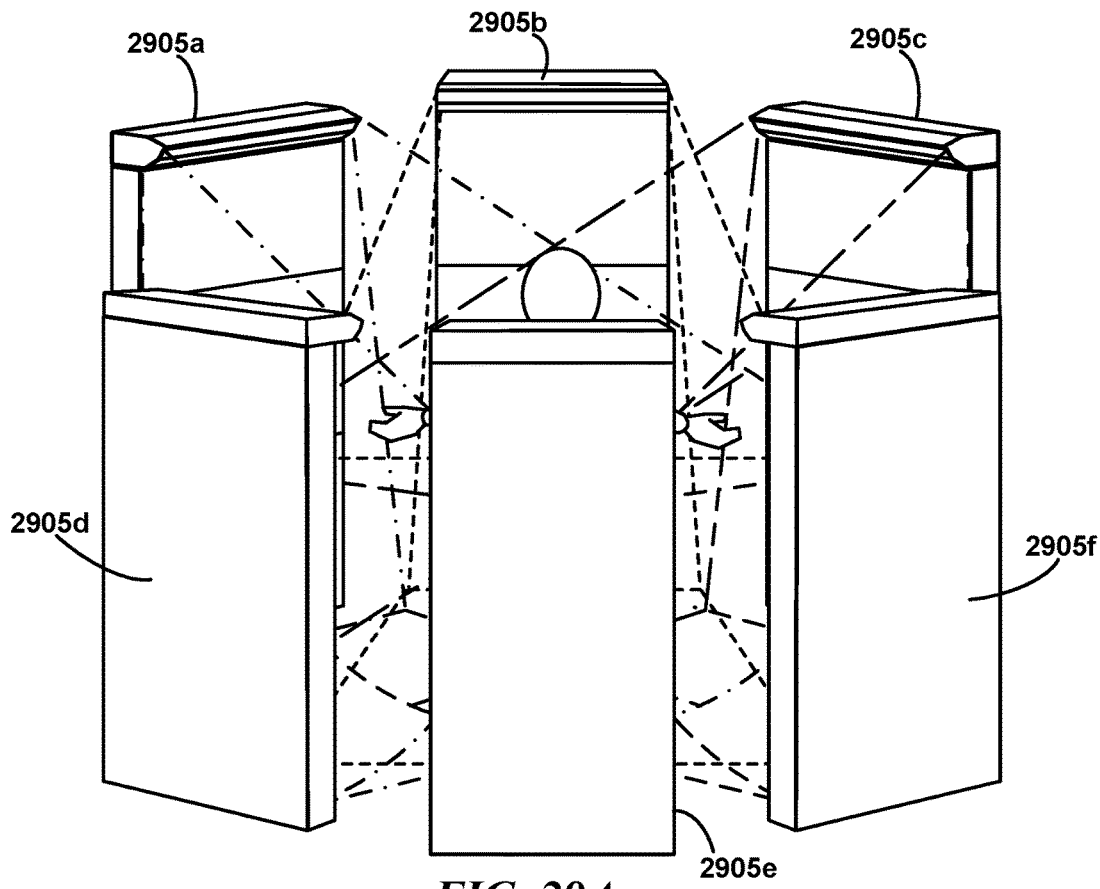
FIG. 29A is a schematic view of a user interacting with a composite modular system composed of six units arranged in a "ring" orientation, as may be implemented in some embodiments.
Figure 29B:
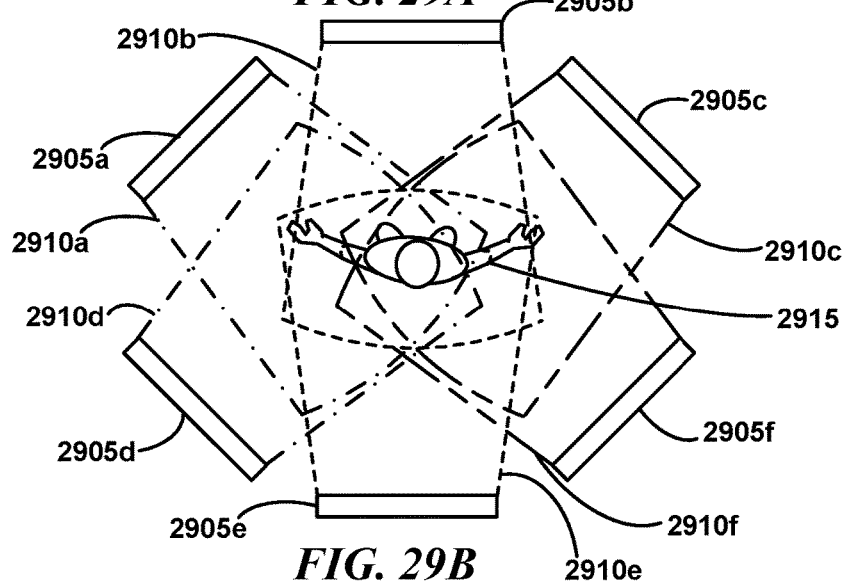
FIG. 29B is a schematic top-down view of the user interacting with the composite modular system of FIG. 29A.

FIG. 29A is another example applications, illustrating a schematic view of a user 2915 interacting with a composite modular system composed of six units 2910*a-f* arranged in a "ring" orientation, as may be implemented in some embodiments. FIG. 29B is a schematic top-down view of the user interacting with the composite modular system of FIG. 29A. Again, in the depicted example, the user 2915 is standing at a location wherein their feet are visible to all six fields of view 2910*a-f*. The user's right and left hands are both visible in fields of view 2910*b* and 2910*e*, but only the left hand is visible in fields of view 2910*a*, 2910*d* and only the right hand is visible in fields of view 2910*a*, 2910*d*. By providing a back-side view of the user, the composite system may recognize more complicated gestures and relay more comprehensive information than might otherwise be possible. For example, a three-dimensional representation of the user may now be represented at a variety of locations with the additional back-side information. Gestures that may have been occluded by the user's torso from the perspective of unit 2905*b*, may now be visible from unit 2905*e*. Such information may be used in generating the image of the display on 2905b even though it is not visible from that display (e.g., when the user makes a gesture behind their back).

Example Multi-Sensor Integration Methods

Figure 30A:
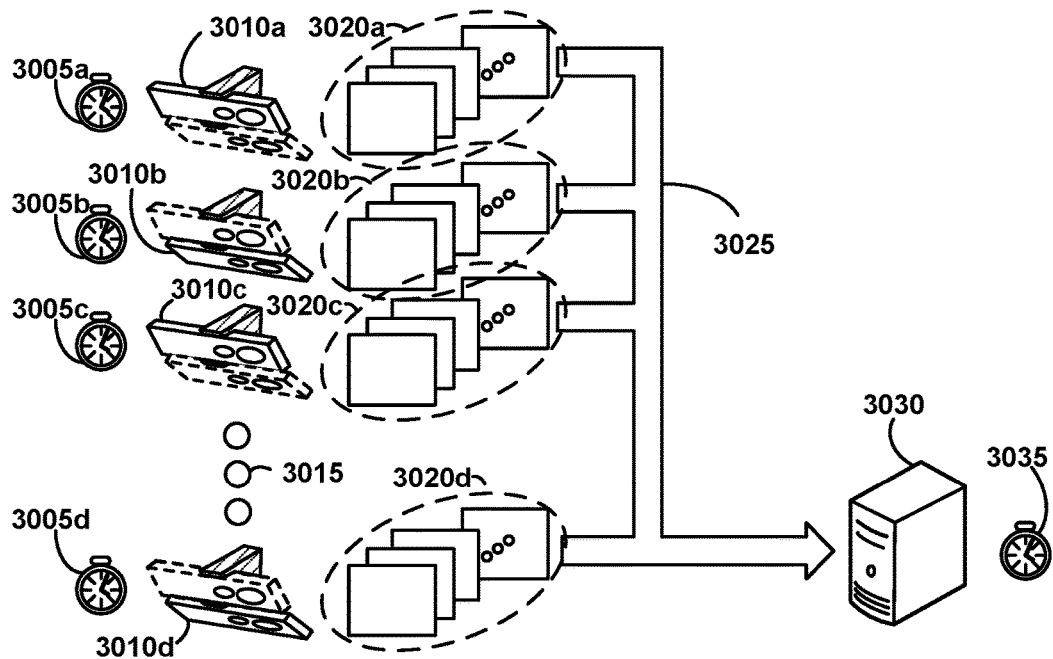
FIG. 30A is a schematic view of the clock and bus relations between a central computer system and one or more of depth sensors, as may be implemented in some embodiments.

To take advantage of the disparate or composite fields of view provided by various embodiments described herein, the computer system managing the user interface may For example, FIG. 30A is a schematic view of the clock and bus relations between a central computer system 3030 and one or more of depth sensors 3010a-d, as may be implemented in some embodiments.

The computer system 3030, which may be the same as computer system 1050, may be connected via a wired or wireless bus 3025 with one or more of depth sensors 3010a-d on one or more units. The computer system 3030 may include system clock 3035. Similarly, each depth sensor system, as in the case of the RealSense™ depth sensor system, may include an internal clock. For example, sensor system 3010a is the upper sensor in a two-bracket sensor mount. Internally sensor system 3010a carries clock 3005a. Beneath sensor system 3010a in this figure, on the same mount in the system, is sensor system 3010b with internal clock 3005b. Sensor system clock 3010c may be associated with internal clock 3005d and reside on a separate two-sensor mount, etc. As indicated by ellipses 3015, these sensor system—internal clock relationships may continue for many different sensors in the user interface system (lower sensor system 3010d may be associated with internal clock 3005d).

In accordance with their corresponding internal clocks, the depth sensor systems may generate depth frames for transmission on the bus 3025. For example, sensor system 3010a may generate frames 3020a, sensor system 3010b may generate frames 3020b, sensor system 3010c may generate frames 3020c, and sensor system 3010d may generate frames 3020d, etc. In some embodiments, the clocks 3005a-d may be more accurate and consistent than the system clock 3035. In some embodiments, the clocks 3005a-d may begin counting from 0 at the time they are activated, while in some embodiments system clock 3035 may measure its time from, e.g., the Unix epoch time. As the system clock 3035 may be used for a variety of purposes, it may be less accurate than the clocks 3005a-d.

Figure 30B:
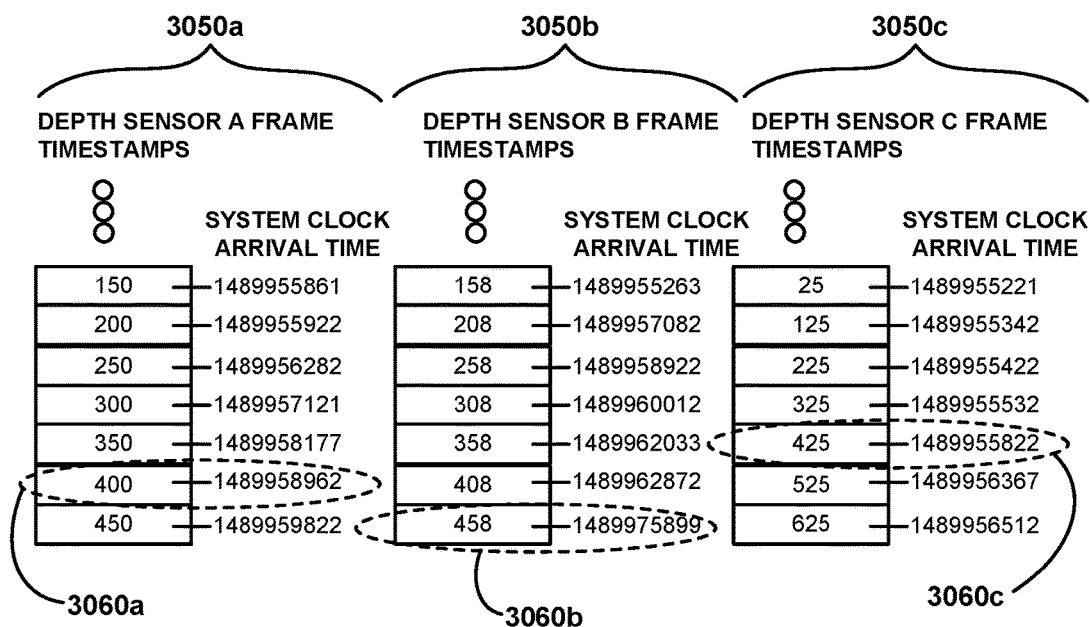
FIG. 30B is a schematic view of the depth frame arrival queues at the user interface computer system as may occur in some embodiments.

FIG. 30B is a schematic view of the depth frame arrival queues 3050a-c for three depth sensor systems at the user interface computer system as may occur in some embodiments. For example, with reference to the queue 3050a, at system time 1489958962 (e.g., a date measured relative to the Unix epoch in milliseconds) the computer system received a frame from the depth sensor timestamped with the time 400. Based upon these depth sensor timestamp—system time correspondences between each of the sensors the system may determine that the frames arrived at correspondences 3050a, were "simultaneously" captured. These frames may not literally be simultaneous, but may be substantially close that considering their values as being capture at the same time suffices for the computer system's 3030 processing purposes. For example, the system may determine that the frames associated with correspondences 3060a-c were simultaneously captured. An example process for making this determination at the computer system is provided below with respect to FIG. 31.

Figure 31:
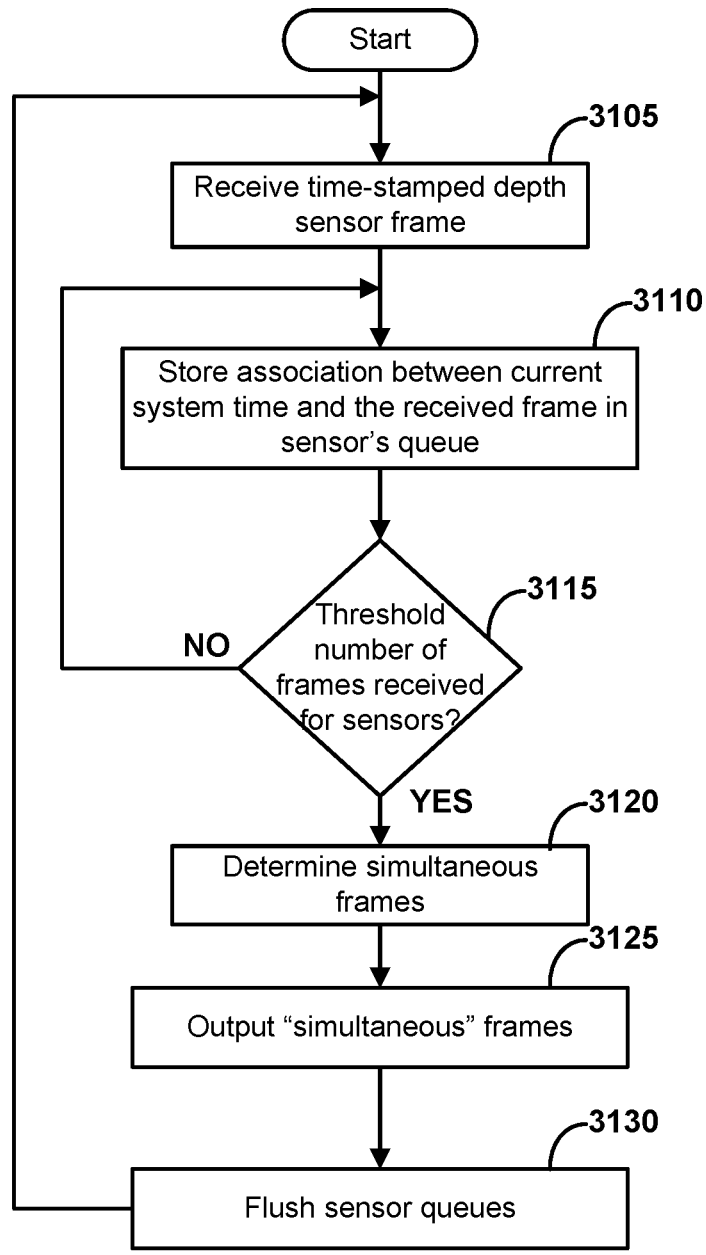
FIG. 31 is a flow diagram illustrating features of an example process for coordinating depth frames received at the computer system of FIG. 30A from the one or more depth sensors of FIG. 30A, as may be implemented in some embodiments.

FIG. 31 is a flow diagram illustrating features of an example process for coordinating depth frames received at the computer system 3030 of FIG. 30A from the one or more depth sensors 3010a-d of FIG. 30A, as may be implemented in some embodiments. At block 3105, the computer system 3030 may receive a time-stamped depth frame from a depth sensor on the bus 3025. At block 3110, the computer system 3030 may store the current system clock value with the time stamped frame, e.g., in a queue as depicted in FIG. 30B. Once the computer system 3030 has received a sufficient number of depth frames for each sensor (e.g., as determined via factory settings based upon general experience with the depth sensor and system clock disparities) at block 3115, the system may determine which frames from the sensors are "simultaneous" at block 3120. For example, in some embodiments the system may wait until at least five consecutive frames have been received for each depth sensor.

Once the computer system 3030 determines the simultaneous frames, they may be output at block 3125 for use by the active application (e.g., a program to recognize gestures). At block 3130, the queues of depth frames may be flushed and the process repeated for the next frames incoming to computer system 3030.

Embodiment Variations

One will readily appreciate that individual interface units may be arranged in a variety of fashions. This section provides some example variations to ensure the reader's appreciation of these possibilities. For example, FIG. 32A is a schematic view of a "corridor" composite modular system, as may be implemented in some embodiments. FIG. 32B is a schematic top-down view of the composite modular system of FIG. 32A. The "corridor" may encompass a series of units 3205a and series of units 3205b arranged opposite one another so as to provide a complementary depth fields of view. Through three units are here shown in each series, ellipses 3210a and 3210b here indicate the possibility of the series being more or less than three units.

At the end of the corridor formed by the series of units 3205a and series of units 3205b may be placed one or more end units 3205e. The depth fields of view 3215a-c and 3215d may correspond to the fields of view for the units along one side of the corridor, i.e., the units in series 3205a and the unit 3205d. Similarly, the depth fields of view 3215f and 3215g-i may correspond to the fields of view for the units along the other side of the corridor, i.e., the unit 3205c and the units in series 3205b. These fields of view may overlap in the regions 3250a-d, as indicated, providing opposing depth frames of a user walking down the corridor. Such complementary frames may facilitate the identification of spatial-temporal gestures from the user as they traverse the length of the corridor. Unfortunately, being orthogonal to the user's walking path, they may not identify aspects of gestures occurring in front of the user. For example, it may be readily apparent from the user's side that they are raising a hand and pointing a finger, but without a frontal depth-frame view, it may not be clear which finger the user is extending.

Consequently, the one or more end units 3205e may be specifically configured to provide an extended field of view 3215e down the length of as much of the corridor as possible. In some embodiments, this may be achieved by modifying the one or more end units 3205e to include an additional directional depth sensor placed to more readily identify frontal features. For example, FIG. 32C is a schematic view of an end unit from the composite modular system of FIG. 32A, where the end unit has a longitudinal depth sensor 3225 as may be implemented in some embodiments. Particularly, the longitudinal depth sensor 3225 may be placed between the displays 3220a and 3220b. A screen may be placed before the sensor, which is opaque to human vision, but permits, e.g., infrared emissions from the depth sensor. In some embodiments, the longitudinal depth sensor 3225 may be placed behind a portion of the screen, or pixels in the screen removed to facilitate, e.g., infrared emission and detection, without substantially affecting the user's perception of a seamless display.

In contrast to the broader, wider fields of view of other sensors in the unit, the longitudinal depth sensor 3225 may be specifically selected for a narrower, but longer, field of view, to complement the length of the corridor. Particularly, FIG. 32D is a schematic view of varied depth region fields of view achieved using the sensor mount of FIG. 32C as may occur in some embodiments. As previously described, the two sensor systems 3230a and 3230b in the upper housing frame may provide complementary fields of view 3235a and 3235b (again, though not shown here overlapping, one will appreciate that the fields of view 3235a and 3235b overlap in some embodiments). Fields of view 3235a and 3235b may even be angled so as to capture portions of the floor 3240. In contrast, the field of view 3235c associated with the longitudinal sensor system 3225 may be more narrowly focused, in anticipate of its role to provide a frontal counterpart to as many of the fields of view overlaps 3250a-d as possible.

Figure 33A:
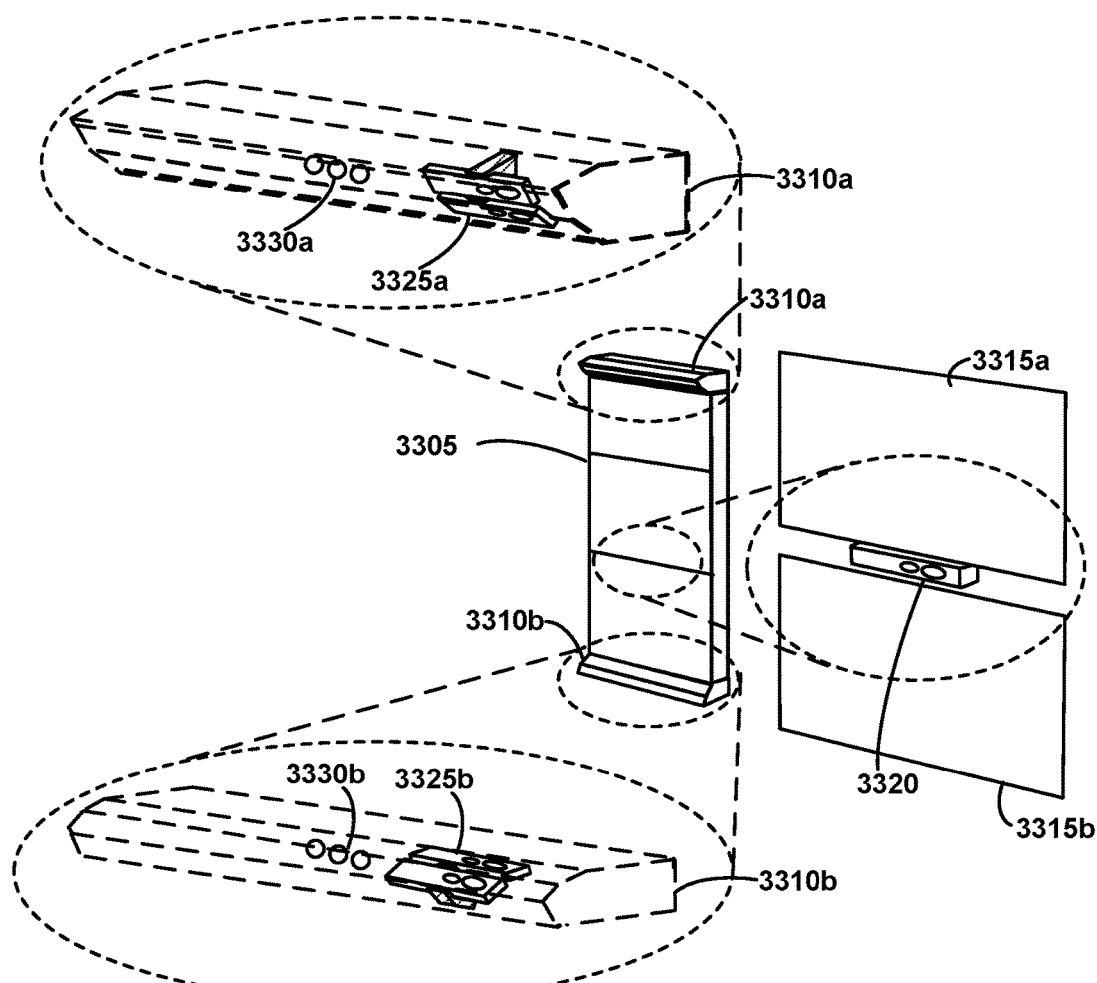
FIG. 33A is a schematic view of a modular system unit having multiple sensor additions, as may be implemented in some embodiments.

In some embodiments, it may be helpful not only to capture depth frames above and before the user, but also beneath the user. For example, some gestures may involve actions occluded by hands and torsos from above or before the user (e.g., wrapping one's thumb under one's hand when pointing forward). By placing depth sensor systems at the base of a unit, or below the unit's mid-height point, it may be possible to acquire depth frames of these otherwise occluded regions. FIG. 33A is a schematic view of a modular system unit 3305 having multiple sensor additions, as may be implemented in some embodiments. Particularly in addition to an upper frame housing 3310a containing depth sensor mountings 3325a (again one or many sensors may be present as indicated by ellipses 3330a) as described herein, as well as a mid-height sensor 3320 being placed between (as shown) or behind displays 3315a and 3315b, the unit 3305 may also include a lower housing frame 3310b for depth sensors at its base. Like the upper frame housing 3310a, the lower housing frame for depth sensors may include one or more depth sensor mountings 3325b as indicated by ellipses 3330b. Unlike the upper frame housing 3310a, however, the mountings 3325b may be rotated 180° to point upward.

Figure 33B:
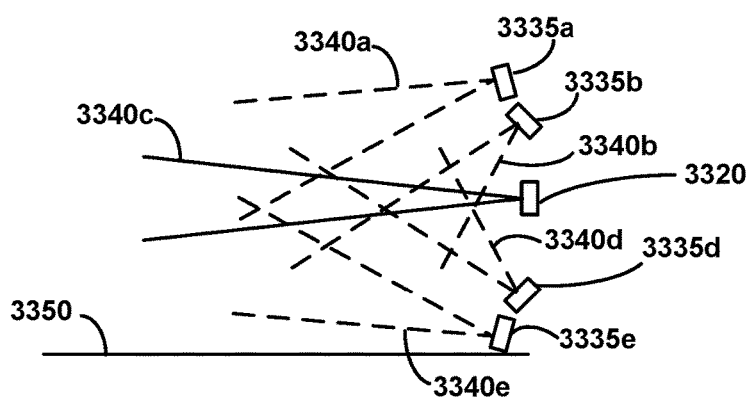
FIG. 33B is a schematic view of a the varied depth region fields of view achieved using the sensor mount of FIG. 33A as may occur in some embodiments.

FIG. 33B is a schematic view of the varied depth region fields of view achieved using the sensor mount of FIG. 33A as may occur in some embodiments. Particularly, the sensor systems 3335a and 3335b on mount 3325a may have fields of view 3340a and 3340b as described elsewhere herein. Similarly, the mid-height sensor 3320 may have a field of view 3340c. The addition of the base housing 3310b and sensor systems 3335d and 3335e, however, have now made additional fields of view 3335d and 3335e available to the system. Like field of view 3340c, these fields of view 3340d and 3340e may not include the floor 3350.

Computer System

Figure 34:
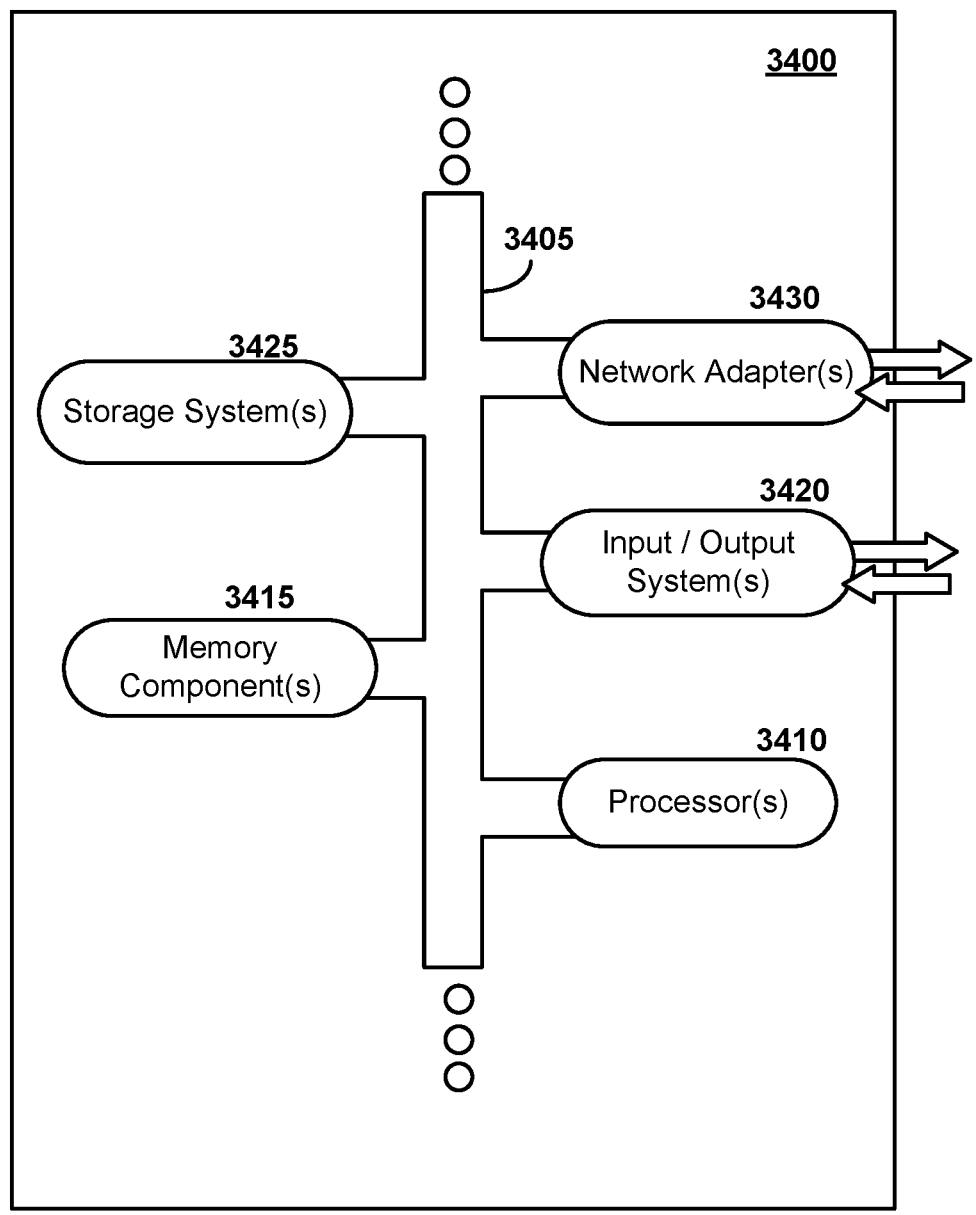
FIG. 34 is a block diagram of an example computer system as may be used in conjunction with some of the embodiments.

FIG. 34 is a block diagram of an example computer system as may be used in conjunction with some of the embodiments. The computing system 3400 may include an interconnect 3405, connecting several components, such as, e.g., one or more processors 3410, one or more memory components 3415, one or more input/output systems 3420, one or more storage systems 3425, one or more network adaptors 3430, etc. The interconnect 3405 may be, e.g., one or more bridges, traces, busses (e.g., an ISA, SCSI, PCI, I2C, Firewire bus, etc.), wires, adapters, or controllers.

The one or more processors 3410 may include, e.g., an Intel™ processor chip, a math coprocessor, a graphics processor, etc. The one or more memory components 3415 may include, e.g., a volatile memory (RAM, SRAM, DRAM, etc.), a non-volatile memory (EPROM, ROM, Flash memory, etc.), or similar devices. The one or more input/output devices 3420 may include, e.g., display devices, keyboards, pointing devices, touchscreen devices, etc. The one or more storage devices 3425 may include, e.g., cloud based storages, removable USB storage, disk drives, etc. In some systems memory components 3415 and storage devices 3425 may be the same components. Network adapters 3430 may include, e.g., wired network interfaces, wireless interfaces, Bluetooth™ adapters, line-of-sight interfaces, etc.

One will recognize that only some of the components, alternative components, or additional components than those depicted in FIG. 34 may be present in some embodiments. Similarly the components may be combined or serve dual-purposes in some systems. The components may be implemented using special-purpose hardwired circuitry such as, for example, one or more ASICs, PLDs, FPGAs, etc. Thus, some embodiments may be implemented in, for example, programmable circuitry (e.g., one or more microprocessors) programmed with software and/or firmware, or entirely in special-purpose hardwired (non-programmable) circuitry, or in a combination of such forms.

In some embodiments, data structures and message structures may be stored or transmitted via a data transmission medium, e.g., a signal on a communications link, via the network adapters 3430. Transmission may occur across a variety of mediums, e.g., the Internet, a local area network, a wide area network, or a point-to-point dial-up connection, etc. Thus, "computer readable media" can include computer-readable storage media (e.g., "non-transitory" computer-readable media) and computer-readable transmission media.

The one or more memory components 3415 and one or more storage devices 3425 may be computer-readable storage media. In some embodiments, the one or more memory components 3415 or one or more storage devices 3425 may store instructions, which may perform or cause to be performed various of the operations discussed herein. In some embodiments, the instructions stored in memory 3415 can be implemented as software and/or firmware. These instructions may be used to perform operations on the one or more processors 3410 to carry out processes described herein. In some embodiments, such instructions may be provided to the one or more processors 3410 by downloading the instructions from another system, e.g., via network adapter 3430.

Remarks

The above description and drawings are illustrative. Consequently, neither the description nor the drawings should be construed so as to limit the disclosure. For example, titles or subtitles have been provided simply for the reader's convenience and to facilitate understanding. Thus, the titles or subtitles should not be construed so as to limit the scope of the disclosure, e.g., by grouping features which were presented in a particular order or together simply to facilitate understanding. Unless otherwise defined herein, all technical and scientific terms used herein have the same meaning as commonly understood by one of ordinary skill in the art to which this disclosure pertains. In the case of conflict, this document, including any definitions provided herein, will control. A recital of one or more synonyms herein does not exclude the use of other synonyms. The use of examples anywhere in this specification including examples of any term discussed herein is illustrative only, and is not intended to further limit the scope and meaning of the disclosure or of any exemplified term.

Similarly, despite the particular presentation in the figures herein, one skilled in the art will appreciate that actual data structures used to store information may differ from what is shown. For example, the data structures may be organized in a different manner, may contain more or less information than shown, may be compressed and/or encrypted, etc. The drawings and disclosure may omit common or well-known details in order to avoid confusion. Similarly, the figures may depict a particular series of operations to facilitate understanding, which are simply exemplary of a wider class of such collection of operations. Accordingly, one will readily recognize that additional, alternative, or fewer operations may often be used to achieve the same purpose or effect depicted in some of the flow diagrams. For example, data may be encrypted, though not presented as such in the figures, items may be considered in different looping patterns ("for" loop, "while" loop, etc.), or sorted in a different manner, to achieve the same or similar effect, etc.

Reference in this specification to "one embodiment" or "an embodiment" means that a particular feature, structure, or characteristic described in connection with the embodiment is included in at least one embodiment of the disclosure. Consequently, the phrase "in one embodiment" in various places in the specification is not necessarily referring to the same embodiment in each of those various places. Separate or alternative embodiments may not be mutually exclusive of other embodiments. One will recognize that various modifications may be made without deviating from the scope of the embodiments.

We claim:

1. A depth-sensor housing frame comprising:
   a back panel;
   a top panel;
   a bottom panel;
   a first frequency-permissive panel, the first frequency-permissive panel configured to substantially permit the passage of radiation associated with a depth sensor, but to not substantially permit the passage of visual frequency radiation;
   a second frequency-permissive panel, the second frequency-permissive panel configured to substantially permit the passage of radiation associated with a depth sensor, but to not substantially permit the passage of visual frequency radiation;
   one or more depth sensor mounts; and
   two or more spacers, the two or more spacers located within an enclosure formed by the back panel, top panel, bottom panel, first frequency-permissive panel, and the second frequency-permissive panel, wherein
   at least one of the one or more depth sensor mounts is located between at least two spacers of the two or more spacers, and wherein
   the at least one depth sensor mount located between the at least two spacers is configured to receive two depth sensors such that a first field of view of the first sensor passes through the first frequency permissive panel and a second field of view of the second sensor passes through the second frequency permissive panel.

2. The depth-sensor housing frame of claim 1, wherein the top panel comprises:
   a first portion substantially parallel to the bottom panel; and
   a second portion at an angle of substantially 25° from the first portion towards the bottom panel.

3. The depth-sensor housing frame of claim 2, wherein the second portion of the top panel comprises a cover ridge, the cover ridge configured to receive a portion of the first frequency-permissive panel.

4. The depth-sensor housing frame of claim 1, wherein the first frequency-permissive panel is adjacent to the second frequency-permissive panel at an angle of substantially 35°.

5. The depth-sensor housing frame of claim 4, wherein at least one of the spacers comprises six extensions, wherein
   the first extension is oriented at a substantially 90° angle relative to the second extension,
   the second extension is oriented at a substantially 90° angle relative to the third extension,
   the third extension is oriented at an angle greater than 90° relative to the fourth extension,
   the fourth extension is oriented at an angle greater than 90° relative to the fifth extension,
   the fifth extension is oriented at an angle less than 90° relative to the sixth extension, and
   the sixth extension is oriented at an angle greater than 90° relative to the fifth extension, and wherein
   the six extensions together form a concave region.

6. The depth-sensor housing frame of claim 5, wherein at least one of the spacers comprises no more than five extensions and has a length less than at least one spacer of claim 5 having six extensions.

7. The depth-sensor housing frame of claim 5, wherein the second portion of the top panel comprises a cover ridge, the cover ridge configured to receive a portion of the first frequency-permissive panel.

8. A modular depth interface unit comprising:
   one or more displays; and
   a depth-sensor housing frame, the frame comprising:
      a back panel;
      a top panel;
      a bottom panel;
      a first frequency-permissive panel, the first frequency-permissive panel configured to substantially permit the passage of radiation associated with a depth sensor, but to not substantially permit the passage of visual frequency radiation;
      a second frequency-permissive panel, the second frequency-permissive panel configured to substantially permit the passage of radiation associated with a depth sensor, but to not substantially permit the passage of visual frequency radiation;
      one or more depth sensor mounts; and
      two or more spacers, the two or more spacers located within an enclosure formed by the back panel, top panel, bottom panel, first frequency-permissive panel, and the second frequency-permissive panel, wherein
      at least one of the one or more depth sensor mounts is located between at least two spacers of the two or more spacers, and wherein
      the at least one depth sensor mount located between the at least two spacers is configured to receive two depth sensors such that a first field of view of the first sensor passes through the first frequency permissive panel and a second field of view of the second sensor passes through the second frequency permissive panel.

9. The modular depth interface unit of claim 8, wherein the one or more displays comprises:
   a first display substantially vertically adjacent and above a second display; and
   the second display substantially vertically adjacent and above a third display, wherein the depth-sensor housing frame is substantially vertically adjacent and above the first display.

10. The modular depth interface unit of claim 8, wherein the top panel comprises:
a first portion substantially parallel to the bottom panel; and
a second portion at an angle of substantially 25° from the first portion towards the bottom panel.

11. The modular depth interface unit of claim 10, wherein the second portion of the top panel comprises a cover ridge, the cover ridge configured to receive a portion of the first frequency-permissive panel.

12. The modular depth interface unit of claim 8, wherein the first frequency-permissive panel is adjacent to the second frequency-permissive panel at an angle of substantially 35°.

13. The modular depth interface unit of claim 12, wherein at least one of the spacers comprises six extensions, wherein
the first extension is oriented at a substantially 90° angle relative to the second extension,
the second extension is oriented at a substantially 90° angle relative to the third extension,
the third extension is oriented at an angle greater than 90° relative to the fourth extension,
the fourth extension is oriented at an angle greater than 90° relative to the fifth extension,
the fifth extension is oriented at an angle less than 90° relative to the sixth extension, and
the sixth extension is oriented at an angle greater than 90° relative to the fifth extension, and wherein
the six extensions together form a concave region.

14. The modular depth interface unit of claim 13, wherein at least one of the spacers comprises no more than five extensions and has a length less than at least one spacer of claim 13 having six extensions.

15. The modular depth interface unit of claim 13, wherein the second portion of the top panel comprises a cover ridge, the cover ridge configured to receive a portion of the first frequency-permissive panel.

16. A depth-based interface system comprising:
at least one processor;
one or more displays; and
one or more of depth-sensor housing frames, at least one frame of the one or more frames comprising:
a back panel;
a top panel;
a bottom panel;
a first frequency-permissive panel, the first frequency-permissive panel configured to substantially permit the passage of radiation associated with a depth sensor, but to not substantially permit the passage of visual frequency radiation;
a second frequency-permissive panel, the second frequency-permissive panel configured to substantially permit the passage of radiation associated with a depth sensor, but to not substantially permit the passage of visual frequency radiation;
one or more depth sensor mounts; and
two or more spacers, the two or more spacers located within an enclosure formed by the back panel, top panel, bottom panel, first frequency-permissive panel, and the second frequency-permissive panel, wherein
at least one of the one or more depth sensor mounts is located between at least two spacers of the two or more spacers, and wherein
the at least one depth sensor mount located between the at least two spacers is configured to receive two depth sensors such that a first field of view of the first sensor passes through the first frequency permissive panel and a second field of view of the second sensor passes through the second frequency permissive panel.

17. The depth-based interface system of claim 16, wherein the one or more displays comprises a 3×3 grid of substantially adjacent displays.

18. The depth-based interface system of claim 17, wherein the one or more depth-sensor housing frames comprises:
a first depth sensor housing frame above the top-left display of the 3×3 grid;
a second depth sensor housing frame above the top-middle display of the 3×3 grid;
a third depth sensor housing frame above the top-right display of the 3×3 grid.

19. The depth-based interface system of claim 18, wherein the top panel comprises:
a first portion substantially parallel to the bottom panel; and
a second portion at an angle of substantially 25° from the first portion towards the bottom panel.

20. The depth-based interface system of claim 19, wherein the second portion of the top panel comprises a cover ridge, the cover ridge configured to receive a portion of the first frequency-permissive panel.

* * * * *